(12) United States Patent
Yamazaki et al.

(10) Patent No.: US 10,741,679 B2
(45) Date of Patent: Aug. 11, 2020

(54) SEMICONDUCTOR DEVICE AND METHOD FOR MANUFACTRING SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Tokyo (JP); Kazutaka Kuriki, Kanagawa (JP); Yuji Egi, Kanagawa (JP); Hiromi Sawai, Kanagawa (JP); Yusuke Nonaka, Kanagawa (JP); Noritaka Ishihara, Kanagawa (JP); Daisuke Matsubayashi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 123 days.

(21) Appl. No.: 15/947,902

(22) Filed: Apr. 9, 2018

(65) Prior Publication Data
US 2018/0233588 A1    Aug. 16, 2018

Related U.S. Application Data

(63) Continuation of application No. 15/492,253, filed on Apr. 20, 2017, now Pat. No. 9,947,777.

(30) Foreign Application Priority Data

Apr. 22, 2016  (JP) .................................. 2016-086372

(51) Int. Cl.
*H01L 27/12* (2006.01)
*H01L 29/66* (2006.01)
(Continued)

(52) U.S. Cl.
CPC .... *H01L 29/66969* (2013.01); *H01L 21/0228* (2013.01); *H01L 21/0234* (2013.01);
(Continued)

(58) Field of Classification Search
CPC ......... H01L 29/78696; H01L 29/78693; H01L 29/7869; H01L 29/66969; H01L 27/1225;
(Continued)

(56) References Cited

U.S. PATENT DOCUMENTS 7,674,650 B2    3/2010  Akimoto et al.
8,860,108 B2   10/2014  Yamazaki et al.
(Continued)

FOREIGN PATENT DOCUMENTS

JP    2007-096055 A    4/2007
JP    2007-123861 A    5/2007
(Continued)

*Primary Examiner* — Michael M Trinh
(74) *Attorney, Agent, or Firm* — Fish & Richardson P.C.

(57) ABSTRACT

Provided is a semiconductor device having favorable reliability. A manufacturing method of a semiconductor device comprising the steps of: forming a first oxide semiconductor having an island shape; forming a first conductor and a second conductor over the first oxide semiconductor; forming an oxide semiconductor film over the first oxide semiconductor, the first conductor, and the second conductor; forming a first insulating film over the oxide semiconductor film; forming a conductive film over the first insulating film; removing part of the first insulating film and part of the conductive film to form a first insulator and a third conductor; forming a second insulating film covering the first insulator and the third conductor; removing part of the oxide semiconductor film and part of the second insulating film to form a second oxide semiconductor and a second insulator and to expose a side surface of the first oxide semiconductor; forming a third insulator in contact with the side surface of the first oxide semiconductor and with a side surface of the
(Continued)

second oxide semiconductor; forming a fourth insulator in contact with the third insulator; and performing a microwave-excited plasma treatment to the third insulator and the fourth insulator.

18 Claims, 32 Drawing Sheets

(51) Int. Cl.
*H01L 21/02* (2006.01)
*H01L 29/786* (2006.01)
*H01L 27/06* (2006.01)
*H01L 21/8258* (2006.01)

(52) U.S. Cl.
CPC .. *H01L 21/02178* (2013.01); *H01L 21/02266* (2013.01); *H01L 21/02337* (2013.01); *H01L 21/02565* (2013.01); *H01L 27/1207* (2013.01); *H01L 27/1225* (2013.01); *H01L 27/1248* (2013.01); *H01L 27/1255* (2013.01); *H01L 27/1259* (2013.01); *H01L 27/1262* (2013.01); *H01L 29/7869* (2013.01); *H01L 29/78648* (2013.01); *H01L 29/78693* (2013.01); *H01L 29/78696* (2013.01); *H01L 21/8258* (2013.01); *H01L 27/0688* (2013.01)

(58) Field of Classification Search
CPC ............. H01L 27/1251; H01L 27/1259; H01L 27/1262; H01L 21/0234; H01L 21/02337
See application file for complete search history.

(56) References Cited

U.S. PATENT DOCUMENTS

| 9,455,349 | B2 | 9/2016 | Suzawa et al. |
|---|---|---|---|
| 2011/0111557 | A1 | 5/2011 | Ichijo et al. |
| 2011/0281394 | A1 | 11/2011 | Yamazaki |
| 2012/0146713 | A1 | 6/2012 | Kim et al. |
| 2012/0302004 | A1 | 11/2012 | Miyanaga |
| 2013/0244374 | A1 | 9/2013 | Okazaki et al. |
| 2014/0008647 | A1 | 1/2014 | Yamazaki |
| 2015/0108472 | A1* | 4/2015 | Suzawa ............ H01L 29/78648 257/43 |
| 2015/0140732 | A1 | 5/2015 | Ichijo et al. |
| 2015/0187950 | A1 | 7/2015 | Sato et al. |
| 2015/0187952 | A1 | 7/2015 | Yamazaki et al. |
| 2015/0214256 | A1* | 7/2015 | Miyairi ............... H01L 27/1225 257/43 |
| 2015/0340505 | A1* | 11/2015 | Yamazaki ............ H01L 21/465 438/104 |
| 2016/0163870 | A1 | 6/2016 | Ito et al. |
| 2016/0276487 | A1 | 9/2016 | Yamazaki et al. |
| 2016/0307776 | A1 | 10/2016 | Ichijo et al. |
| 2017/0012138 | A1 | 1/2017 | Suzawa et al. |
| 2017/0025548 | A1 | 1/2017 | Yamazaki |
| 2017/0033109 | A1 | 2/2017 | Yamazaki |
| 2017/0033230 | A1 | 2/2017 | Yamazaki et al. |
| 2017/0141130 | A1* | 5/2017 | Yamazaki ......... H01L 21/02178 |
| 2017/0186843 | A1* | 6/2017 | Hosaka ................ C04B 35/453 |
| 2017/0222056 | A1 | 8/2017 | Sawai et al. |
| 2017/0243759 | A1 | 8/2017 | Jintyou et al. |

FOREIGN PATENT DOCUMENTS

| JP | 2011-119674 A | 6/2011 |
|---|---|---|
| JP | 5078246 | 11/2012 |

* cited by examiner

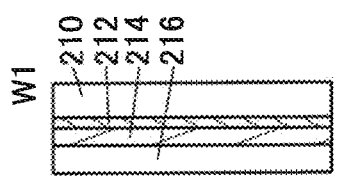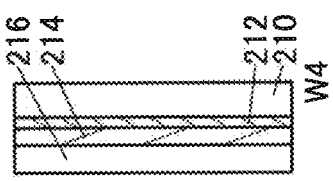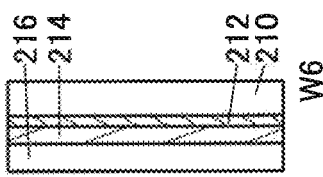
FIG. 3C
FIG. 3D
FIG. 3E
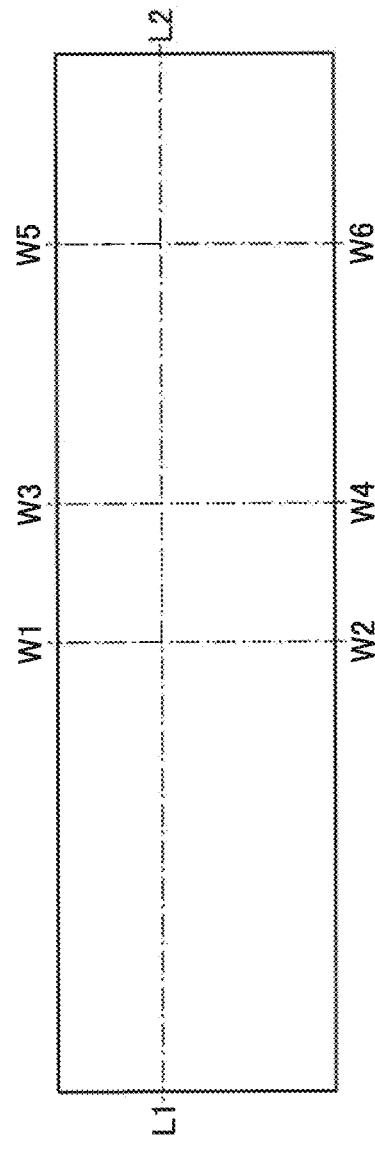
FIG. 3A
FIG. 3B
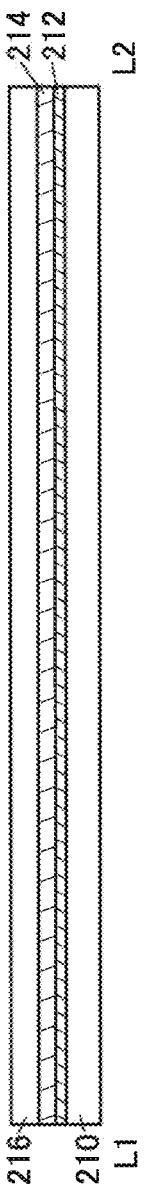

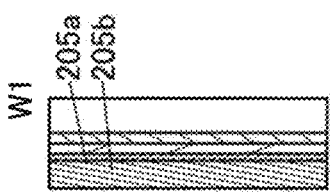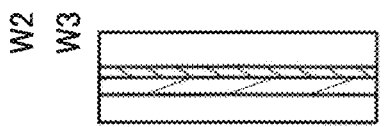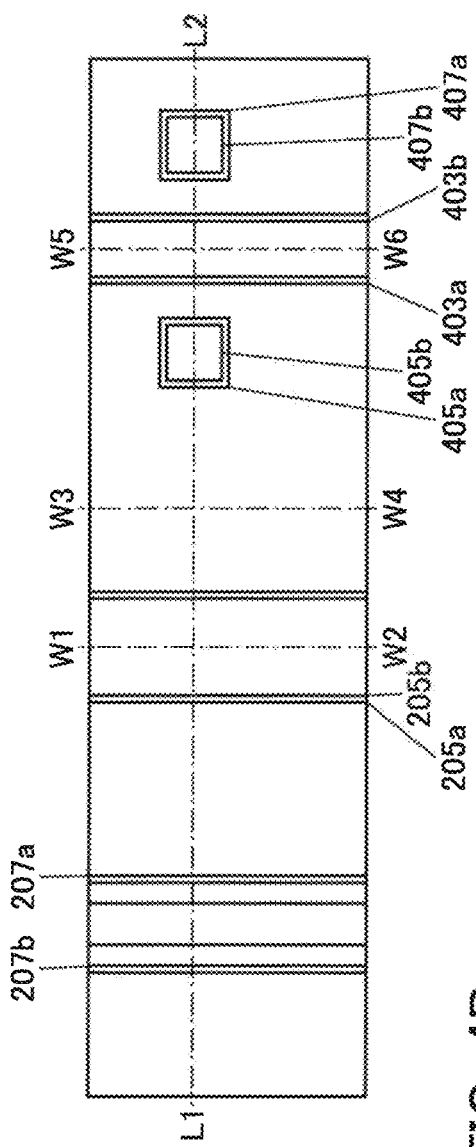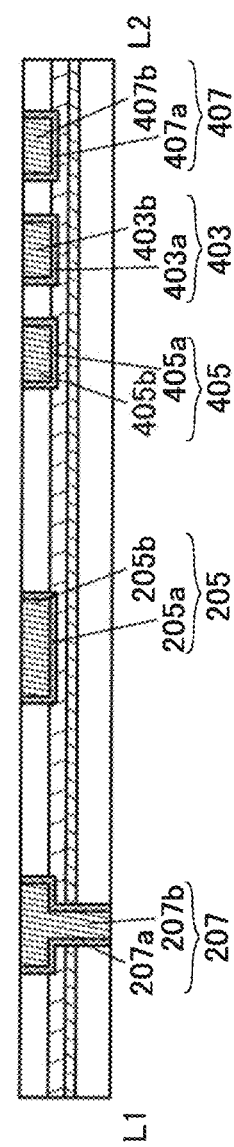

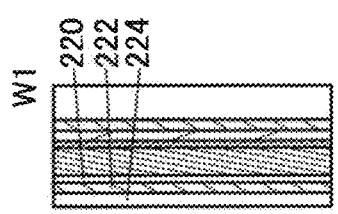
FIG. 5C
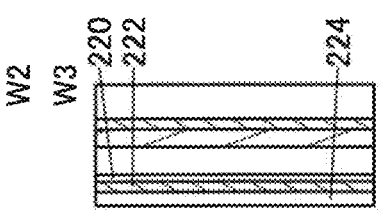
FIG. 5D
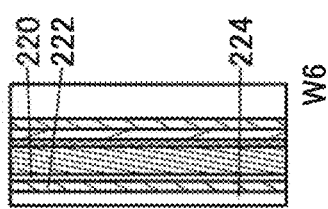
FIG. 5E
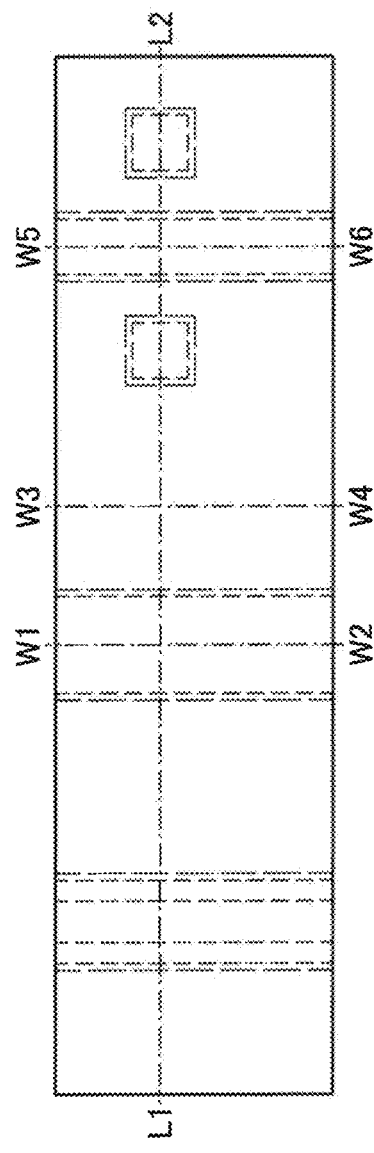
FIG. 5A
FIG. 5B
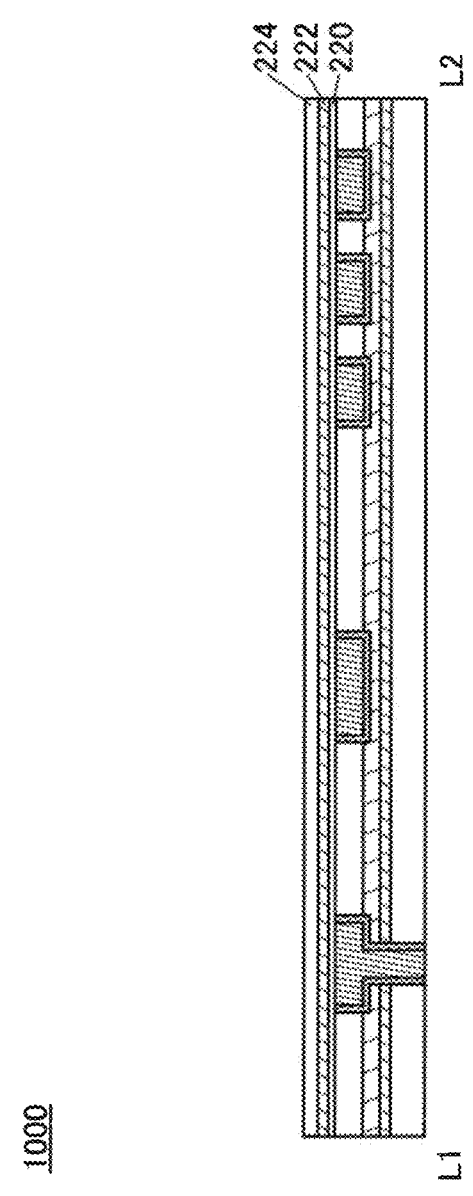

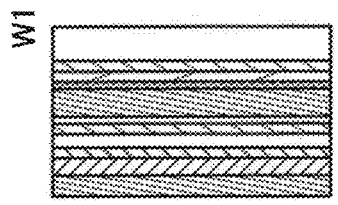
FIG. 7C
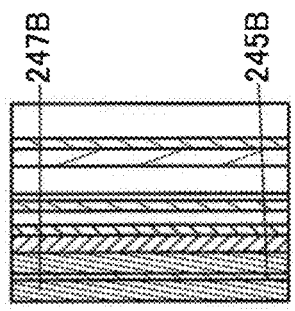
FIG. 7D
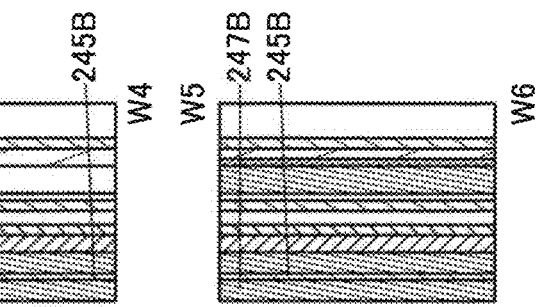
FIG. 7E
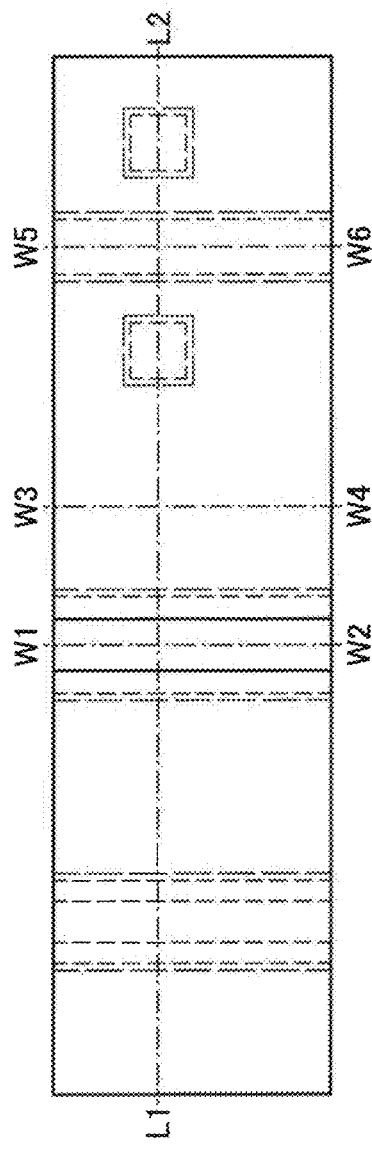
FIG. 7A
FIG. 7B
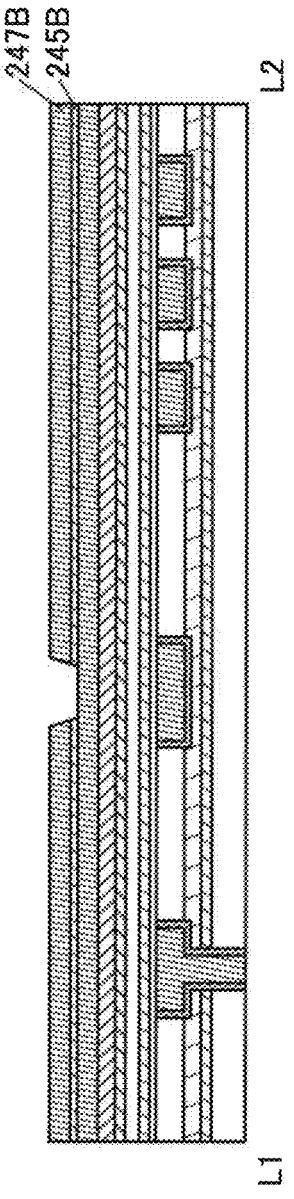

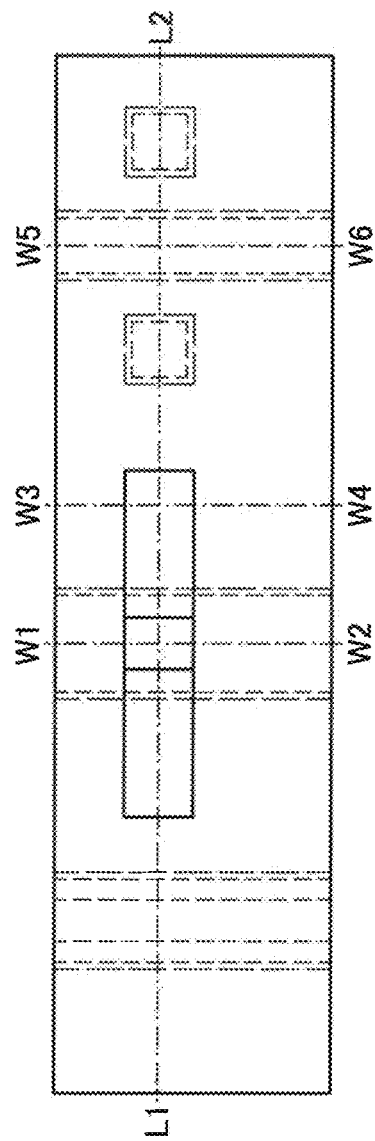
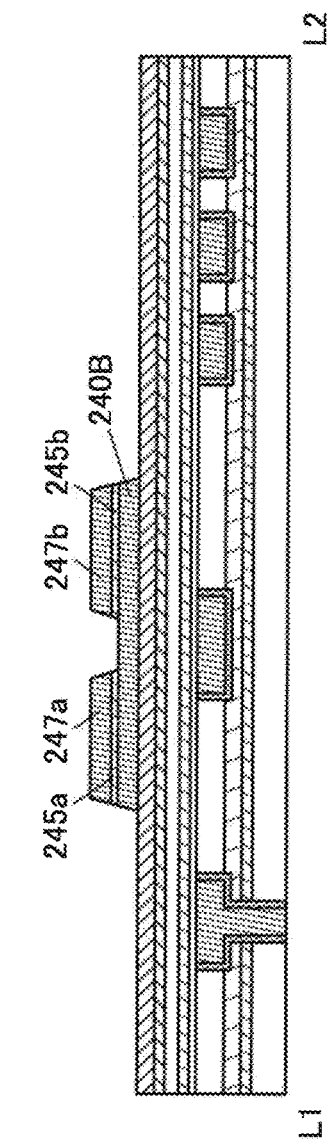
FIG. 9A
FIG. 9B
FIG. 9C
FIG. 9D
FIG. 9E

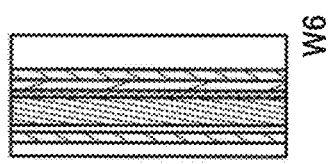
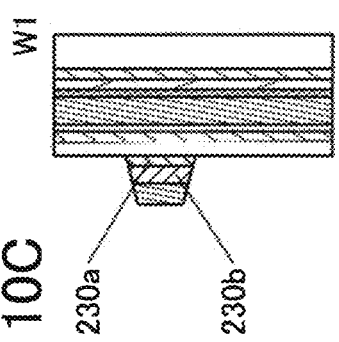
FIG. 10C
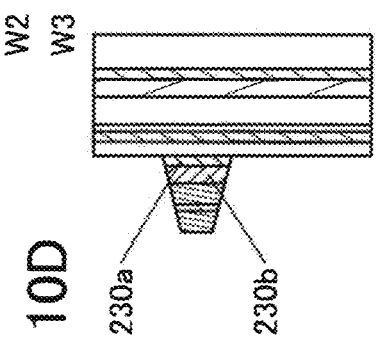
FIG. 10D
FIG. 10E
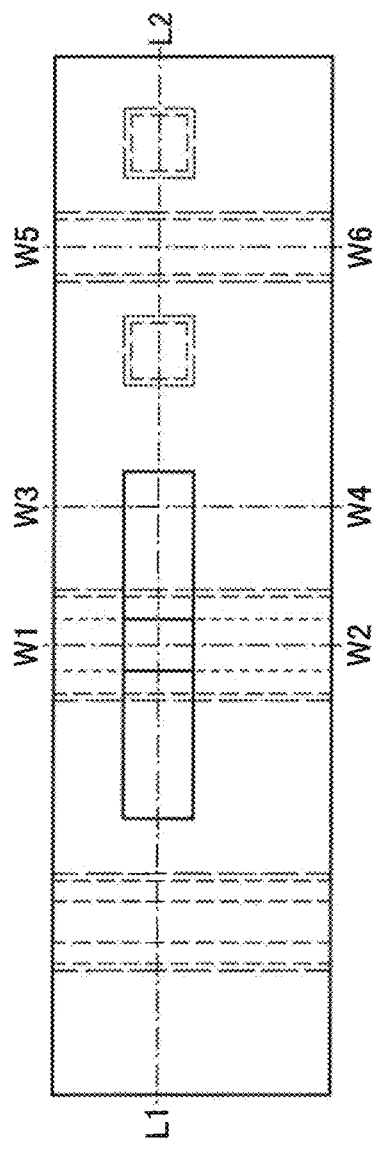
FIG. 10A
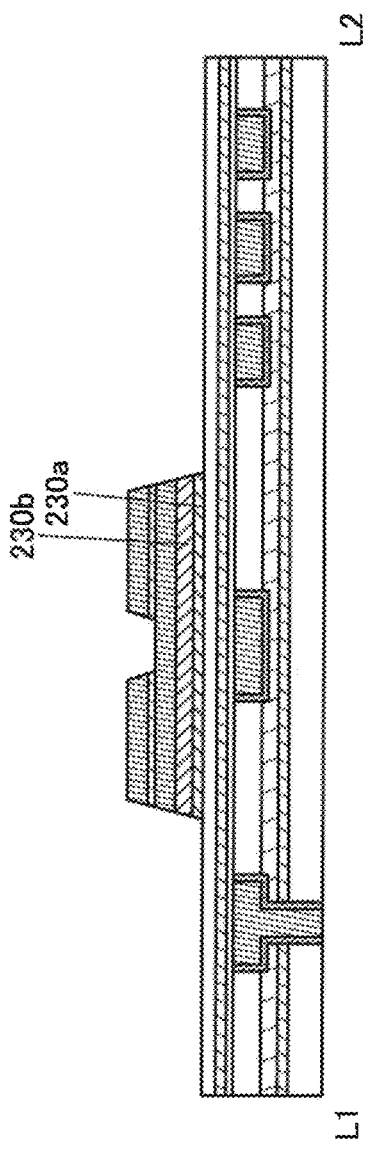
FIG. 10B

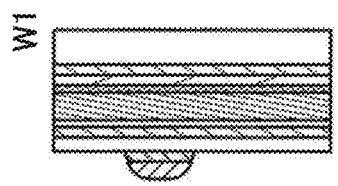
FIG. 12C
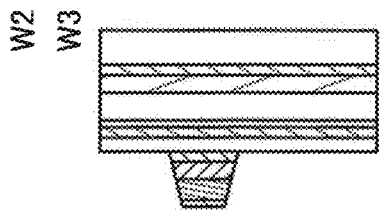
FIG. 12D
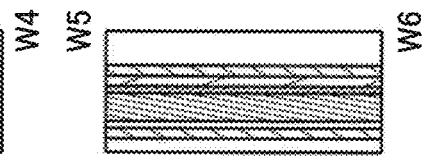
FIG. 12E
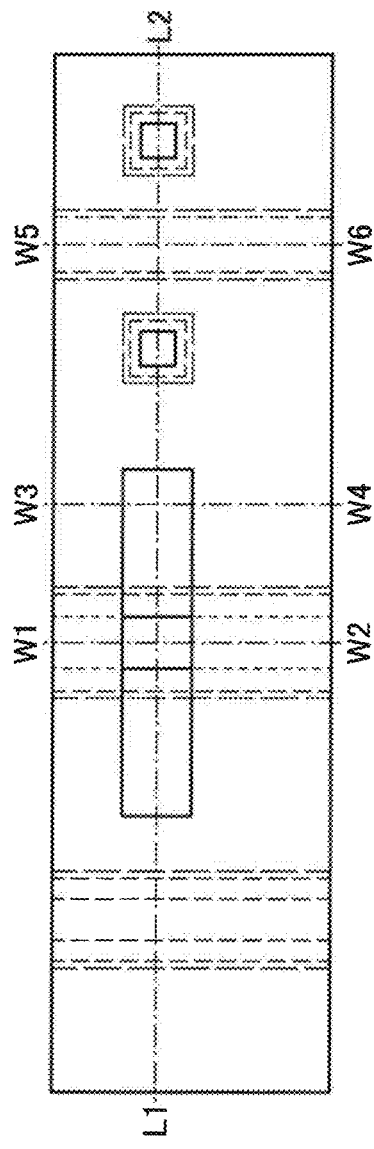
FIG. 12A
FIG. 12B
1000
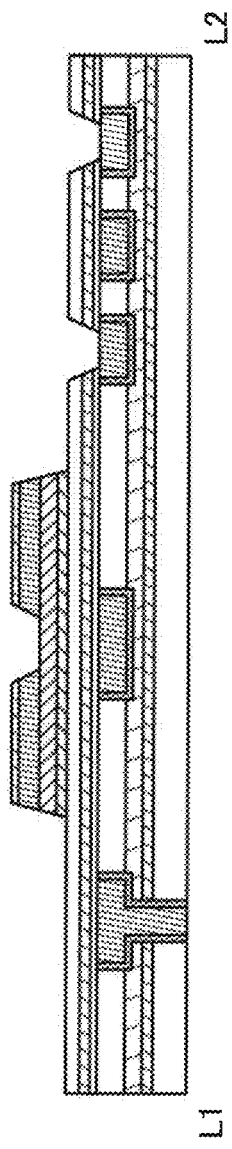

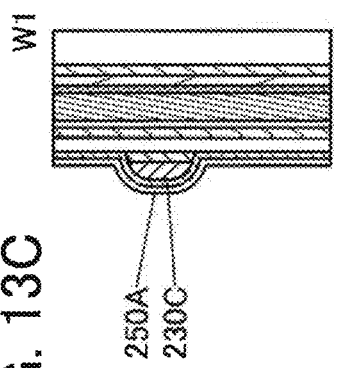
FIG. 13C
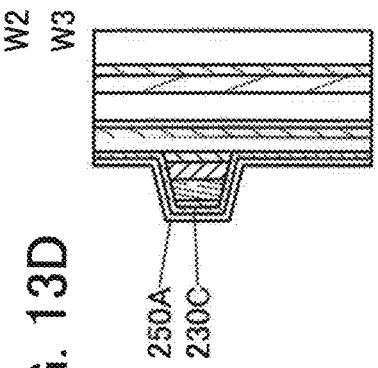
FIG. 13D
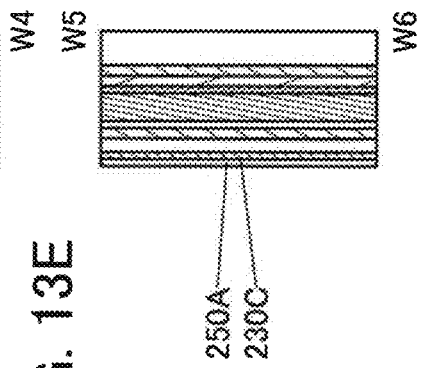
FIG. 13E
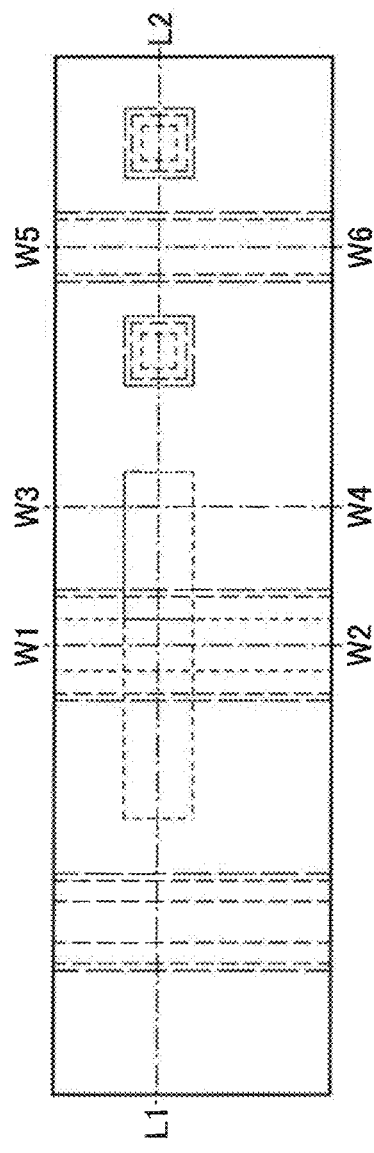
FIG. 13A
FIG. 13B
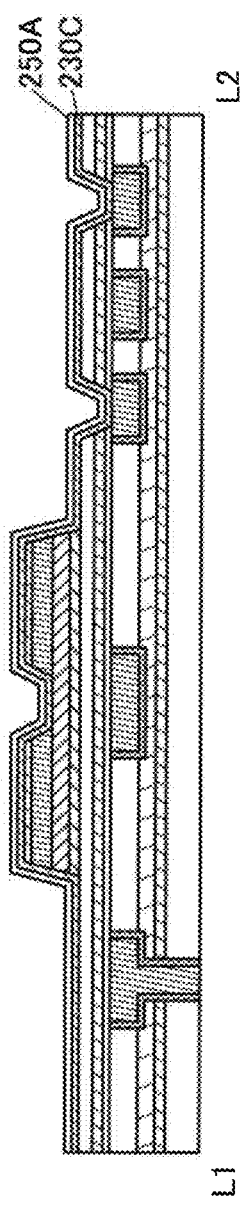

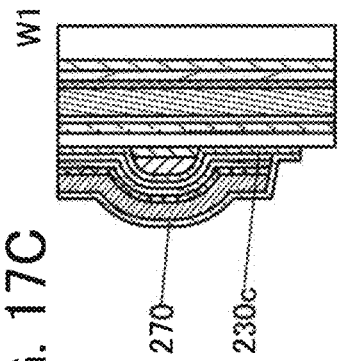
FIG. 17C
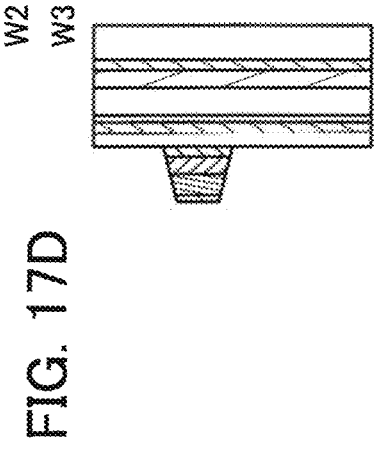
FIG. 17D
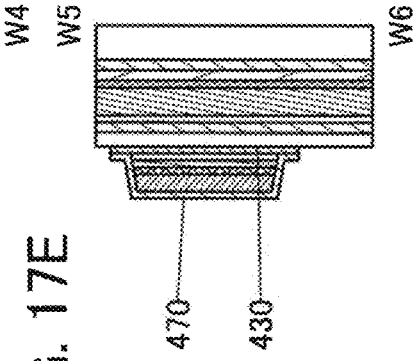
FIG. 17E
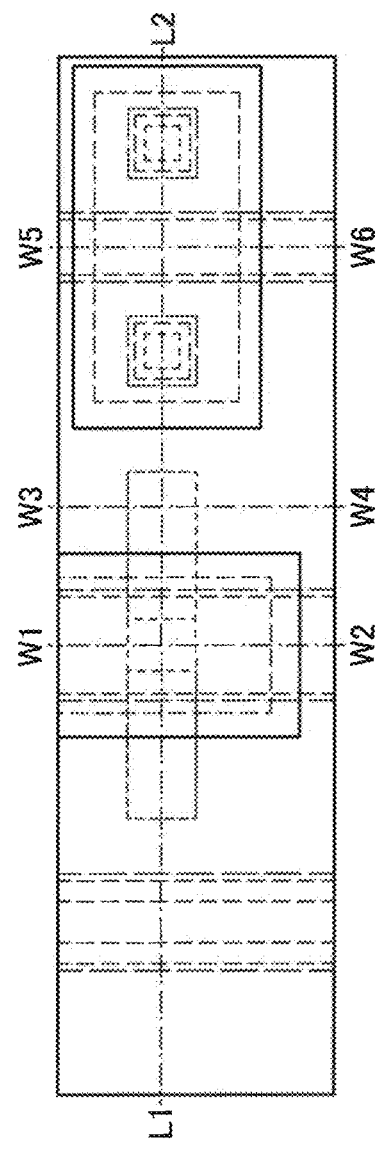
FIG. 17A
FIG. 17B

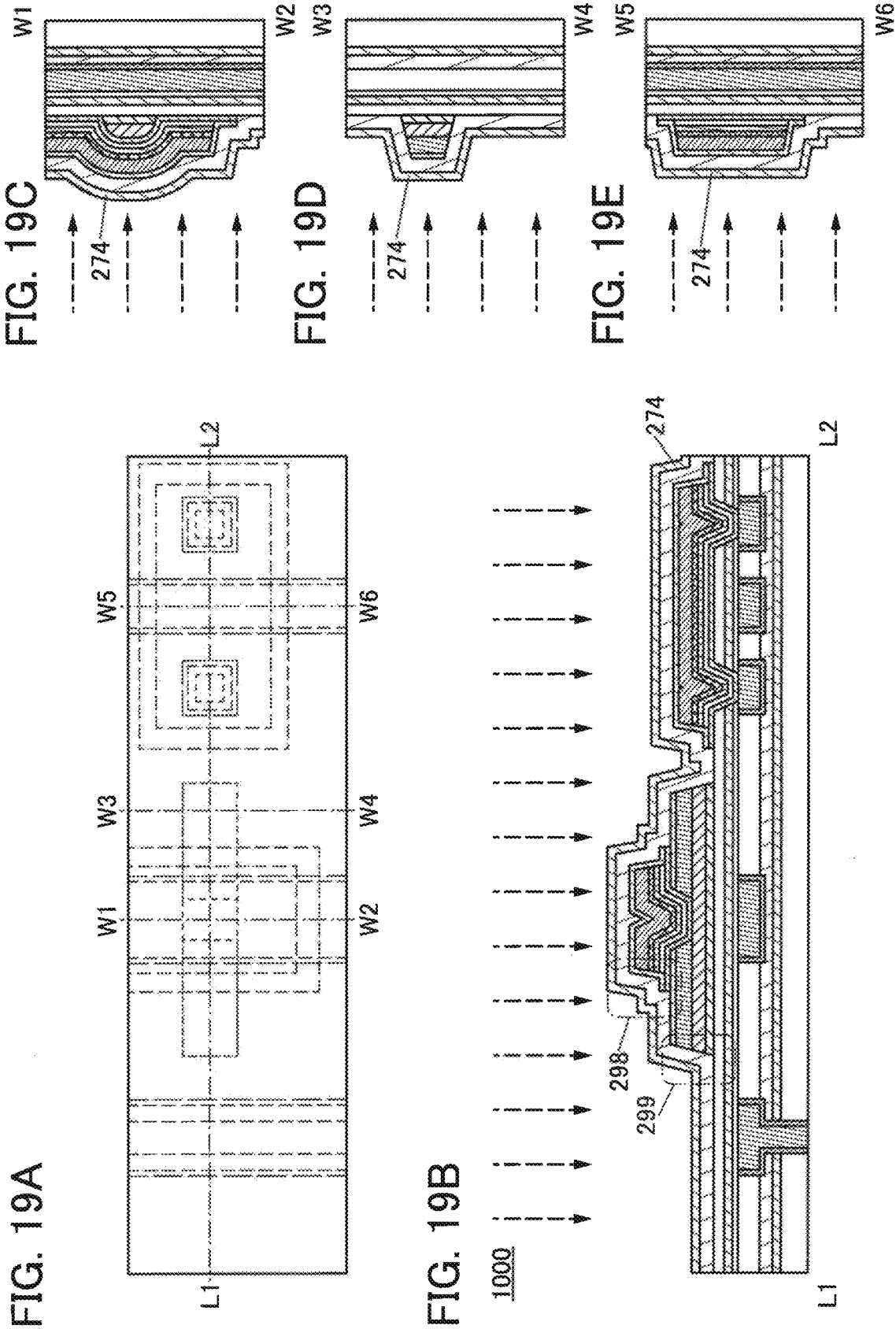

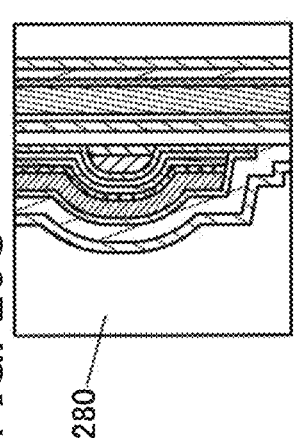
FIG. 20C
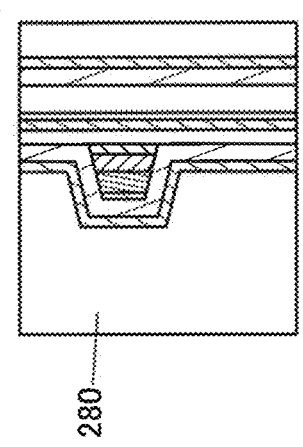
FIG. 20D
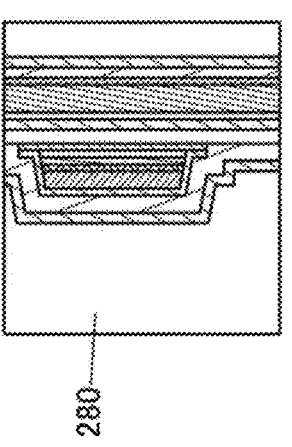
FIG. 20E
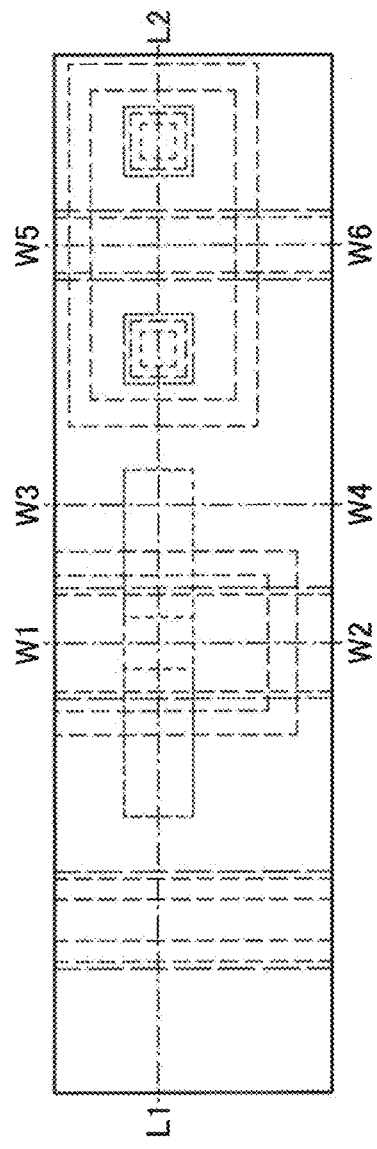
FIG. 20A
FIG. 20B

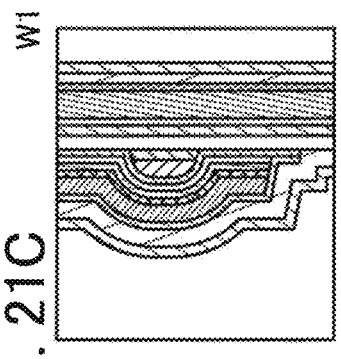
FIG. 21C
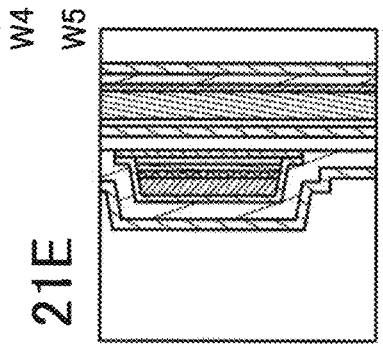
FIG. 21D
FIG. 21E
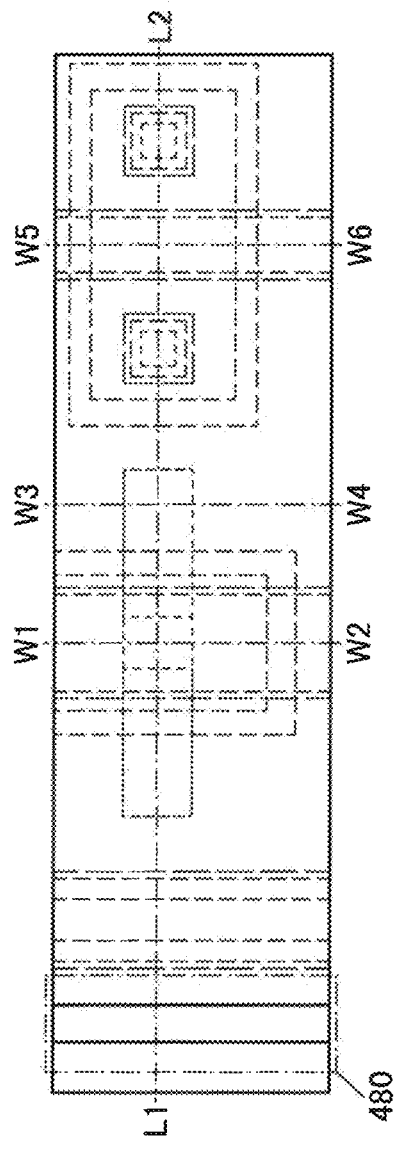
FIG. 21A
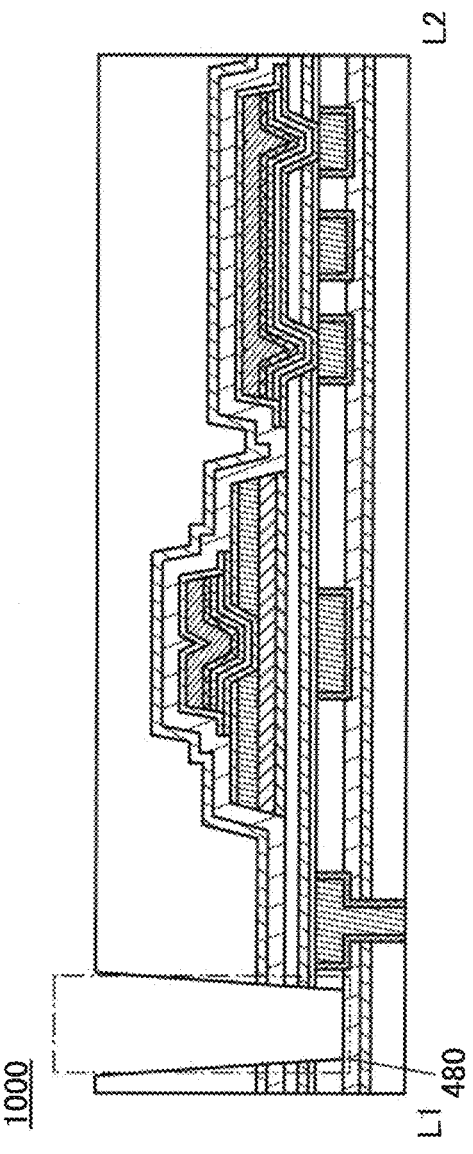
FIG. 21B

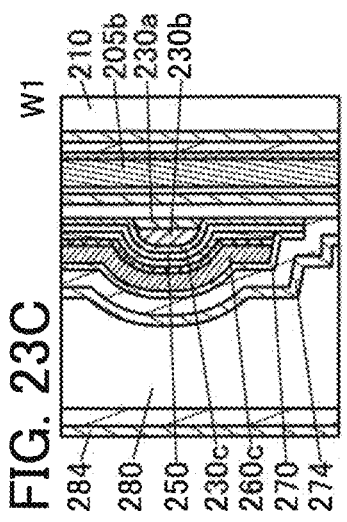
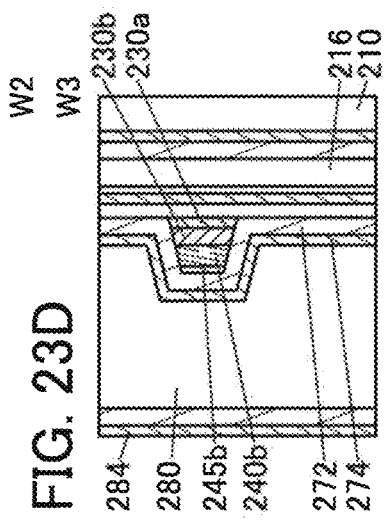
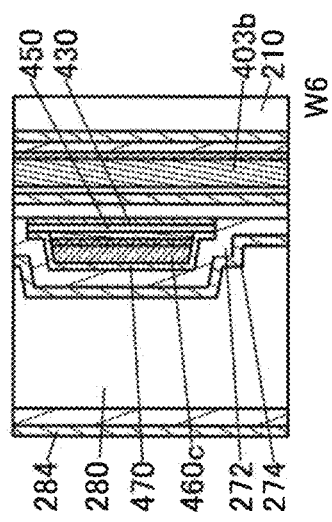
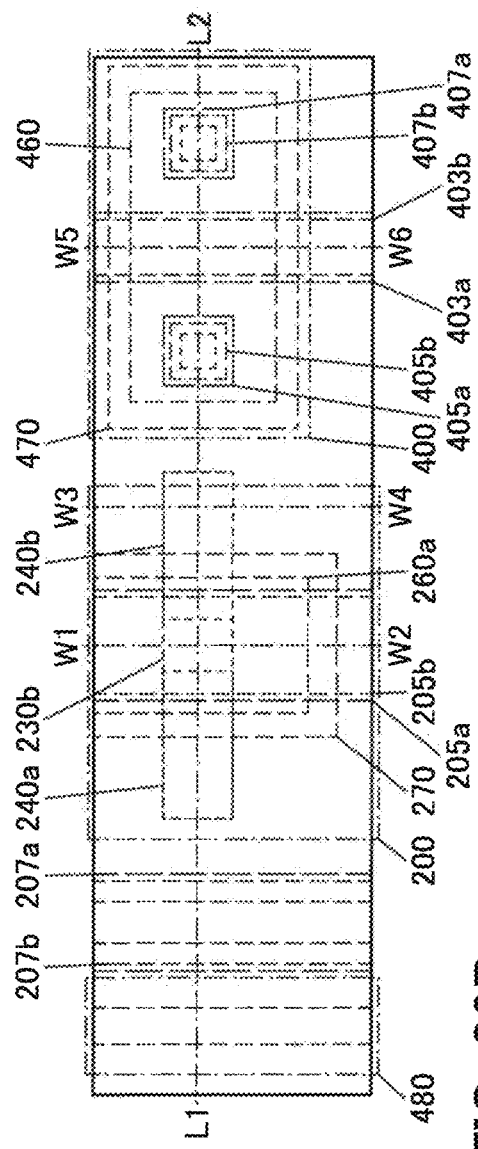
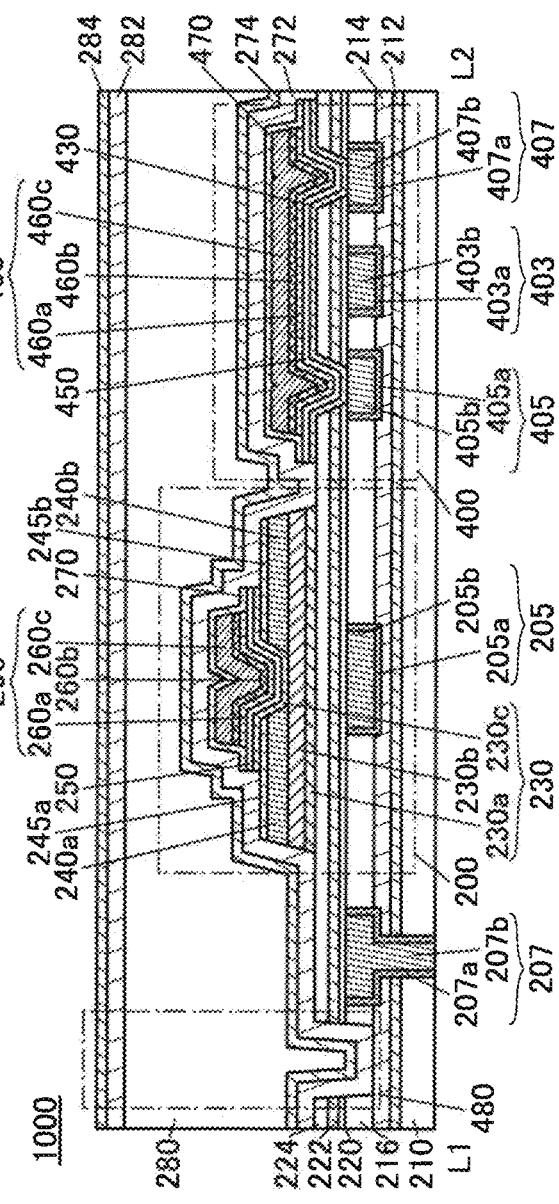

US 10,741,679 B2

SEMICONDUCTOR DEVICE AND METHOD FOR MANUFACTRING SEMICONDUCTOR DEVICE

CROSS-REFERENCE TO RELATED APPLICATIONS

This application is a continuation of U.S. application Ser. No. 15/492,253, filed Apr. 20, 2017, now U.S. Pat. No. 9,947,777, which claims the benefit of a foreign priority application filed in Japan as Serial No. 2016-086372 on Apr. 22, 2016, both of which are incorporated by reference.

BACKGROUND OF THE INVENTION

1. Field of the Invention

One embodiment of the present invention relates to a semiconductor device and a method for manufacturing the semiconductor device.

Note that one embodiment of the present invention is not limited to this technical field. One embodiment of the invention disclosed in this specification and the like relates to an object, a method, or a manufacturing method. One embodiment of the present invention relates to a process, a machine, manufacture, or a composition of matter.

Note that a semiconductor device in this specification and the like refers to any device that can function by utilizing semiconductor characteristics. A display device (e.g., a liquid crystal display device and a light-emitting display device), a projection device, a lighting device, an electro-optical device, a power storage device, a memory device, a semiconductor circuit, an imaging device, an electronic device, and the like include a semiconductor device in some cases.

2. Description of the Related Art

Techniques to use a semiconductor thin film for a transistor have attracted attention. The transistor is used in a wide range of electronic devices, such as an integrated circuit (IC) and an image display device (also simply referred to as a display device). A silicon-based semiconductor material is widely known as a material for the semiconductor thin film applicable to a transistor. Besides, an oxide semiconductor has attracted attention.

For example, a technique for manufacturing a display device using a transistor whose active layer is formed of zinc oxide or In—Ga—Zn-based oxide as an oxide semiconductor has been disclosed (see Patent Documents 1 and 2).

Furthermore, in recent years, a technique for manufacturing an integrated circuit for a memory device using a transistor including an oxide semiconductor has been disclosed (see Patent Document 3). Not only the memory device but also an arithmetic device or other devices have been manufactured using the transistor including an oxide semiconductor.

However, it is known that the transistor including an oxide semiconductor in its active layer has a problem in that the electrical characteristics are easily changed by impurities and oxygen vacancies in the oxide semiconductor and thus the reliability is low. For example, the threshold voltage of the transistor is changed in some cases after a bias-temperature stress test (a BT test).

REFERENCE

Patent Document

[Patent Document 1] Japanese Published Patent Application No. 2007-123861
[Patent Document 2] Japanese Published Patent Application No. 2007-096055
[Patent Document 3] Japanese Published Patent Application No. 2011-119674

SUMMARY OF THE INVENTION

In view of the problem, an object of one embodiment of the present invention is to provide a semiconductor device having favorable reliability. Another object of one embodiment of the present invention is to provide a semiconductor device including an oxide semiconductor having little impurities. Another object of one embodiment of the present invention is to provide a semiconductor device including an oxide semiconductor having little oxygen vacancies.

Another object of one embodiment of the present invention is to provide a semiconductor device having favorable electrical characteristics. Another object of one embodiment of the present invention is to provide a semiconductor device with low power consumption. Another object of one embodiment of the present invention is to provide a miniaturized or a highly integrated semiconductor device. Another object of one embodiment of the present invention is to provide a highly productive semiconductor device.

Note that the description of these objects does not preclude the existence of other objects. One embodiment of the present invention does not necessarily achieve all the objects. Other objects will be apparent from and can be derived from the description of the specification, the drawings, the claims, and the like.

The present invention achieves a reduction in oxygen vacancies in an oxide semiconductor by supplying excess oxygen to the oxide semiconductor from the surrounding oxide insulator.

Moreover, the oxide insulator is dehydrated or dehydrogenated by heat treatment or the like in order to prevent impurities such as water or hydrogen from entering the oxide semiconductor from the surrounding oxide insulator or the like. Moreover, an insulator having a barrier property against impurities such as water or hydrogen is formed to cover the oxide insulator and the oxide semiconductor in order to prevent impurities such as water or hydrogen from entering the dehydrated or dehydrogenated oxide insulator or the like from the outside.

Furthermore, the insulator having a barrier property against impurities such as water or hydrogen is less likely to transmit oxygen. Owing to this, oxygen is prevented from diffusing outward and effectively supplied to the oxide semiconductor and the surrounding oxide insulator.

In such a manner, a reduction in impurities such as water or hydrogen contained in the oxide semiconductor and the surrounding oxide insulator and a reduction in oxygen vacancies in the oxide semiconductor are achieved.

One embodiment of the present invention is a manufacturing method of a semiconductor device comprising the steps of: forming a first oxide semiconductor having an island shape; forming a first conductor and a second conductor over the first oxide semiconductor; forming an oxide semiconductor film over the first oxide semiconductor, the first conductor, and the second conductor; forming a first insulating film over the oxide semiconductor film; forming a conductive film over the first insulating film; removing part of the first insulating film and part of the conductive film to form a first insulator and a third conductor; forming a second insulating film covering the first insulator and the third conductor; removing part of the oxide semiconductor film and part of the second insulating film to form a second oxide semiconductor and a second insulator and to expose a side surface of the first oxide semiconductor; forming a third insulator in contact with the side surface of the first oxide semiconductor and with a side surface of the second oxide semiconductor; forming a fourth insulator in contact with the third insulator; and performing a microwave-excited plasma treatment to the third insulator and the fourth insulator.

One embodiment of the present invention is a manufacturing method of a semiconductor device, comprising the steps of: forming a first oxide semiconductor having an island shape; forming a first conductor and a second conductor over the first oxide semiconductor; forming an oxide semiconductor film over the first oxide semiconductor, the first conductor, and the second conductor; forming a first insulating film over the oxide semiconductor film; forming a conductive film over the first insulating film; removing part of the first insulating film and part of the conductive film to form a first insulator and a third conductor; forming a second insulating film covering the oxide semiconductor film, the first insulator, and the third conductor; performing a first microwave-excited plasma treatment; removing part of the oxide semiconductor film and part of the second insulating film to form a second oxide semiconductor and a second insulator and to expose a side surface of the first oxide semiconductor; forming a third insulator in contact with the side surface of the first oxide semiconductor and with a side surface of the second oxide semiconductor; forming a fourth insulator in contact with the third insulator; and performing a second microwave-excited plasma treatment on the third insulator and the fourth insulator.

One embodiment of the present invention is a manufacturing method of a semiconductor device comprising the steps of: forming a first oxide semiconductor having an island shape; forming a first conductor and a second conductor over the first oxide semiconductor; forming an oxide semiconductor film over the first oxide semiconductor, the first conductor, and the second conductor; forming a first insulating film over the oxide semiconductor film; forming a conductive film over the first insulating film; removing part of the conductive film to form a third conductor; forming a second insulating film covering the oxide semiconductor film, and the third conductor; removing part of the oxide semiconductor film, part of the first insulating film, and part of the second insulating film to form a second oxide semiconductor, a first insulator, and a second insulator and to expose a side surface of the first oxide semiconductor; forming a third insulator in contact with the side surface of the first oxide semiconductor, the first insulator, and a side surface of the second oxide semiconductor; forming a fourth insulator in contact with the third insulator; and performing a microwave-excited plasma treatment on the third insulator and the fourth insulator.

One embodiment of the present invention is a manufacturing method of a semiconductor device comprising the steps of: forming a first oxide semiconductor having an island shape; forming a first conductor and a second conductor over the first oxide semiconductor; forming an oxide semiconductor film over the first oxide semiconductor, the first conductor, and the second conductor; forming a first insulating film over the oxide semiconductor film; forming a conductive film over the first insulating film; removing part of the conductive film to form a third conductor; forming a second insulating film covering the first insulator and the third conductor; performing a first microwave-excited plasma treatment; removing part of the oxide semiconductor film, part of the first insulating film, and part of the second insulating film to form a second oxide semiconductor, a first insulator, and a second insulator and to expose a side surface of the first oxide semiconductor; forming a third insulator in contact with the side surface of the first oxide semiconductor, the first insulator, and a side surface of the second oxide semiconductor; forming a fourth insulator in contact with the third insulator; and performing a second microwave-excited plasma treatment on the third insulator and the fourth insulator.

The third insulator in the above structure is formed by a sputtering method at a substrate temperature higher than or equal to 120° C. and lower than or equal to 150° C.

The third insulator in the above structure is formed in such a manner that heat treatment at a temperature higher than or equal to 100° C. is performed and then the third insulator is formed in a deposition apparatus without exposure to outside air.

According to one embodiment of the present invention, a semiconductor device having favorable reliability can be provided. According to one embodiment of the present invention, a semiconductor device including an oxide semiconductor containing little impurities can be provided. According to one embodiment of the present invention, a semiconductor device including an oxide semiconductor containing little oxygen vacancies can be provided.

According to one embodiment of the present invention, a semiconductor device having favorable electrical characteristics can be provided. According to one embodiment of the present invention, a semiconductor device with low power consumption can be provided. According to one embodiment of the present invention, a semiconductor device that can be miniaturized or highly integrated can be provided. According to one embodiment of the present invention, a semiconductor device with high productivity can be provided.

Note that the description of these effects does not preclude the existence of other effects. One embodiment of the present invention does not necessarily have all the effects listed above. Other effects will be apparent from and can be derived from the description of the specification, the drawings, the claims, and the like.

BRIEF DESCRIPTION OF THE DRAWINGS

FIGS. 3A to 3E illustrate a method for manufacturing a transistor of one embodiment of the present invention.

FIGS. 4A to 4E illustrate a method for manufacturing a transistor of one embodiment of the present invention.

FIGS. 5A to 5E illustrate a method for manufacturing a transistor of one embodiment of the present invention.

FIGS. 7A to 7E illustrate a method for manufacturing a transistor of one embodiment of the present invention.

FIGS. 9A to 9E illustrate a method for manufacturing a transistor of one embodiment of the present invention.

FIGS. 10A to 10E illustrate a method for manufacturing a transistor of one embodiment of the present invention.

FIGS. 12A to 12E illustrate a method for manufacturing a transistor of one embodiment of the present invention.

FIGS. 13A to 13E illustrate a method for manufacturing a transistor of one embodiment of the present invention.

FIGS. 17A to 17E illustrate a method for manufacturing a transistor of one embodiment of the present invention.

FIGS. 19A to 19E illustrate a method for manufacturing a transistor of one embodiment of the present invention.

FIGS. 20A to 20E illustrate a method for manufacturing a transistor of one embodiment of the present invention.

FIGS. 21A to 21E illustrate a method for manufacturing a transistor of one embodiment of the present invention.

FIGS. 23A to 23E are a top view and cross-sectional views of a semiconductor device according to one embodiment of the present invention.

DETAILED DESCRIPTION OF THE INVENTION

Figure 1:
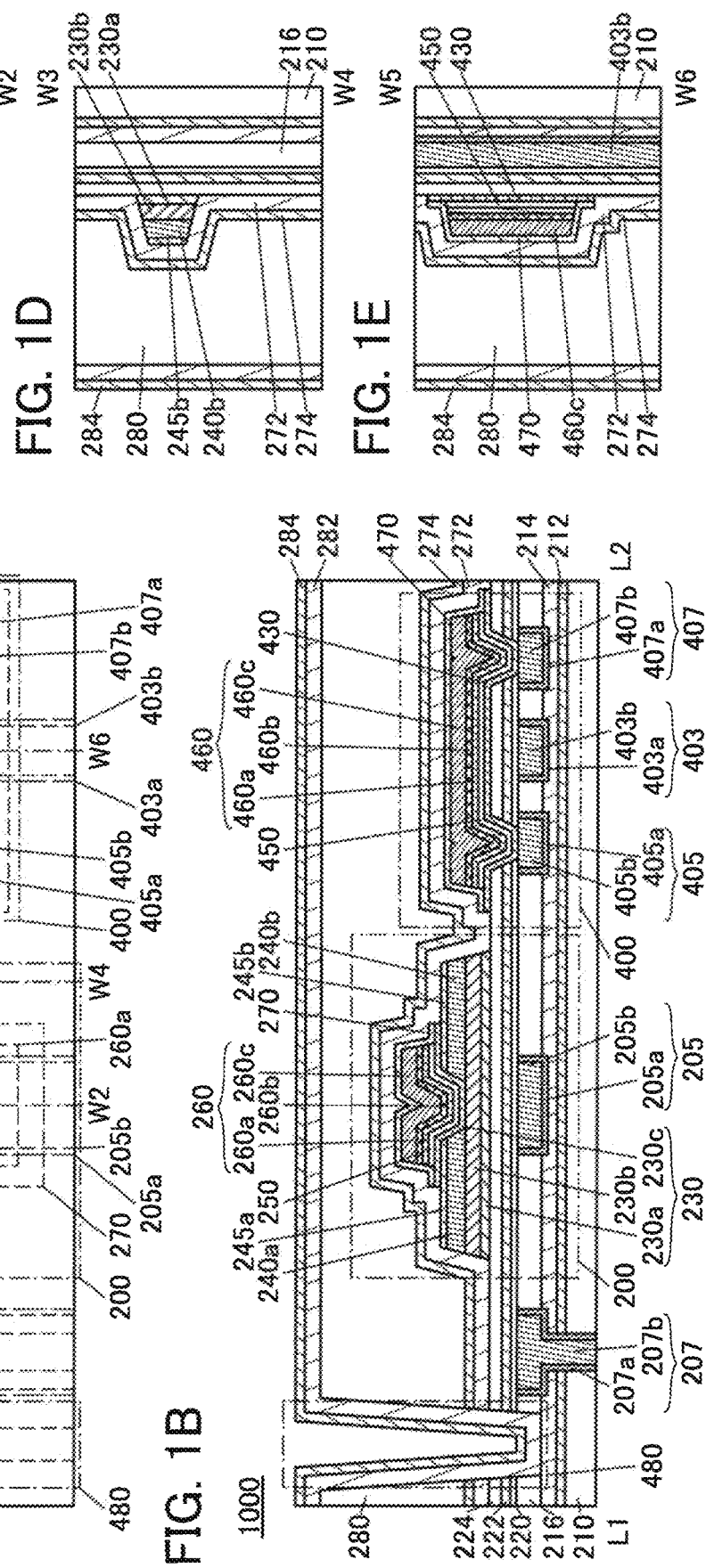
FIGS. 1A to 1E are a top view and cross-sectional views of a semiconductor device according to one embodiment of the present invention.

Embodiments will be described in detail with reference to the drawings. Note that one embodiment of the present invention is not limited to the following description. It will be readily appreciated by those skilled in the art that modes and details of the present invention can be modified in various ways without departing from the spirit and scope of the present invention. Thus, the present invention should not be construed as being limited to the description in the following embodiments and example. Note that in the structures of the invention described below, the same portions or portions having similar functions are denoted by the same reference numerals in different drawings, and description of such portions is not repeated in some cases.

The position, size, range, and the like of each component illustrated in the drawings and the like are not accurately represented in some cases to facilitate understanding of the invention. Therefore, the present invention is not necessarily limited to the position, size, range, or the like as disclosed in the drawings and the like. For example, in the actual manufacturing process, a layer, a resist mask, or the like might be unintentionally reduced in size by etching treatment or the like, which is not illustrated in some cases for easy understanding.

Especially in a top view (also referred to as a plan view), a perspective view, or the like, some components are not illustrated in some cases for easy understanding of the invention. Some hidden lines and the like are not illustrated in some cases.

Ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components. A term with an ordinal number in this specification and the like might be provided with a different ordinal number in a claim. In some cases, a term with an ordinal number in this specification and the like is not provided with any ordinal number in a claim.

In this specification and the like, a term such as an "electrode" or a "wiring" does not limit a function of the component. For example, an "electrode" is used as part of a "wiring" in some cases, and vice versa. Furthermore, the term "electrode" or "wiring" can also mean a combination of a plurality of "electrodes" and "wirings" formed in an integrated manner.

Note that the term "over" or "under" in this specification and the like does not necessarily mean that a component is placed "directly on" or "directly below" and "directly in contact with" another component. For example, the expression "electrode B over insulating layer A" does not necessarily mean that the electrode B is on and in direct contact with the insulating layer A and can mean the case where another component is provided between the insulating layer A and the electrode B.

Functions of a source and a drain might be switched depending on operation conditions, for example, when a transistor having opposite polarity is employed or the direction of current flow is changed in circuit operation. Thus, it is difficult to define which is a source or a drain. Accordingly, the terms "source" and "drain" can be switched in this specification.

Note that the channel length refers to, for example, the distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a plan view of the transistor. In one transistor, channel lengths in all regions are not necessarily the same. In other words, the channel length of one transistor is not fixed to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter referred to as an effective channel width) is different from a channel width shown in a top view of a transistor (hereinafter referred to as an apparent channel width) in some cases. For example, in a transistor having a gate electrode covering a side surface of a semiconductor, an effective channel width is greater than an apparent channel width, and its influence cannot be ignored in some cases. For example, in a miniaturized transistor having a gate electrode covering a side surface of a semiconductor, the proportion of a channel region formed in a side surface of a semiconductor is increased. In that case, an effective channel width is greater than an apparent channel width.

In such a case, an effective channel width might be difficult to measure. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, an apparent channel width is referred to as a surrounded channel width (SCW) in some cases. Furthermore, in this specification, in the case where the term "channel width" is simply used, it may represent a surrounded channel width or an apparent channel width. In this specification, in the case where the term "channel width" is simply used, it may represent an effective channel width in some cases. Note that a channel length, a channel width, an effective channel width, an apparent channel width, a surrounded channel width, and the like can be determined by analyzing a cross-sectional TEM image and the like.

Note that in the case where field-effect mobility, a current value per channel width, and the like of a transistor are obtained by calculation, a surrounded channel width may be used for the calculation. In that case, a value different from one in the case where an effective channel width is used for the calculation is obtained in some cases.

Note that an impurity in a semiconductor refers to, for example, elements other than the main components of a semiconductor. For example, an element with a concentration lower than 0.1 atomic % can be regarded as an impurity. Inclusion of impurities may cause an increase in density of states (DOS) in a semiconductor, and/or a decrease in the carrier mobility or the crystallinity. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the oxide semiconductor; there are hydrogen, lithium, sodium, silicon, boron, phosphorus, carbon, and nitrogen, for example. In the case of an oxide semiconductor, water also serves as an impurity in some cases. In the case of an oxide semiconductor, oxygen vacancies may be formed by entry of impurities such as hydrogen. Furthermore, when the semiconductor is silicon, examples of an impurity which changes the characteristics of the semiconductor include oxygen, Group 1 elements except hydrogen, Group 2 elements, Group 13 elements, and Group 15 elements.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The terms "perpendicular" and "orthogonal" indicates that the angle formed between two straight lines is greater than or equal to 80° and less than or equal to 100°, and accordingly also includes the case where the angle formed between two straight lines is greater than or equal to 85° and less than or equal to 95°. In addition, the term "substantially perpendicular" indicates that the angle formed between two straight lines is greater than or equal to 60° and less than or equal to 120°.

In the specification and the like, the terms "identical", "the same", "equal", "uniform", and the like (including synonyms thereof) used in describing calculation values and actual measurement values allow for a margin of error of ±20% unless otherwise specified.

In this specification and the like, in the case where an etching step (removal step) is performed after a resist mask is formed in a photolithography method, the resist mask is removed after the etching step, unless otherwise specified.

Note that the terms "film" and "layer" can be interchanged with each other depending on the case or circumstances. For example, the term "conductive layer" can be changed into the term "conductive film" in some cases. For another example, the term "insulating film" can be changed into the term "insulating layer" in some cases.

Unless otherwise specified, transistors described in this specification and the like are enhancement-type (normally-off-type) field effect transistors. Unless otherwise specified, a transistor described in this specification and the like refers to an n-channel transistor. Thus, unless otherwise specified, the threshold voltage (also referred to as Vth) is larger than 0 V.

Embodiment 1

In this embodiment, a semiconductor device including a transistor having a favorable reliability and a method for manufacturing the semiconductor device are described with reference to FIGS. 1A to 1E to FIGS. 24A and 24B. The transistor provided in the semiconductor device described in this embodiment includes an oxide semiconductor in its active layer. Impurities such as water or hydrogen in the oxide semiconductor are reduced, and excess oxygen is supplied to reduce oxygen vacancies, whereby the reliability of the transistor provided in the semiconductor device can be improved.

<Structure Example of Semiconductor Device 1000>

FIGS. 1A, 1B, 1C, 1D, and 1E are top views and cross-sectional views showing a semiconductor device 1000. The semiconductor device 1000 includes a transistor 200 and a transistor 400. The transistor 200 and the transistor 400 which are formed over a substrate (not shown) have different structures. For example, the transistor 400 may have a smaller drain current than the transistor 200 when a back gate voltage and a top gate voltage are each 0 V (the drain current at that time is hereinafter referred to as $I_{cut}$). The transistor 400 is a switching element capable of controlling the potential of a back gate of the transistor 200.

Therefore, a charge at a node connected to the back gate of the transistor 200 can be prevented from being lost by making the node have a desired potential and then turning off the transistor 400.

FIG. 1A is a top view of the semiconductor device 1000. FIG. 1B is a cross-sectional view of the transistor 200 and the transistor 400 in the channel length direction, which is taken along dashed-dotted line L1-L2 in FIG. 1A. FIG. 1C is a cross-sectional view of the transistor 200 in the channel width direction taken along dashed-dotted line W1-W2 in FIG. 1A. FIG. 1D is a cross-sectional view of the transistor 200 taken along dashed-dotted line W3-W4 in FIG. 1A. FIG. 1E is a cross-sectional view of the transistor 400 in the channel width direction taken along dashed-dotted line W5-W6 in FIG. 1A.

Hereinafter, the structure of each of the transistor 200 and the transistor 400 will be described with reference to FIGS. 1A, 1B, 1C, 1D, and 1E. Note that detailed description of the materials of each of the transistor 200 and the transistor 400 will be made in <Materials>.

[Transistor 200]

As illustrated in FIGS. 1A, 1B, 1C, and 1D, the transistor 200 includes an insulator 212 provided over an insulator 210, an insulator 214 provided over the insulator 212, a conductor 205 (a conductor 205a and a conductor 205b) provided over the insulator 214, an insulator 220, an insulator 222, and an insulator 224 provided over the conductor 205, an oxide 230 (an oxide 230a, an oxide 230b, and an oxide 230c) provided over the insulator 224, a conductor 240a and a conductor 240b (hereinafter the conductor 240a and the conductor 240b can be collectively referred to as a conductor 240) provided over the oxide 230b, a layer 245a and a layer 245b (hereinafter the layer 245a and the layer 245b can be collectively referred to as a layer 245) provided over the conductor 240, an insulator 250 provided over the oxide 230c, a conductor 260 (a conductor 260a, a conductor 260b, and a conductor 260c) provided over the insulator 250, a layer 270 provided over the conductor 260c, an insulator 272 provided over the layer 270, and an insulator 274 provided over the insulator 272.

The insulator 212 and the insulator 214 are preferably formed using an insulating material which is less likely to transmit impurities such as water or hydrogen, and for example, are preferably formed using aluminum oxide or the like. Accordingly, diffusion of impurities such as water or hydrogen from a layer under the insulator 210 to a layer over the insulator 212 and the insulator 214 can be inhibited. Note that it is preferable that at least one of impurities such as a hydrogen atom, a hydrogen molecule, a water molecule, an oxygen atom, an oxygen molecule, a nitrogen atom, a nitrogen molecule, a nitrogen oxide molecule (e.g., $N_2O$, NO, and $NO_2$), and a copper atom be less likely to penetrate the insulator 212 and the insulator 214. Furthermore, hereinafter, the same applies to the description of an insulating material which is less likely to transmit impurities.

The insulator 212 is preferably formed using an atomic layer deposition (ALD) method, for example. Accordingly, the insulator 212 can have favorable coverage, and formation of cracks, pin holes, and the like in the insulator 212 can be prevented. In addition, the insulator 214 is preferably formed using a sputtering method, for example. Accordingly, the insulator 214 can be formed at a higher deposition rate than the insulator 212 and can have a larger thickness with high producibility than the insulator 212. Such a stack of the insulators 212 and 214 can have a higher barrier property against impurities such as water or hydrogen. Note that the insulator 212 may be provided under the insulator 214. Furthermore, when the insulator 214 has a sufficient barrier property against impurities, the insulator 212 is not necessarily provided.

Furthermore, for the insulators 212 and 214, an insulating material which is less likely to transmit oxygen is preferably used. With this material, oxygen contained in the insulator 224 or the like can be inhibited from diffusing into lower layers. Thus, oxygen can be supplied to the oxide 230b effectively.

The insulator 210, the insulator 212, and the insulator 214 include an opening. The insulator 210, the insulator 212, and the insulator 214 are on the same plane along the opening. The insulator 216 includes a plurality of openings. One of the openings overlaps with the opening formed in the insulator 210, the insulator 212, and the insulator 214. The diameter of the opening formed in the insulator 216 is larger than that of the opening formed in the insulator 210, the insulator 212, and the insulator 214. The other openings in the insulator 216 reach a top surface of the insulator 214.

The conductor 205a is in contact with and along an inner wall of the opening in the insulator 216. Moreover, the conductor 205b is formed on the inner side. The top surfaces of the conductor 205a and the conductor 205b can be substantially aligned with the top surface of the insulator 216.

Moreover, a conductor 207 may be provided in the same layer as the conductor 205. The conductor 207 is provided in each of the openings formed in the insulator 210, the insulator 212, the insulator 214, and the insulator 216. Part of the conductor 207 provided in the same layer as the insulator 216 functions as a wiring. Part of the conductor 207 provided in the same layer as the insulator 210, the insulator 212, and the insulator 214 functions as a plug. The conductor 207 consists of a conductor 207a, a conductor 207b, and a conductor 207c. The conductor 207a is formed in contact with the inner wall of the opening. The conductor 207b is formed inside the opening with the conductor 207a provided therein. Here, top surfaces of the conductors 207a and 207b can be at substantially the same level as the top surface of the insulator 216. The conductor 207 can be connected to a wiring, a circuit element, a semiconductor element, or the like positioned under the insulator 210. Similarly, when a wiring and a plug are provided over the conductor 207, the conductor 207 can be connected to a wiring, a circuit element, a semiconductor element, or the like positioned in an upper layer.

The conductor 205a and the conductor 207a are preferably formed using a conductive material which is less likely to transmit impurities such as water or hydrogen. For example, tantalum, tantalum nitride, ruthenium, ruthenium oxide, or the like is preferably used. The conductor 205a and the conductor 207a may be a single layer or a stacked layer. Owing to this, diffusion of impurities such as water or hydrogen from a layer under the insulator 210 into an upper layer through the conductor 205a or the conductor 207a can be inhibited. Note that it is preferable that at least one of impurities such as a hydrogen atom, a hydrogen molecule, a water molecule, an oxygen atom, an oxygen molecule, a nitrogen atom, a nitrogen molecule, a nitrogen oxide molecule (e.g., $N_2O$, NO, and $NO_2$), and a copper atom be less likely to penetrate the conductor 205a and the conductor 207a. The same applies to the following description of a conductive material which is less likely to transmit impurities.

When the conductor 205b and the conductor 207b are formed using a metal such as copper which easily diffuses into silicon oxide and the insulator 220 is formed using an insulating material such as silicon nitride or silicon nitride oxide which is less likely to transmit copper, diffusion of impurities such as copper into a layer over the insulator 220 can be prevented. It is preferable that also the conductor 205a and the conductor 207a be formed using an insulating material which is less likely to transmit copper so as to prevent diffusion of impurities such as copper to the outside of the conductor 205a and the conductor 205b.

The insulator 222 is preferably formed using an insulating material which is less likely to transmit oxygen and impurities such as water or hydrogen. For example, aluminum oxide, hafnium oxide, or the like is preferably used. This can inhibit diffusion of impurities such as water or hydrogen from a layer under the insulator 210 into a layer over the insulator 212 and the insulator 214. Furthermore, oxygen contained in the insulator 224 or the like can be inhibited from diffusing into lower layers.

The insulator 224 is preferably formed using an insulator from which oxygen is released by heating. Specifically, it is preferable that the amount of oxygen released from the insulator in thermal desorption spectroscopy (TDS) and converted into oxygen atoms be $1.0 \times 10^{18}$ atoms/cm$^3$ or more, preferably $3.0 \times 10^{20}$ atoms/cm$^3$ or more. Note that the surface temperature of the insulator is higher than or equal to 50° C. and lower than or equal to 700° C., preferably higher than or equal to 100° C. and lower than or equal to 500° C. Note that oxygen released by the heating is also referred to as excess oxygen. Since the insulator 224 formed using the insulator is formed in contact with the oxide 230, oxygen can be supplied to the oxide 230b effectively.

Furthermore, the concentration of impurities such as water, hydrogen, or nitrogen oxide in the insulator 224 is preferably lowered. The amount of hydrogen released from the insulator 224 that is converted into hydrogen molecules per area of the insulator 224 is less than or equal to $2 \times 10^{15}$ atoms/cm$^2$, preferably less than or equal to $1 \times 10^{15}$ atoms/cm$^2$, further preferably less than or equal to $5 \times 10^{14}$ atoms/cm$^2$ in the range from 50° C. to 500° C. in TDS, for example.

The oxide 230a is preferably formed using an oxide formed under an oxygen atmosphere, for example. In that case, the shape of the oxide 230a can be stable. Note that details of the components of the oxides 230a to 230c are described later.

In order to give stable electrical characteristics and favorable reliability to the transistor 200, it is preferable that the concentration of impurities and oxygen vacancies in the oxide be reduced so that the oxide 230b can be highly purified and intrinsic or substantially highly purified and intrinsic. The highly purified and intrinsic or substantially highly purified and intrinsic oxide has a low density of defect states and accordingly has a low density of trap states in some cases.

Charge trapped by the trap states in the oxide takes a long time to be released and may behave like fixed charge. Thus, a transistor whose channel region is formed in an oxide having a high density of trap states has unstable electrical characteristics and low reliability in some cases.

In order to give stable electrical characteristics and high reliability to the transistor, it is effective to reduce oxygen vacancies and the concentration of impurities in the oxide. In addition, in order to reduce the concentration of impurities in the oxide, the concentration of impurities in a film that is adjacent to the oxide is preferably reduced.

An oxide used as the oxide 230b has an electron affinity higher than that of each of the oxide 230a and the oxide 230c. For example, the oxide used as the oxide 230b has a higher electron affinity than the oxides 230a and 230c by 0.07 eV or more and 1.3 eV or less, preferably 0.1 eV or more and 0.7 eV or less, further preferably 0.1 eV or more and 0.4 eV or less. Note that the electron affinity refers to an energy difference between the vacuum level and the conduction band minimum.

The oxide 230b includes a first region, a second region, and a third region. In the top view, the third region is positioned between the first region and the second region. The transistor 200 includes the conductor 240a and the conductor 240b over the first region and the second region of the oxide 230b, respectively. One of the conductors 240a and 240b can function as one of a source conductor and a drain conductor and the other can function as the other of the source conductor and the drain conductor. Thus, one of the first region and the second region of the oxide 230b can function as a source region and the other can function as a drain region. The third region of the oxide 230b can function as a channel formation region.

Here, side surfaces in contact with the oxide 230c of the conductors 240a and 240b each preferably have a taper angle less than 90°. The angle formed between the side surface in contact with the oxide 230c of the conductor 240a or 240b and the bottom surface thereof is preferably 45° or greater and 75° or less. When the conductors 240a and 240b are formed to have such a structure, the oxide 230c can be formed with good coverage even in step portions formed by the conductor 240. Accordingly, for example, disconnection of the oxide 230c, which causes the oxide 230b to be in contact with the insulator 250 or the like, can be prevented.

Moreover, the layer 245a and the layer 245b are formed over the conductor 240a and the conductor 240b, respectively. The layer 245a and the layer 245b are preferably formed using a material which is less likely to transmit oxygen, such as aluminum oxide. Accordingly, surrounding excess oxygen can be prevented from being used for oxidation of the conductor 240a and the conductor 240b.

The oxide 230c is formed over the layer 245a, the layer 245b, the conductor 240a, the conductor 240b, the oxide 230b, and the oxide 230a. Here, the oxide 230c is in contact with a top surface of the oxide 230b, side surfaces of the oxide 230b in the channel width direction, side surfaces of the oxide 230a in the channel width direction, and a top surface of the insulator 224. The oxide 230c may have a function of supplying oxygen to the oxide 230b. In addition, impurities such as water or hydrogen from the insulator 250 can be prevented from directly entering the oxide 230b by forming the insulator 250 over the oxide 230c. Furthermore, the oxide 230c is preferably formed using an oxide formed under an oxygen atmosphere, for example; thus, the shape of the oxide 230c can be stable.

The insulator 250 can function as a gate insulating layer. Like the insulator 224, the insulator 250 is preferably formed using an insulator from which oxygen is released by heating. When the insulator 250 formed using such an insulator is formed in contact with the oxide 230, oxygen can be supplied to the oxide 230 effectively. Furthermore, like the insulator 224, the concentration of impurities such as water or hydrogen in the insulator 250 is preferably lowered.

The conductor 260a, the conductor 260b, and the conductor 260c are formed over the insulator 250, the conductor 260a, and the conductor 260b, respectively. The insulator 250 and the conductor 260 each have a portion overlapping with the third region. In addition, end portions of the insulator 250, the conductor 260a, the conductor 260b, and the conductor 260c are substantially aligned.

One of the conductor 205 and the conductor 260 can function as a gate electrode and the other can function as a back gate electrode. The gate electrode and the back gate electrode are provided with the channel formation region in the semiconductor positioned therebetween. The potential of the back gate electrode may be the same as that of the gate electrode or may be a ground potential or a predetermined potential. By changing a potential of the back gate electrode independently of the potential of the gate electrode, the threshold voltage of the transistor can be changed.

The conductor 260a is preferably an oxide having conductivity. For example, an In—Ga—Zn-based oxide having high conductivity and having an atomic ratio of [In]:[Ga]:[Zn]=4:2:3 to 4.1 or in the neighborhood thereof, which can be used as the oxide 230, is preferably used.

The conductor 260b is preferably a conductor that can add impurities such as nitrogen to the conductor 260a to improve the conductivity of the conductor 260a. For example, titanium nitride or the like is preferably used when tungsten is used for the conductor 260c.

Moreover, the layer 270 is formed over the conductor 260. Here, for the layer 270, a material which is less likely to transmit oxygen is preferably used, and aluminum oxide or the like can be used, for example. Accordingly, surrounding excess oxygen can be prevented from being used for oxidation of the conductor 260. That is, the layer 270 functions as a gate cap for protecting the gate. The layer 270 and the oxide 230c extend beyond end portions of the conductor 260 and have regions where the layer 270 and the oxide 230c overlap with each other in the extending portions, and end portions of the layer 270 and the oxide 230c are substantially aligned.

The insulator 272 is provided to cover the oxide 230, the conductor 240, the layer 245, the insulator 250, the conductor 260, and the layer 270. In addition, the insulator 272 is provided in contact with side surfaces of the oxide 230b and the top surface of the insulator 224. Moreover, the insulator 274 is provided over the insulator 272.

Here, for the insulator 272, an oxide insulator that is formed by a sputtering method is preferably used, and for example, aluminum oxide is preferably used. With the insulator 272 formed using such an oxide insulator formed by a sputtering method, oxygen can be added to surfaces of the insulator 224 and the oxide 230b that are in contact with the insulator 272, so that the insulator 224 and the oxide 230b can be in an oxygen excess state.

The insulator 272 preferably has a property of gettering hydrogen in the insulator 224 and the oxide 230, and for example, is preferably formed using aluminum oxide. As a result, the concentration of impurities such as water or hydrogen in the insulator 224 and the oxide 230b can be reduced.

The insulators 272 and 274 are preferably formed using an insulating material which is less likely to transmit impurities such as water or hydrogen, and for example, are preferably formed using aluminum oxide or the like. With the insulator 272 including the insulating material, impurities such as water or hydrogen can be inhibited from diffusing from a layer over the insulator 274 into a layer below the insulator 272.

Furthermore, for the insulator 274, an oxide insulator that is formed by an ALD method is preferably used, and for example, aluminum oxide is preferably used. The insulator 274 formed by an ALD method has favorable coverage, and is a film in which formation of cracks, pinholes, or the like are suppressed. Although the insulators 272 and 274 are provided over an uneven structure, the insulator 274 formed by an ALD method can cover the transistor 200 without occurrence of disconnection, formation of cracks and pinholes, or the like. Thus, even when disconnection or the like occurs in the insulator 272, the insulator 272 can be covered with the insulator 274; therefore, the barrier property against impurities such as water or hydrogen of a stacked film of the insulators 272 and 274 can be improved noticeably.

In the case where the insulator 272 is formed by a sputtering method and the insulator 274 is formed by an ALD method, when the thickness of a portion over a top surface of the conductor 260c is referred to as a first thickness and the thickness of a portion over the side surfaces of the oxides 230a and 230b and the conductor 240 is referred to as a second thickness, the ratio of the first thickness to the second thickness in the insulator 272 might be different from that in the insulator 274. In the insulator 272, the first thickness and the second thickness can be approximately the same thickness. In contrast, in the insulator 274, the first thickness tends to be greater than the second thickness; for example, the first thickness is approximately twice as large as the second thickness in some cases.

Furthermore, for the insulators 272 and 274, an insulating material which is less likely to transmit oxygen is preferably used. Accordingly, oxygen contained in the insulator 224, the insulator 250, or the like can be inhibited from diffusing upward.

As described above, when the transistor 200 is positioned between the insulators 274 and 272 and the insulators 214 and 212, a large amount of oxygen can be contained in the insulator 224, the oxide 230, and the insulator 250 without diffusing outward. Furthermore, impurities such as water or hydrogen can be prevented from entering from an upper layer over the insulator 274 and a lower layer below the insulator 212, and thus the concentration of impurities in the insulator 224, the oxide 230, and the insulator 250 can be lowered.

In this manner, oxygen vacancies in the oxide 230b functioning as an active layer of the transistor 200 are reduced, and the concentration of impurities such as water or hydrogen is reduced; accordingly, the electrical characteristics of the transistor 200 are made stable, and the reliability can be improved.

An insulator 280 is provided over the insulator 274. Like the insulator 224 or the like, the concentration of impurities such as water or hydrogen in the insulator 280 is preferably lowered.

Moreover, an insulator 282 is provided over the insulator 280 and an insulator 284 is provided over the insulator 282. As well as the insulators 272 and 274, the insulators 282 and 284 are preferably formed using an insulating material which is less likely to transmit oxygen and impurities such as water or hydrogen, and for example, are preferably formed using aluminum oxide.

Like the insulator 272, the insulator 282 preferably has a property of gettering hydrogen in the insulator 280, and for example, is preferably formed using aluminum oxide. Providing the insulator 282 having such a property can lower the concentration of impurities such as water or hydrogen in the insulator 280.

Furthermore, like the insulator 274, for the insulator 284, an oxide insulator formed by an ALD method is preferably used, and for example, aluminum oxide is preferably used. With the insulator 284 including the insulating material, impurities such as water or hydrogen can be inhibited from diffusing from a layer over the insulator 284 into a layer below the insulator 282.

In the insulators 216, 220, 222, 224, 272, 274, and 280, an opening 480 is formed to reach the insulator 214. The insulator 282 is formed also on an inner wall of the opening 480 and in contact with the top surface of the insulator 214. Note that although only part of the opening 480 extending in the W1-W2 direction is illustrated in FIG. 1A, the opening 480 is formed to surround the transistors 200 and 400 and to surround at least the external side of the oxide 230. Moreover, it is preferable that the shape of the opening 480 seen from above be closed and the inside and a region inside the opening 480 and a region outside the opening 480 are divided. In the opening 480, the top surface of the insulator 214 and a bottom surface of the insulator 282 are in contact with each other; that is, a region surrounded by the opening 480 is a region surrounded by the insulators 214 and 282.

With such a structure, the transistor 200 can be surrounded and sealed with the insulators 282 and 284 in not only a perpendicular direction but also a lateral direction of the substrate. Accordingly, impurities such as water or hydrogen can be prevented from diffusing from the outside of the insulator 284 into the transistors 200 and 400. Moreover, the insulator 282 can be formed without disconnection or the like even in the opening 480 when formed by an ALD method. Accordingly, even when disconnection or the like occurs in the insulator 282, it can be covered with the insulator 284; therefore, the barrier property of a stacked film of the insulators 282 and 284 against impurities can be improved.

In addition, the opening 480 is preferably formed inside dicing lines or scribe lines along which the semiconductor device 1000 is cut out. In this way, even when the semiconductor device 1000 is cut out, side surfaces of the insulator 280, the insulator 224, the insulator 216, and the like remain sealed with the insulators 282 and 284; therefore, impurities such as water or hydrogen can be prevented from diffusing from the insulators into the transistors 200 and 400. Note that a plurality of regions surrounded by the opening 480 may be provided and a plurality of semiconductor devices may be sealed with the insulators 282 and 284 separately.

[Transistor 400]

As illustrated in FIGS. 1A, 1B, and 1E, the transistor 400 includes the insulator 212 provided over the insulator 210, the insulator 214 provided over the insulator 212, a conductor 403 (a conductor 403a and a conductor 403b), a conductor 405 (a conductor 405a and a conductor 405b), and a conductor 407 (a conductor 407a and a conductor 407b) which are provided over the insulator 214, the insulator 220, the insulator 222, and the insulator 224 provided over the conductor 403, the conductor 405, and the conductor 407, an oxide 430 provided over the insulator 224 and the conductors 405 and 407, an insulator 450 provided over the oxide 430, a conductor 460 (a conductor 460a, a conductor 460b, and a conductor 460c) provided over the insulator 450, a layer 470 provided over the conductor 460c, the insulator 272 provided over the layer 470, and the insulator 274 provided over the insulator 272. Hereinafter, description of the components already made for the transistor 200 is omitted.

The conductor 403, the conductor 405, and the conductor 407 are provided in the openings in the insulator 216. The conductor 403, the conductor 405, and the conductor 407 preferably have the same structure as that of the conductor 205. The conductor 403a is formed in contact with an inner wall of the opening in the insulator 216, and the conductor 403b is formed on the inner side. The conductor 405 and the conductor 407 also have the same structure as that of the conductor 403. One of the conductor 405 and the conductor 407 can function as one of a source conductor and a drain conductor, and the other can function as the other of the source conductor and the drain conductor.

The oxide 430 preferably has the same structure as that of the oxide 230c. The oxide 430 includes a first region, a second region, and a third region. In the top view, the third region is positioned between the first region and the second region. The transistor 400 includes the conductors 405 and the conductor 407 under the first region and under the second region of the oxide 430, respectively. Thus, one of the first region and the second region of the oxide 430 can function as a source region and the other can function as a drain region. The third region of the oxide 430 can function as a channel formation region.

Note that although a channel is formed in the oxide 230b in the transistor 200, a channel is formed in the oxide 430 in the transistor 400. The oxides 230b and the oxide 430 are preferably formed using semiconductor materials having different electrical characteristics. When using semiconductor materials having different electrical characteristics, electrical characteristics of the transistor 200 and the transistor 400 can be different from each other.

Moreover, for example, when the oxide 430 is formed of a semiconductor having lower electron affinity than that of the oxide 230b, the threshold voltage of the transistor 400 can be higher than that of the transistor 200. Specifically, when each of the oxide 430 and the oxide 230b is an In-M-Zn oxide (an oxide containing In, an element M, and Zn) and when the oxide 430 has an atomic ratio of $x_1:y_1:z_1$ and the oxide 230b is has an atomic ratio of $x_2:y_2:z_2$, the oxide 430 and the oxide 230b in which $y_1/x_1$ is larger than $y_2/x_2$ may be used. The atomic ratio of a target that is used for forming the oxide 230b is preferably In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, In:M:Zn=4:2:4.1, In:M:Zn=4:2:3, In:M:Zn=5:1:7, or the like. In addition, the atomic ratio of a target that is used for forming the oxide 430 is preferably In:M:Zn=1:2:4, In:M:Zn=1:3:2, In:M:Zn=1:3:4, In:M:Zn=1:3:6, In:M:Zn=1:3:8, In:M:Zn=1:4:3, In:M:Zn=1:4:4, In:M:Zn=1:4:5, In:M:Zn=1:4:6, In:M:Zn=1:6:3, In:M:Zn=1:6:4, In:M:Zn=1:6:5, In:M:Zn=1:6:6, In:M:Zn=1:6:7, In:M:Zn=1:6:8, In:M:Zn=1:6:9, In:M:Zn=1:10:1, or the like. However, not limited to this, the atomic ratios of the oxide 430 and the oxide 230b may be determined as appropriate within the range satisfying the above condition. With such In-M-Zn oxides, the transistor 400 can have higher $V_{th}$ than the transistor 200.

In addition, in the transistor 400, a channel formation region in the oxide 430 is in direct contact with the insulator 224 and the insulator 450, so that the transistor 400 is likely to be affected by interface scattering and the trap states. Thus, the transistor 400 can have lower field-effect mobility and carrier density. Furthermore, the transistor 400 can have higher $V_{th}$ than the transistor 200.

The oxide 430 preferably contains much excess oxygen and is preferably formed using an oxide formed under an oxygen atmosphere, for example. By using the oxide 430 formed using such an oxide for an active layer, the threshold voltage of the transistor 400 can be higher than 0 V, the off-state current can be reduced, and $I_{cut}$ can be noticeably reduced.

The insulator 450 preferably has the same structure as that of the insulator 250 and can function as a gate insulating layer. When the insulator 450 formed using such an insulator is formed in contact with the oxide 430, oxygen can be supplied to the oxide 430 effectively. Furthermore, the concentration of impurities such as water or hydrogen in the insulator 450 is preferably lowered as in the insulator 224.

The conductor 460 preferably has the same structure as that of the conductor 260. The conductors 460a, the conductor 460b, and the conductor 460c are provided over the insulator 450, the conductor 460a, and the conductor 460b, respectively. The insulator 450 and the conductor 460 each have a portion overlapping with the third region. In addition, end portions of the insulator 450, the conductor 460a, the conductor 460b, and the conductor 460c are substantially aligned. One of the conductor 403 and the conductor 460 can function as a gate electrode and the other can function as a back gate electrode.

The layer 470 preferably has the same structure as that of the layer 270. The layer 470 is formed over the conductor 460. Therefore, surrounding excess oxygen can be prevented from being used for oxidation of the conductor 460. The layer 470 and the oxide 430 extend beyond end portions of the conductor 460 and have regions where the layer 470 and the oxide 430 overlap with each other in the extending portions, and end portions of the layer 470 and the oxide 430 are substantially aligned.

Like the transistor 200, when the transistor 400 is positioned between the insulator 274 and the insulator 272 and the insulator 214 and the insulator 212, a large amount of oxygen can be contained in the insulator 224, the oxide 430, and the insulator 450 without diffusing outward. Furthermore, impurities such as water or hydrogen can be prevented from entering from an upper layer over the insulator 274 and a lower layer below the insulator 212, and thus the concentration of impurities in the insulator 224, the oxide 430, and the insulator 450 can be lowered.

In this manner, oxygen vacancies in the oxide 430 functioning as an active layer of the transistor 400 are reduced, and impurities such as water or hydrogen are reduced; accordingly, the threshold voltage of the transistor 400 can be higher than 0 V, the off-state current can be reduced, and $I_{cut}$ can be noticeably reduced. Moreover, the electrical characteristics of the transistor 400 are made stable, and the reliability can be improved.

With the structure in which the transistor 400 is used as a switching element so that the potential of the back gate of the transistor 200 can be retained, the off state of the transistor 200 can be maintained for a long time.

<Materials>
[Insulator]

The insulators 210, 216, 220, 224, 250, 450 and 280 may be formed, for example, with a single layer or a stack of layers of an insulating material containing boron, carbon, nitrogen, oxygen, fluorine, magnesium, aluminum, silicon, phosphorus, argon, gallium, germanium, yttrium, zirconium, lanthanum, neodymium, hafnium, or tantalum. The insulators 210, 216, 220, 224, 250, 450 and 280 may be formed, for example, with a single layer or a stack of layers of one or more materials selected from silicon oxide, silicon oxynitride, silicon nitride oxide, silicon nitride, aluminum nitride, aluminum oxide, aluminum nitride oxide, aluminum oxynitride, magnesium oxide, gallium oxide, germanium oxide, yttrium oxide, zirconium oxide, lanthanum oxide, neodymium oxide, hafnium oxide, tantalum oxide, aluminum silicate, and the like. Alternatively, a material in which two or more materials selected from an oxide material, a nitride material, an oxynitride material, and a nitride oxide material are mixed may be used.

Note that in this specification, a nitride oxide refers to a compound that includes more nitrogen than oxygen. An oxynitride refers to a compound that includes more oxygen than nitrogen. The content of each element can be measured by, for example, Rutherford backscattering spectrometry (RBS) or the like.

The insulators 212, 214, 222, 272, 274, 282, and 284 are preferably formed using an insulating material which is less likely to transmit impurities such as water or hydrogen than the insulators 224, 250, 450, and 280. Examples of such an insulating material which is less likely to transmit impurities include aluminum oxide, aluminum nitride, aluminum oxynitride, aluminum nitride oxide, gallium oxide, germanium oxide, yttrium oxide, zirconium oxide, lanthanum oxide, neodymium oxide, hafnium oxide, tantalum oxide, and silicon nitride. A single layer or a stack of any of these materials may be used.

When an insulating material which is less likely to transmit impurities is used for the insulators 212, 214, and 222, impurity diffusion from the substrate side into the transistor can be inhibited, and the reliability of the transistor can be improved. In addition, when an insulating material which is less likely to transmit impurities is used for the insulators 272, 274, 282, and 284, impurity diffusion from layers above the insulator 280 into the transistor can be inhibited, and the reliability of the transistor can be improved.

A plurality of insulating layers formed using any of the above-described materials may be stacked as each of the insulators 212, 214, 272, 282, and 284. One of the insulator 212 and the insulator 214 may be omitted. Moreover, one of the insulator 282 and the insulator 284 may be omitted.

An insulating material which is less likely to transmit impurities herein refers to a material having a high oxidation resistance and a function of inhibiting the diffusion of oxygen and impurities typified by hydrogen or water.

For example, the diffusion length of oxygen or hydrogen in aluminum oxide per hour under an atmosphere at 350° C. or 400° C. is much less than that in silicon oxide. Thus, it can be said that aluminum oxide is less likely to transmit impurities.

As an example of an insulating material which is less likely to transmit impurities, silicon nitride formed by a CVD method can be used. Here, diffusion of hydrogen into a semiconductor element including an oxide semiconductor, such as the transistor 200, degrades the characteristics of the semiconductor element in some cases. Therefore, the transistor 200 is preferably sealed with a film that inhibits hydrogen diffusion. Specifically, the film that inhibits hydrogen diffusion is a film from which hydrogen is less likely to be released.

The released amount of hydrogen can be measured by TDS, for example. The amount of hydrogen released from the insulator 212 that is converted into hydrogen molecules per unit area of the insulator 212 is less than or equal to $2 \times 10^{15}$ molecules/cm$^2$, preferably less than or equal to $1 \times 10^{15}$ molecules/cm$^2$, more preferably less than or equal to $5 \times 10^{14}$ molecules/cm$^2$ in TDS analysis in the range from 50° C. to 500° C., for example.

Moreover, in particular, the dielectric constant of the insulators 216, 224, and 280 is preferably low. For example, the relative dielectric constant of the insulators 216, 224, and 280 is preferably lower than 3, further preferably lower than 2.4, still further preferably lower than 1.8. In the case where a material with a low dielectric constant is used as an interlayer film, the parasitic capacitance between wirings can be reduced. Furthermore, the insulators 216, 224, and 280 are preferably formed using an insulating material which is less likely to transmit impurities.

When an oxide semiconductor is used for the oxide 230, the hydrogen concentration in the insulator is preferably lowered in order to prevent an increase in the hydrogen concentration in the oxide 230. Specifically, the hydrogen concentration in the insulator, which is measured by SIMS, is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. It is particularly preferable to lower the hydrogen concentration of the insulators 216, 224 250, 450, and 280. It is preferable to lower the hydrogen concentration of at least the insulators 224, 250, and 450 which are in contact with the oxide 230 or the oxide 430.

Furthermore, the nitrogen concentration in the insulator is preferably low in order to prevent an increase in the nitrogen concentration in the oxide 230. Specifically, the nitrogen concentration in the insulator, which is measured by SIMS, is lower than or equal to $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

It is preferable that a region of the insulator 224 which is in contact with at least the oxide 230 and a region of the insulator 250 which is in contact with at least the oxide 230 have few defects and typically have as few signals observed by electron spin resonance (ESR) spectroscopy as possible. Examples of the signals include a signal due to an E' center observed at a g-factor of 2.001. Note that the E' center is due to the dangling bond of silicon. In the case where a silicon oxide layer or a silicon oxynitride layer is used as the insulators 224 and 250, a silicon oxide layer or a silicon oxynitride layer whose spin density due to the E' center is lower than or equal to $3\times10^{17}$ spins/cm$^3$, preferably lower than or equal to $5\times10^{16}$ spins/cm$^3$ may be used.

In addition to the above-described signal, a signal due to nitrogen dioxide (NO$_2$) might be observed. The signal is divided into three signals according to the N nuclear spin; a first signal, a second signal, and a third signal. The first signal is observed at a g-factor of greater than or equal to 2.037 and less than or equal to 2.039. The second signal is observed at a g-factor of greater than or equal to 2.001 and less than or equal to 2.003. The third signal is observed at a g-factor of greater than or equal to 1.964 and less than or equal to 1.966.

It is suitable to use an insulating layer whose spin density due to nitrogen dioxide (NO$_2$) is higher than or equal to $1\times10^{17}$ spins/cm$^3$ and lower than $1\times10^{18}$ spins/cm$^3$ as the insulators 224 and 250, for example.

Note that nitrogen oxide (NO$_x$) such as nitrogen dioxide (NO$_2$) forms a state in the insulating layer. The level is positioned in the energy gap of the oxide semiconductor. Thus, when nitrogen oxide (NO$_x$) diffuses to the interface between the insulating layer and the oxide semiconductor, an electron can potentially be trapped by the level on the insulating layer side. As a result, the trapped electrons remain in the vicinity of the interface between the insulating layer and the oxide semiconductor; thus, the threshold voltage of the transistor is shifted in the positive direction. Therefore, a shift in the threshold voltage of the transistor can be reduced when a film with a low nitrogen oxide content is used as the insulators 224 and 250.

As an insulating layer that releases little nitrogen oxide (NO$_x$), for example, a silicon oxynitride layer can be used. The silicon oxynitride layer is a film of which the amount of released ammonia is larger than the amount of released nitrogen oxide (NO$_x$) in TDS; the typical amount of released ammonia is greater than or equal to $1\times10^{18}$/cm$^3$ and less than or equal to $5\times10^{19}$/cm$^3$. Note that the released amount of ammonia is the total amount of ammonia released by heat treatment in a range from 50° C. to 650° C. or a range from 50° C. to 550° C. in TDS.

Since nitrogen oxide (NO$_x$) reacts with ammonia and oxygen in heat treatment, the use of an insulating film that releases a large amount of ammonia reduces nitrogen oxide (NO$_x$).

At least one of the insulators 216, 224, 250, and 450 is preferably formed using an insulating layer from which oxygen is released by heating. Specifically, it is preferable to use an insulator with the following characteristics: the amount of oxygen that is released from the insulator in TDS (the film-surface temperature in the heat treatment is higher than or equal to 50° C. and lower than or equal to 700°, preferably higher than or equal to 100° C. and lower than or equal to 500° C.) and converted into oxygen atoms is $1.0\times10^{18}$ atoms/cm$^3$ or more, preferably $3.0\times10^{20}$ atoms/cm$^3$ or more.

The insulating layer containing excess oxygen can also be formed by performing treatment for adding oxygen to an insulating layer. The treatment for adding oxygen can be performed by heat treatment under an oxygen atmosphere, an ion implantation method, an ion doping method, a plasma immersion ion implantation method, plasma treatment, or the like. The plasma treatment containing oxygen is preferably performed using an apparatus including a power source for generating high-density plasma using microwaves, for example. Alternatively, a power source for applying a radio frequency (RF) to a substrate side may be provided. The use of high-density plasma enables high-density oxygen radicals to be produced, and application of the RF voltage to the substrate side allows oxygen radicals generated by the high-density plasma to be efficiently introduced into a film to be processed. Alternatively, after plasma treatment using an inert gas with the apparatus, plasma treatment using oxygen in order to compensate released oxygen may be performed. As a gas for adding oxygen, an oxygen gas of $^{16}O_2$, $^{18}O_2$, or the like, a nitrous oxide gas, an ozone gas, or the like can be used. In this specification, the treatment for adding oxygen is also referred to as "oxygen doping treatment".

In addition, by oxygen doping treatment, the crystallinity of the semiconductor can be improved, and impurities such as water or hydrogen can be removed, in some cases. That is, oxygen doping treatment can also be referred to as impurity removal treatment. In particular, when plasma treatment using oxygen is performed as oxygen doping treatment under a reduced pressure, the bond of hydrogen and the bond of water in the insulator to be processed or the oxide to be processed are cut; therefore, hydrogen and water are easily released. Accordingly, heating treatment is preferably performed in or after the plasma treatment. Moreover, when the heating treatment is performed twice before and after the plasma treatment, the concentration of impurities in a film to be processed can be reduced.

There is no particular limitation on the method for forming the insulator; depending on a material thereof, any of the following methods may be used: a sputtering method, an SOG method, spin coating, dipping, spray coating, a droplet discharging method (e.g., an ink-jet method), a printing method (e.g., screen printing or offset printing), or the like.

Any of the above insulating layers may be used as the layer 245a, the layer 245b, the layer 270, and the layer 470. In the case where each of the layer 245a, the layer 245b, and the layer 270 is an insulating layer, an insulating layer which is less likely to release oxygen and/or which is less likely to absorb oxygen is preferably used.

[Oxide]

The oxide 230 and the oxide 430 according to the present invention is described below.

The oxide preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained.

Here, InMZnO in which an oxide contains indium, an element M, and zinc is considered. Note that the element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

<Structure>

An oxide is classified into a single crystal oxide and the other, a non-single-crystal oxide. Examples of a non-single-crystal oxide include a c-axis-aligned crystalline oxide semiconductor (CAAC-OS), a polycrystalline oxide, a nanocrystalline oxide (nc-OS), an amorphous-like oxide (a-like OS), and an amorphous oxide.

The CAAC-OS has c-axis alignment, its nanocrystals are connected in the a-b plane direction, and its crystal structure has distortion. Note that the distortion is a portion where the direction of a lattice arrangement changes between a region with a regular lattice arrangement and another region with a regular lattice arrangement in a region in which nanocrystals are connected.

The shape of the nanocrystal is basically hexagon. However, the shape is not always a regular hexagon and is a non-regular hexagon in some cases. A pentagonal lattice arrangement, a heptagonal lattice arrangement, and the like are included in the distortion in some cases. Note that a clear crystal grain boundary cannot be observed even in the vicinity of distortion in the CAAC-OS. That is, formation of a grain boundary is inhibited due to the distortion of lattice arrangement. This is probably because the CAAC-OS can tolerate distortion owing to a low density of arrangement of oxygen atoms in an a-b plane direction, an interatomic bond distance changed by substitution of a metal element, and the like.

The CAAC-OS tends to have a layered crystal structure (also referred to as a stacked-layer structure) in which a layer containing indium and oxygen (hereinafter, In layer) and a layer containing the elementM, zinc, and oxygen (hereinafter, (M,Zn) layer) are stacked. When the element M in the (M,Zn) layer is replaced with indium, the layer can also be referred to as an (In,M,Zn) layer. Also, when indium in the In layer is replaced with the elementM, the layer can be referred to as an (In,M) layer.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, the nc-OS cannot be distinguished from an a-like OS or an amorphous oxide, depending on an analysis method.

An a-like OS has a structure between those of the nc-OS and the amorphous oxide. The a-like OS includes a void or a low-density region. That is, the a-like OS has low crystallinity as compared with the nc-OS and the CAAC-OS.

An oxide has various structures which show various different properties. Two or more of the amorphous oxide, the polycrystalline oxide, the a-like OS, the nc-OS, and the CAAC-OS may be included in an oxide of one embodiment of the present invention.

<Atomic Ratio>

Next, preferred ranges of atomic ratios of indium to the element M and zinc in the oxide of one embodiment of the present invention are described with reference to FIGS. 25A to 25C. Note that the proportion of oxygen atoms is not shown in FIGS. 25A to 25C. The terms of the atomic ratio of indium, the element M, and zinc contained in the oxide are denoted by [In], [M], and [Zn], respectively.

Figure 25A:
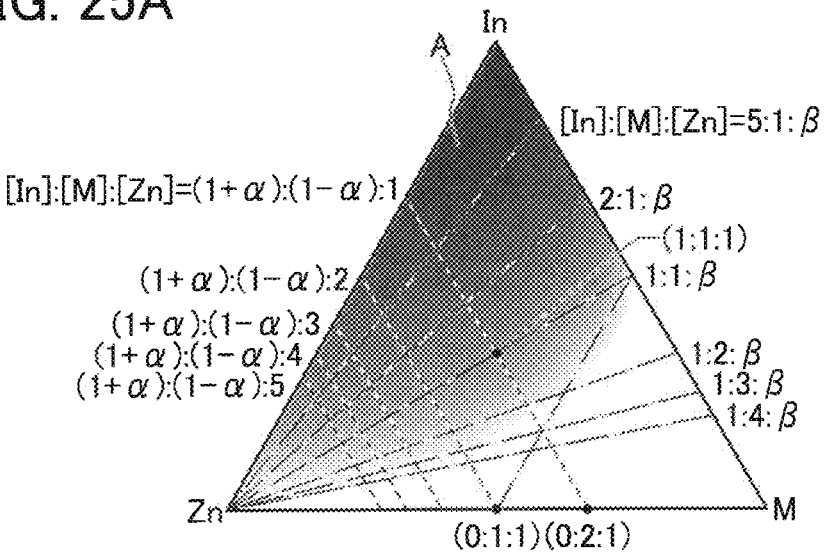
FIGS. 25A to 25C each illustrate an atomic ratio range of an oxide of the present invention.
Figure 25B:
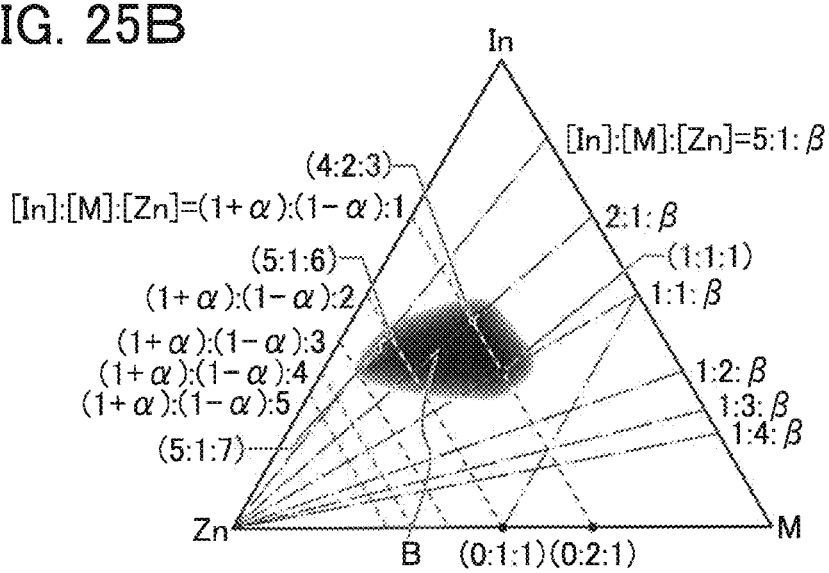
Figure 25C:
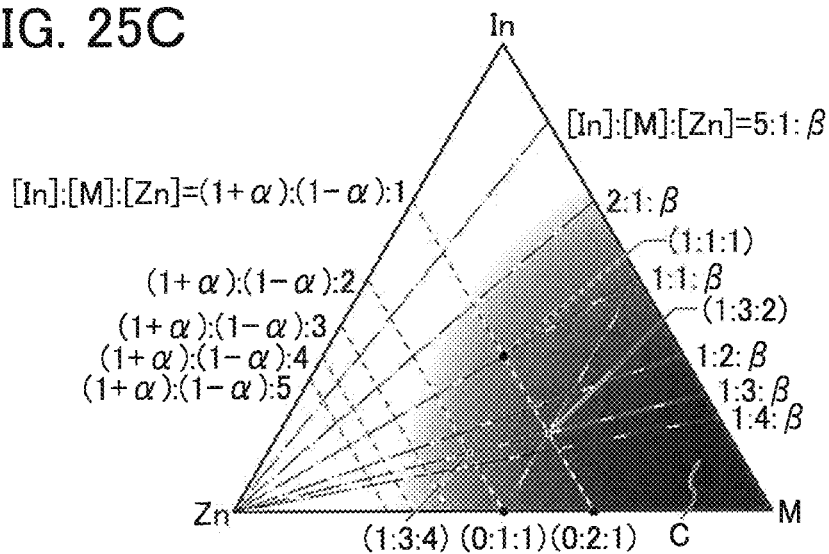

In FIGS. 25A to 25C, broken lines indicate a line where the atomic ratio [In]:[M]:[Zn] is $(1+\alpha):(1-\alpha):1$, where $-1 \leq \alpha \leq 1$, a line where the atomic ratio [In]:[M]:[Zn] is $(1+a):(1-\alpha):2$, a line where the atomic ratio [In]:[M]:[Zn] is $(1+a):(1-\alpha):3$, a line where the atomic ratio [In]:[M]:[Zn] is $(1+\alpha):(1-\alpha):4$, and a line where the atomic ratio [In]:[M]:[Zn] is $(1+a):(1-\alpha):5$.

Dashed-dotted lines indicate a line where the atomic ratio [In]:[M]:[Zn] is $5:1:\beta$ ($\beta \geq 0$), a line where the atomic ratio [In]:[M]:[Zn] is $2:1:\beta$, a line where the atomic ratio [In]:[M]:[Zn] is $1:1:\beta$, a line where the atomic ratio [In]:[M]:[Zn] is $1:2:\beta$, a line where the atomic ratio [In]:[M]:[Zn] is $1:3:\beta$, and a line where the atomic ratio [In]:[M]:[Zn] is $1:4:\beta$.

Dashed-double-dotted lines indicate a line where the atomic ratio [In]:[M]:[Zn] is $(1+\gamma): 2:(1-\gamma)$, where $-1 \leq \gamma \leq 1$. The oxides shown in FIGS. 25A to 25C with an atomic ratio of [In]:[M]:[Zn]=0:2:1 and its vicinity are likely to have a spinel crystal structure.

A plurality of phases (e.g., two phases or three phases) exist in the oxide in some cases. For example, with an atomic ratio of [In]:[M]:[Zn]=0:2:1 and its vicinity, two phases of a spinel crystal structure and a layered crystal structure are likely to exist. In addition, with an atomic ratio of [In]:[M]:[Zn]=1:0:0 and its vicinity, two phases of a bixbyite crystal structure and a layered crystal structure are likely to exist. In the case where a plurality of phases exists in the oxide, a grain boundary might be formed between different crystal structures.

A region A in FIG. 25A shows an example of the preferred ranges of the atomic ratio of indium, the element M, and zinc contained in an oxide.

The oxide containing indium in a higher proportion can have high carrier mobility (electron mobility). Therefore, an oxide having a high content of indium has higher carrier mobility than that of an oxide having a low content of indium.

In contrast, carrier mobility decreases as the indium content and the zinc content in an oxide become lower. Thus, with an atomic ratio of [In]:[M]:[Zn]=0:1:0 and its vicinity (e.g., a region C in FIG. 25C), insulation performance becomes better.

Accordingly, an oxide of one embodiment of the present invention preferably has an atomic ratio represented by a region A in FIG. 25A. With the atomic ratio, a layered structure with high carrier mobility and a few grain boundaries is easily obtained.

In the region A, in particular a region B in FIG. 25B, an excellent oxide which easily becomes a CAAC-OS and has high carrier mobility can be obtained.

The CAAC-OS is an oxide with high crystallinity. In contrast, in the CAAC-OS, a reduction in electron mobility due to the grain boundary is less likely to occur because a clear grain boundary cannot be observed. Entry of impurities, formation of defects, or the like might decrease the crystallinity of an oxide. This means that the CAAC-OS has small amounts of impurities and defects (e.g., oxygen vacancies). Thus, an oxide including a CAAC-OS is physically stable. Therefore, the oxide including a CAAC-OS is resistant to heat and has high reliability.

Note that the region B includes an atomic ratio of [In]:[M]:[Zn]=4:2:3 to 4:1 and its vicinity. The vicinity includes an atomic ratio of [In]:[M]:[Zn]=5:3:4. Note that the region B includes an atomic ratio of [In]:[M]:[Zn]=5:1:6 and its vicinity and an atomic ratio of [In]:[M]:[Zn]=5:1:7 and its vicinity.

Note that the property of an oxide is not uniquely determined by an atomic ratio. Even with the same atomic ratio, the property of an oxide might be different depending on a formation condition. For example, in the case where the oxide is deposited with a sputtering apparatus, a film having an atomic ratio deviated from the atomic ratio of a target is formed. In particular, [Zn] in the film might be smaller than [Zn] in the target depending on the substrate temperature in deposition. Thus, the illustrated regions each represent an atomic ratio with which an oxide tends to have specific characteristics, and boundaries of the regions A to C are not clear.

[Transistor Including Oxide]

Next, the case where the oxide is used for a transistor is described.

Note that when the oxide is used for a transistor, carrier scattering or the like at a grain boundary can be reduced; thus, the transistor can have high field-effect mobility. In addition, the transistor can have high reliability.

An oxide with a low carrier density is preferably used for the transistor. In order to reduce the carrier density of the oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. For example, an oxide whose carrier density is lower than $8 \times 10^{11}$ cm$^{-3}$, preferably lower than $1 \times 10^{11}$ cm$^{-3}$, more preferably lower than $1 \times 10^{10}$ cm$^{-3}$, and greater than or equal to $1 \times 10^{-9}$ cm$^3$ is used.

The highly purified intrinsic or substantially highly purified intrinsic oxide has a low density of defect states and accordingly has a low density of trap states in some cases.

Charge trapped by the trap states in the oxide takes a long time to be released and may behave like fixed charge. Thus, a transistor whose channel region is formed in an oxide having a high density of trap states has unstable electrical characteristics in some cases.

In order to obtain stable electrical characteristics of the transistor, it is effective to reduce the concentration of impurities in the oxide. In addition, in order to reduce the concentration of impurities in the oxide, the concentration of impurities in a film that is adjacent to the oxide is preferably reduced. Examples of impurities include hydrogen, nitrogen, an alkali metal, an alkaline earth metal, iron, nickel, and silicon.

<Impurities>

Here, the influence of impurities in the oxide is described.

When silicon or carbon that is one of Group 14 elements is contained in the oxide, defect states are formed. Thus, the concentration of silicon or carbon in the oxide and around an interface with the oxide (measured by secondary ion mass spectrometry (SIMS)) is set lower than or equal to $2 \times 10^{18}$ atoms/cm$^3$, preferably lower than or equal to $2 \times 10^{17}$ atoms/cm$^3$.

When the oxide contains an alkali metal or an alkaline earth metal, defect states are formed and carriers are generated, in some cases. Thus, a transistor including an oxide that contains an alkali metal or an alkaline earth metal is likely to be normally-on. Therefore, it is preferable to reduce the concentration of an alkali metal or an alkaline earth metal in the oxide. Specifically, the concentration of an alkali metal or an alkaline earth metal in the oxide measured by SIMS is set lower than or equal to $1 \times 10^{18}$ atoms/cm$^3$, preferably lower than or equal to $2 \times 10^{16}$ atoms/cm$^3$.

When the oxide contains nitrogen, the oxide easily becomes n-type by generation of electrons serving as carriers and an increase of carrier density. Thus, a transistor whose semiconductor includes an oxide that contains nitrogen is likely to be normally-on. For this reason, nitrogen in the oxide is preferably reduced as much as possible; for example, the concentration of nitrogen in the oxide, which is measured by SIMS, can be lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, and still further preferably lower than or equal to $5 \times 10^{17}$ atoms/cm$^3$.

Hydrogen contained in an oxide reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide that contains hydrogen is likely to be normally-on. Accordingly, it is preferable that hydrogen in the oxide be reduced as much as possible. Specifically, the hydrogen concentration of the oxide measured by SIMS is set lower than $1 \times 10^{20}$ atoms/cm$^3$, preferably lower than $1 \times 10^{19}$ atoms/cm$^3$, further preferably lower than $5 \times 10^{18}$ atoms/cm$^3$, and still further preferably lower than $1 \times 10^{18}$ atoms/cm$^3$.

When an oxide with sufficiently reduced impurity concentration is used for a channel formation region in a transistor, the transistor can have stable electrical characteristics.

Figure 26A:
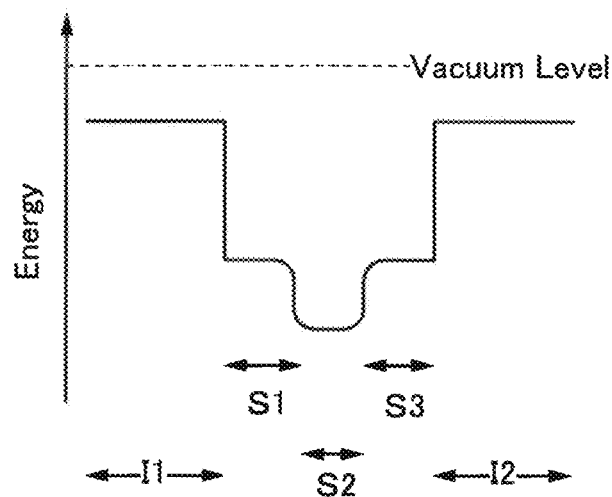
FIGS. 26A to 26C are each a band diagram of a stacked-layer structure of an oxide.
Figure 26B:
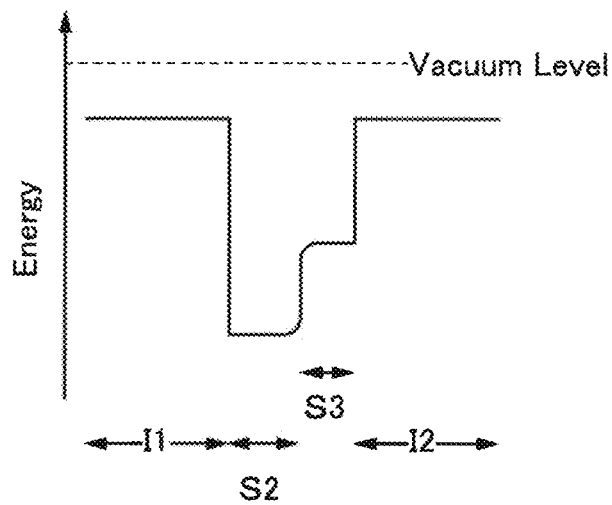
Figure 26C:
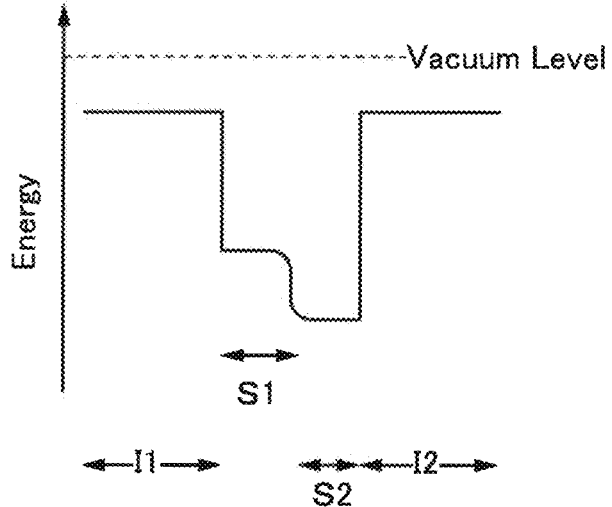

Next, the case where the oxide has a two-layer structure or a three-layer structure will be described. With reference to FIGS. 26A to 26C, the description is made on a band diagram of a layered structure of an oxide S1, an oxide S2, and an oxide S3 and insulators that are in contact with the layered structure of the oxide S1, the oxide S2, and the oxide S3; a band diagram of a layered structure of the oxide S1 and the oxide S2 and insulators that are in contact with the layered structure of the oxide S1 and the oxide S2; and a band diagram of a layered structure of the oxide S2 and the oxide S3 and insulators that are in contact with the layered structure of the oxide S2 and the oxide S3.

FIG. 26A is an example of a band diagram of a layered structure including an insulator I1, the oxide S1, the oxide S2, the oxide S3, and an insulator I2 in the thickness direction. FIG. 26B is an example of a band diagram of a layered structure including the insulator I1, the oxide S2, the oxide S3, and the insulator I2 in the thickness direction. FIG. 26C is an example of a band diagram of a layered structure including the insulator I1, the oxide S1, the oxide S2, and the insulator I2 in the thickness direction. Note that for easy understanding, the band diagrams show the energy level of the conduction band minimum (Ec) of each of the insulator I1, the oxide S1, the oxide S2, the oxide S3, and the insulator I2.

The energy level of the conduction band minimum of each of the oxides S1 and S3 is closer to the vacuum level than that of the oxide S2. Typically, a difference in the energy level of the conduction band minimum between the oxide S2 and each of the oxides S1 and S3 is preferably greater than or equal to 0.15 eV or greater than or equal to 0.5 eV, and less than or equal to 2 eV or less than or equal to 1 eV. That is, it is preferable that the electron affinity of the oxide S2 be higher than the electron affinity of each of the oxides S1 and S3, and the difference between the electron affinity of each of the oxides S1 and S3 and the electron affinity of the oxide S2 be greater than or equal to 0.15 eV or greater than or equal to 0.5 eV, and less than or equal to 2 eV or less than or equal to 1 eV.

As illustrated in FIGS. 26A to 26C, the energy level of the conduction band minimum of each of the oxides S1 to S3 is gradually varied. In other words, the energy level of the conduction band minimum is continuously varied or continuous junction is formed. To obtain such a band diagram, the density of defect states in a mixed layer formed at an interface between the oxides S1 and S2 or an interface between the oxides S2 and S3 is preferably made low.

Specifically, when the oxides S1 and S2 or the oxides S2 and S3 contain the same element (as a main component) in addition to oxygen, a mixed layer with a low density of defect states can be formed. For example, when the oxide S2 is an In—Ga—Zn oxide, it is preferable to use an In—Ga—Zn oxide, a Ga—Zn oxide, gallium oxide, or the like as the oxides S1 and S3.

At this time, the oxide S2 serves as a main carrier path. Since the density of defect states at the interface between the oxides S1 and S2 and the interface between the oxides S2 and S3 can be made low, the influence of interface scattering on carrier conduction is small, and a large on-state current can be obtained.

When an electron is trapped by a trap state, the trapped electron behaves like fixed charge; thus, the threshold voltage of a transistor is shifted in the positive direction. The oxides S1 and S3 can make the trap state apart from the oxide S2. This structure can prevent the positive shift of the threshold voltage of the transistor.

A material whose conductivity is sufficiently lower than that of the oxide S2 is used for the oxides S1 and S3. Accordingly, the oxide S2, the interface between the oxides S1 and S2, and the interface between the oxides S2 and S3 mainly function as a channel region. For example, an oxide with high insulation performance and the atomic ratio represented by the region C in FIG. 25C can be used as the oxides S1 and S3. Note that the region C in FIG. 25C represents the atomic ratio [In]:[M]:[Zn] of 0:1:0 or around 0:1:0, [In]:[M]:[Zn] of 1:3:2 or around 1:3:2, [In]:[M]:[Zn] of 1:3:4 or around 1:3:4.

In the case where an oxide with the atomic ratio represented by the region A is used as the oxide S2, it is particularly preferable to use an oxide with an atomic ratio where [M]/[In] is greater than or equal to 1, preferably greater than or equal to 2 as each of the oxides S1 and S3. In addition, it is suitable to use an oxide with sufficiently high insulation performance and an atomic ratio where [M]/([Zn]+[In]) is greater than or equal to 1 as the oxide S3.

In this specification and the like, a transistor in which an oxide semiconductor is used for a semiconductor where a channel is formed is also referred to as an "OS transistor". In this specification and the like, a transistor in which silicon having crystallinity is used for a semiconductor where a channel is formed is also referred to as a "crystalline Si transistor".

The crystalline Si transistor tends to obtain relatively high mobility as compared to the OS transistor. On the other hand, the crystalline Si transistor has difficulty in obtaining extremely small off-state current unlike the OS transistor. Thus, it is important that the semiconductor material used for the semiconductor be selected depending on the purpose and the usage. For example, depending on the purpose and the usage, the OS transistor and the crystalline Si transistor may be used in combination.

An indium gallium oxide has a low electron affinity and a high oxygen-blocking property. Therefore, the oxide 230c preferably includes an indium gallium oxide. The gallium atomic ratio [Ga/(In+Ga)] is, for example, higher than or equal to 70%, preferably higher than or equal to 80%, more preferably higher than or equal to 90%.

Note that the oxides 230a and 230c may be gallium oxide. For example, when gallium oxide is used for the oxide 230c, a leakage current generated between the conductor 205 and the oxide 230 can be reduced. In other words, the off-state current of the transistor 200 can be reduced.

At this time, when a gate voltage is applied, a channel is formed in the oxide 230b having the highest electron affinity among the oxides 230a to 230c.

In order to give stable electrical characteristics and favorable reliability to the transistor including the oxide semiconductor layer, it is preferable that impurities and oxygen vacancies in the oxide semiconductor layer be reduced to highly purify the oxide semiconductor layer so that at least the oxide 230b can be regarded as an intrinsic or substantially intrinsic oxide semiconductor layer. Furthermore, it is preferable that at least the channel formation region of the oxide 230b be regarded as an intrinsic or substantially intrinsic semiconductor layer.

The layer 245a, the layer 245b, the layer 270, and the layer 470 may be formed using a material and a method which are similar to those of the oxide 230 or the oxide 430. In the case where the layer 245a, the layer 245b, the layer 270, and the layer 470 are formed using an oxide semiconductor, an oxide semiconductor which is less likely to release oxygen or which is less likely to absorb oxygen is preferably used.

[Conductor]

As a conductive material for forming the conductor 205, the conductor 207, the conductor 403, the conductor 405, the conductor 407, the conductor 240, the conductor 260, and the conductor 460, a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and the like can be used. Alternatively, a semiconductor having a high electric conductivity typified by polycrystalline silicon including an impurity element such as phosphorus, or a silicide such as nickel silicide may be used.

A conductive material containing the above metal element and oxygen may be used. A conductive material containing the above metal element and nitrogen may be used. For example, a conductive material containing nitrogen such as titanium nitride or tantalum nitride may be used.

A stack of a plurality of conductive layers formed with the above materials may be used. For example, a layered structure formed using a combination of a material including any of the metal elements listed above and a conductive material including oxygen may be used. Alternatively, a layered structure formed using a combination of a material including any of the metal elements listed above and a conductive material including nitrogen may be used. Alternatively, a layered structure formed using a combination of a material including any of the metal elements listed above, a conductive material including oxygen, and a conductive material including nitrogen may be used.

Note that the conductor 205b, the conductor 207b, the conductor 403b, the conductor 405b, and the conductor 407b can be formed using, for example, a conductive material such as tungsten or polysilicon. The conductor 205a, the conductor 207a, the conductor 403a, the conductor 405a, and the conductor 407a, which are in contact with the insulator 212 and the insulator 214, can have a single-layer structure or a stacked-layer structure including a barrier layer (a diffusion prevention layer) such as a titanium layer, a titanium nitride layer, a tantalum nitride layer, or the like.

An insulating material which is less likely to transmit impurities is used for the insulator 212 and the insulator 214. A conductive material which is less likely to transmit impurities is used for the conductor 205a, the conductor 207a, the conductor 403a, the conductor 405a, and the conductor 407a, which are in contact with the insulator 212 and the insulator 214. This can further inhibit diffusion of impurities into the transistor 200 and the transistor 400. Thus, the reliability of the transistor 200 and the transistor 400 can be further increased.

Any of the above conductive materials may be used for the layer 245a and the layer 245b. In the case where the layer 245a and the layer 245b are formed using a conductive material, a conductive material which is less likely to release oxygen and/or which is less likely to absorb oxygen is preferably used.

[Substrate]

There is no particular limitation on a material used as the substrate as long as the material has heat resistance high enough to withstand at least heat treatment performed later. For example, a single crystal semiconductor substrate or a polycrystalline semiconductor substrate made of silicon, silicon carbide, or the like or a compound semiconductor substrate made of silicon germanium or the like can be used. Alternatively, an SOI substrate, a semiconductor substrate on which a semiconductor element such as a strained transistor or a FIN-type transistor is provided, or the like can also be used. Alternatively, gallium arsenide, aluminum gallium arsenide, indium gallium arsenide, gallium nitride, indium phosphide, silicon germanium, or the like that can be used for a high-electron-mobility transistor (HEMT) may be used. In other words, the substrate is not limited to a simple supporting substrate, and may be a substrate where a device such as a transistor is formed. In this case, at least one of the gate, the source, and the drain of the transistor 200 or the transistor 400 may be electrically connected to the device.

For another example, a glass substrate of barium borosilicate glass, aluminoborosilicate glass, or the like, a ceramic substrate, a quartz substrate, or a sapphire substrate can be used. Note that a flexible substrate may be used. In the case where a flexible substrate is used, the transistor, a capacitor, or the like may be directly formed over the flexible substrate; or the transistor, the capacitor, or the like may be formed over a manufacturing substrate and then separated from the manufacturing substrate and transferred onto the flexible substrate. To separate and transfer the transistor, the capacitor, or the like from the manufacturing substrate to the flexible substrate, a separation layer may be provided between the manufacturing substrate and the transistor, the capacitor, or the like.

For the flexible substrate, for example, metal, an alloy, resin, glass, or fiber thereof can be used. The flexible substrate used as the substrate preferably has a lower coefficient of linear expansion because a lower coefficient of linear expansion suppresses deformation due to an environment. The flexible substrate used as the substrate is formed using, for example, a material whose coefficient of linear expansion is lower than or equal to $1 \times 10^{-3}$/K, lower than or equal to $5 \times 10^{-5}$/K, or lower than or equal to $1 \times 10^{-5}$/K. Examples of the resin include polyester, polyolefin, polyamide (e.g., nylon or aramid), polyimide, polycarbonate, and acrylic. In particular, aramid is preferably used for the flexible substrate because of its low coefficient of linear expansion.

<Example of Manufacturing Method of Semiconductor Device 1000>

Figure 2:
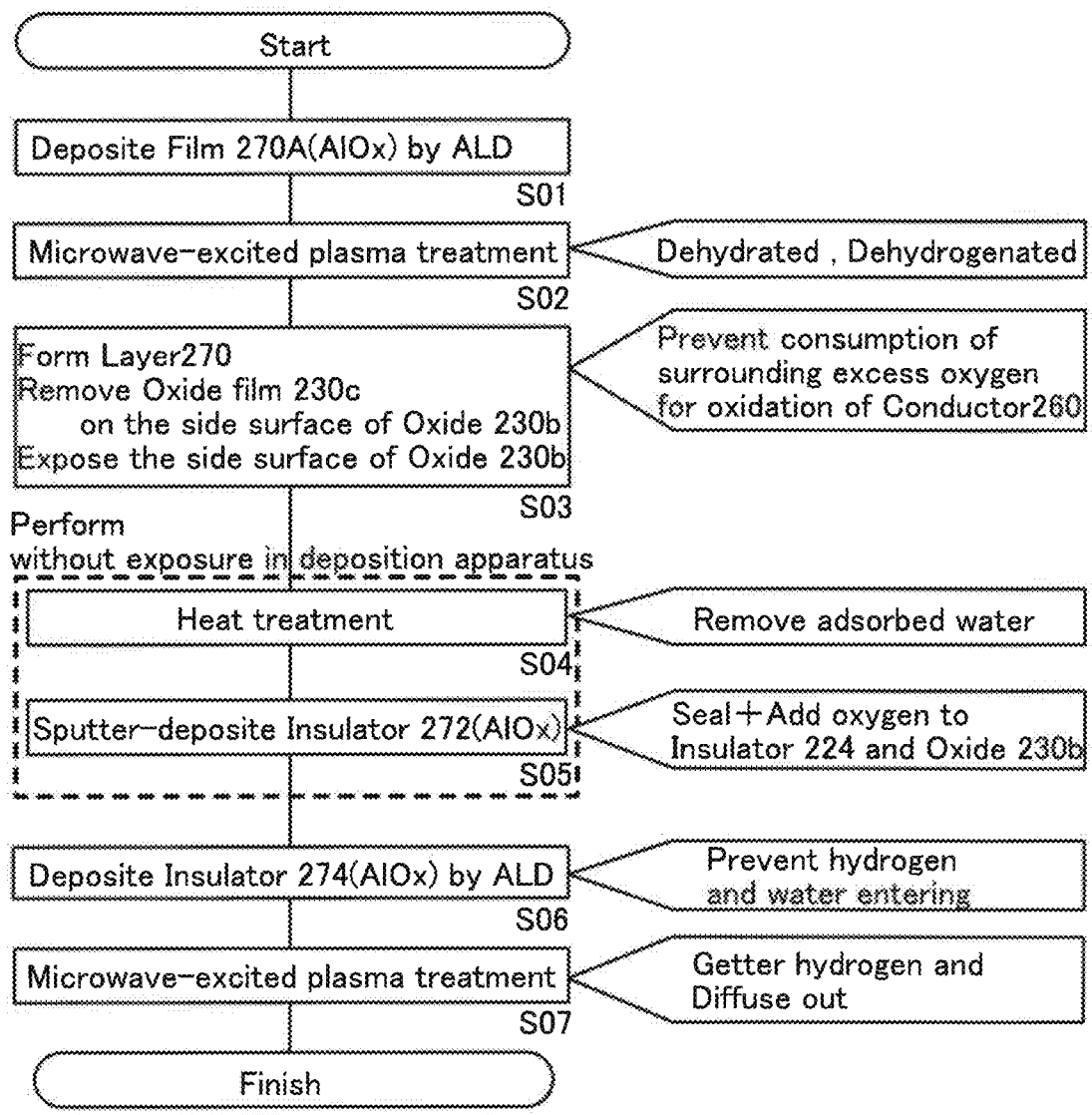
FIG. 2 is a flow chart showing a method for manufacturing a semiconductor device of one embodiment of the present invention.
Figure 6A:
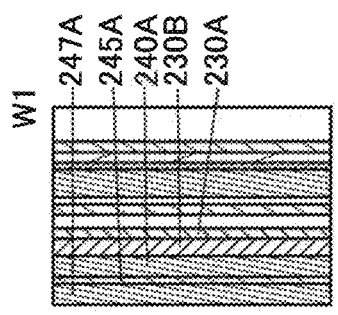
FIGS. 6A to 6E illustrate a method for manufacturing a transistor of one embodiment of the present invention.
Figure 6C:
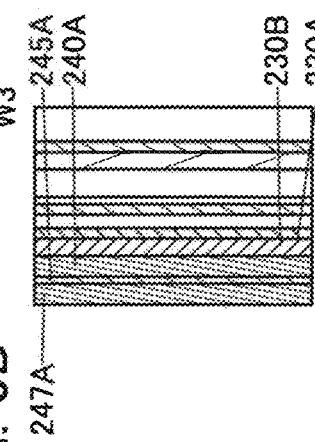
Figure 6E:
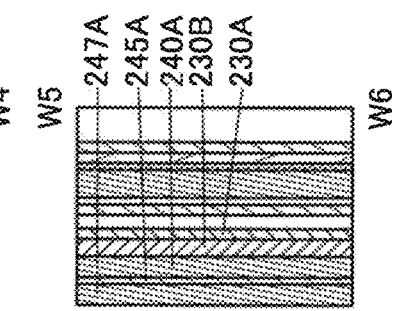
Figure 6B:
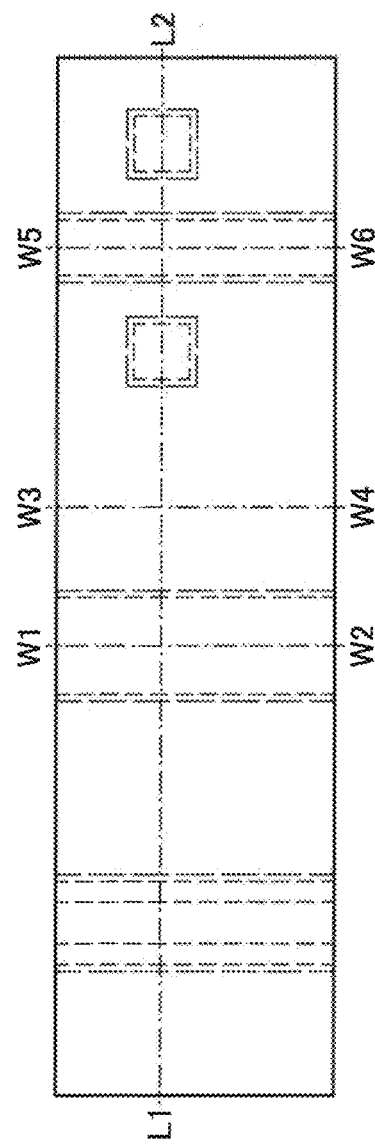
Figure 6D:
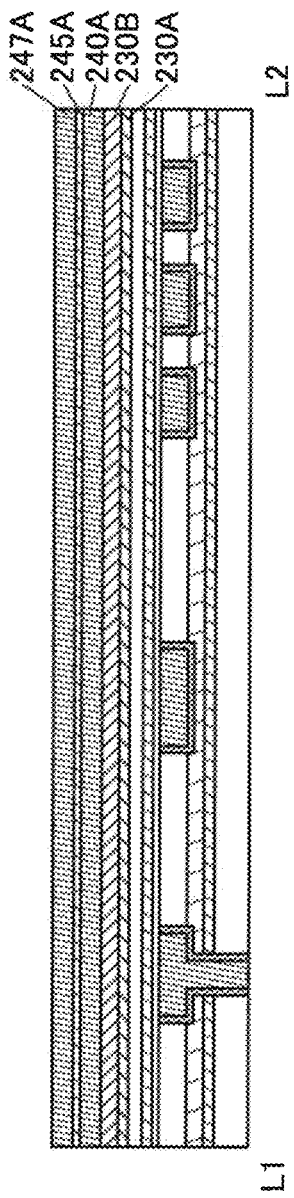
Figure 8C:
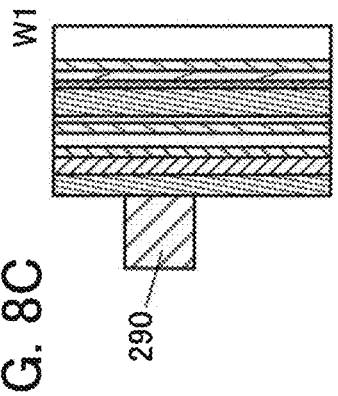
FIGS. 8A to 8E illustrate a method for manufacturing a transistor of one embodiment of the present invention.
Figure 8D:
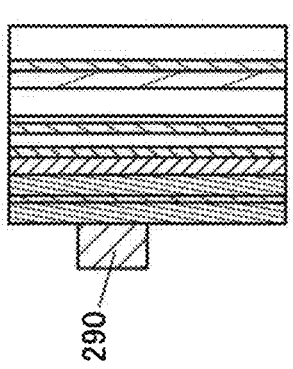
Figure 8E:
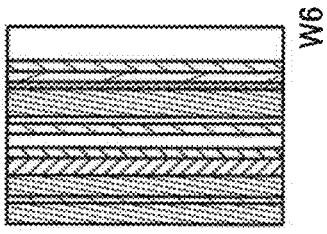
Figure 8A:
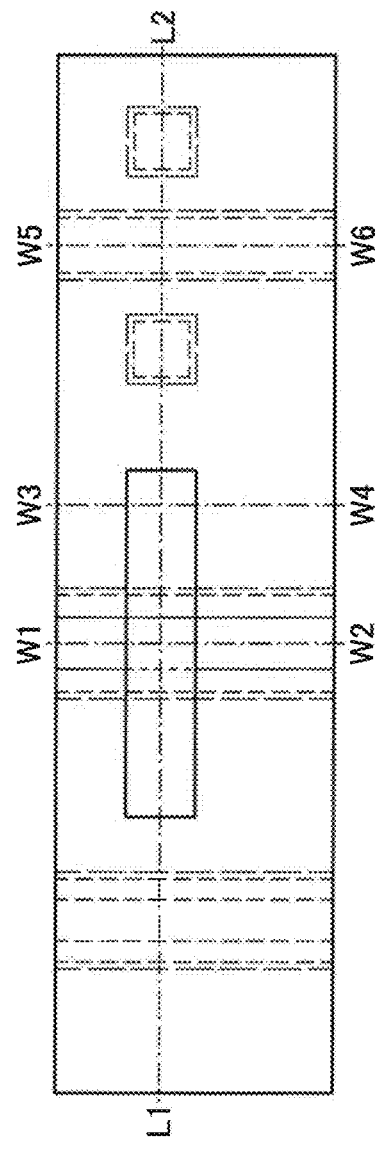
Figure 8B:
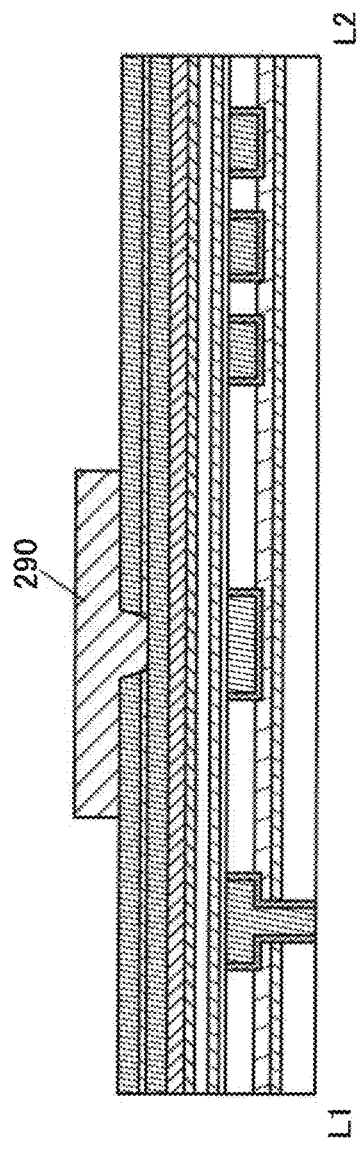
Figure 11C:
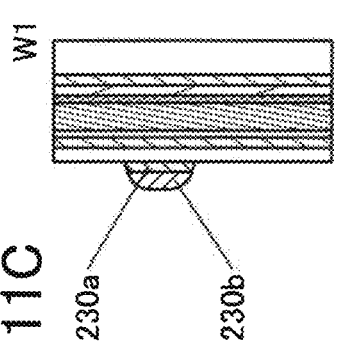
FIGS. 11A to 11E illustrate a method for manufacturing a transistor of one embodiment of the present invention.
Figure 11D:
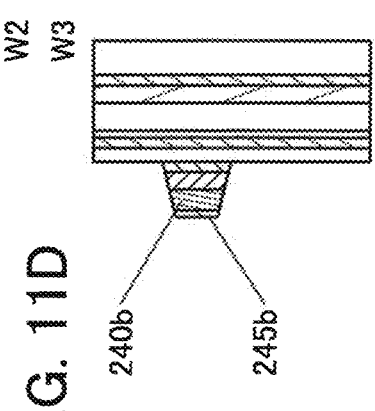
Figure 11E:
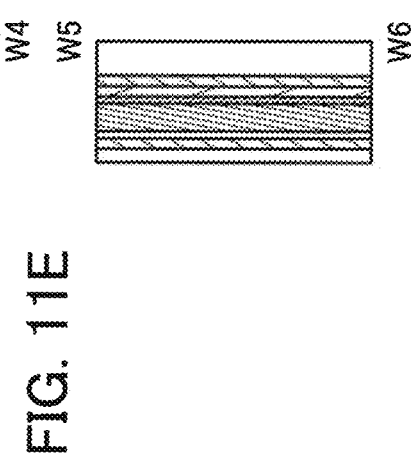
Figure 11A:
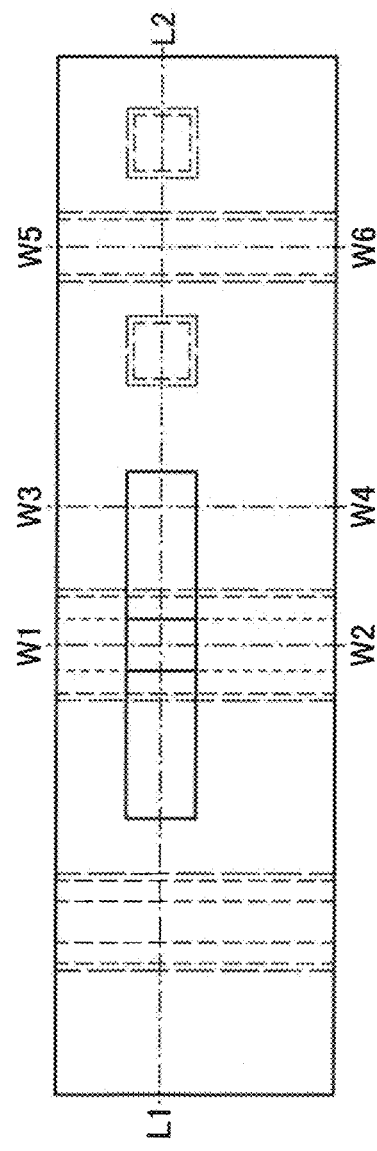
Figure 11B:
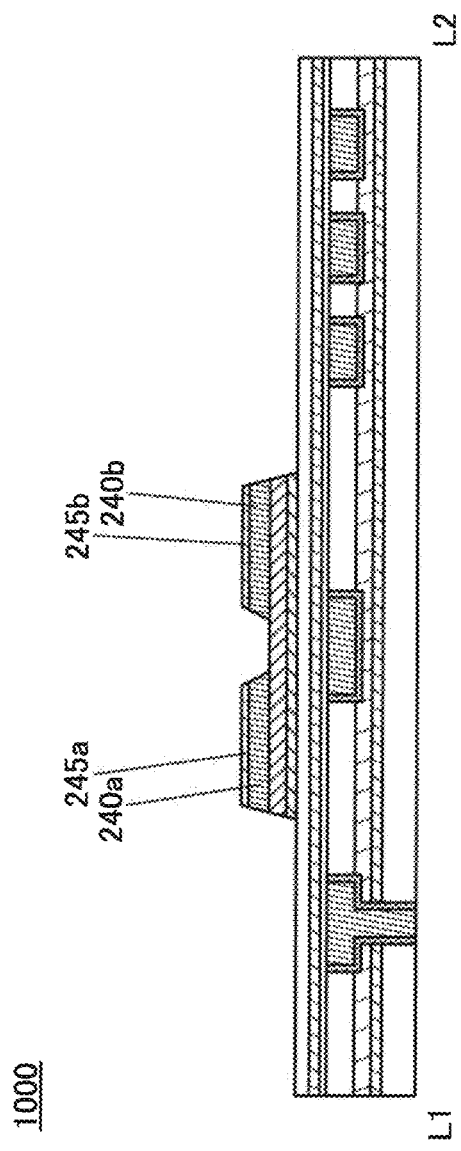
Figure 14C:
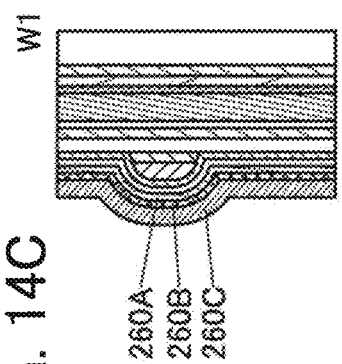
FIGS. 14A to 14E illustrate a method for manufacturing a transistor of one embodiment of the present invention.
Figure 14D:
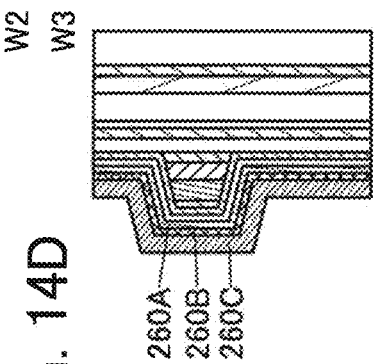
Figure 14E:
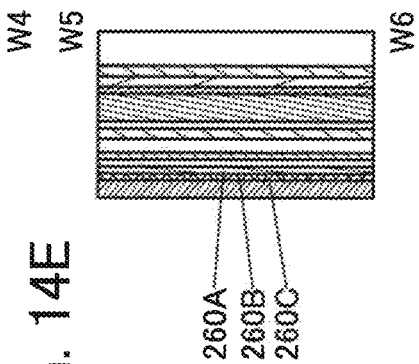
Figure 14A:
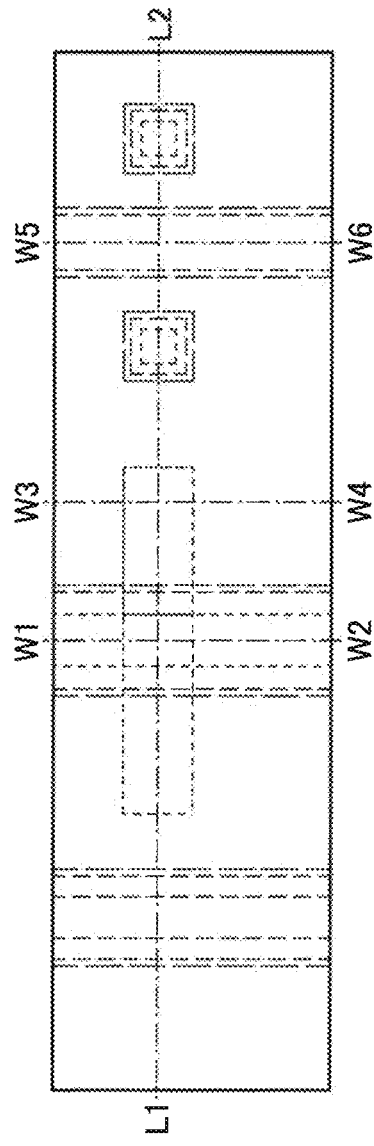
Figure 14B:
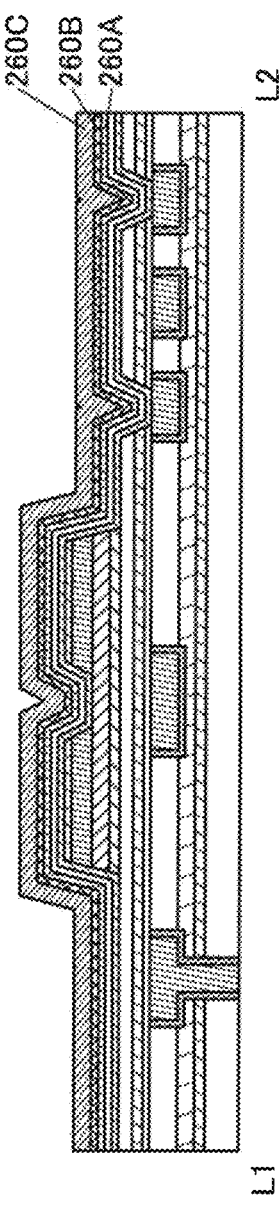
Figure 15C:
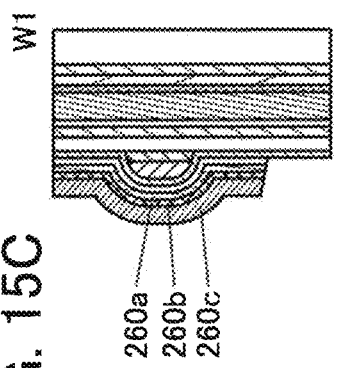
FIGS. 15A to 15E illustrate a method for manufacturing a transistor of one embodiment of the present invention.
Figure 15D:
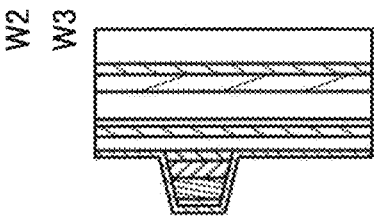
Figure 15E:
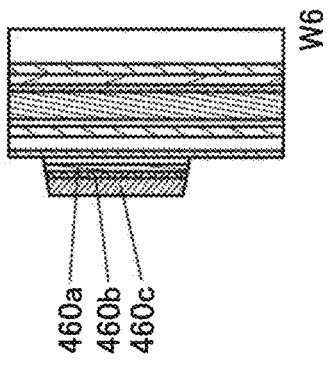
Figure 15A:
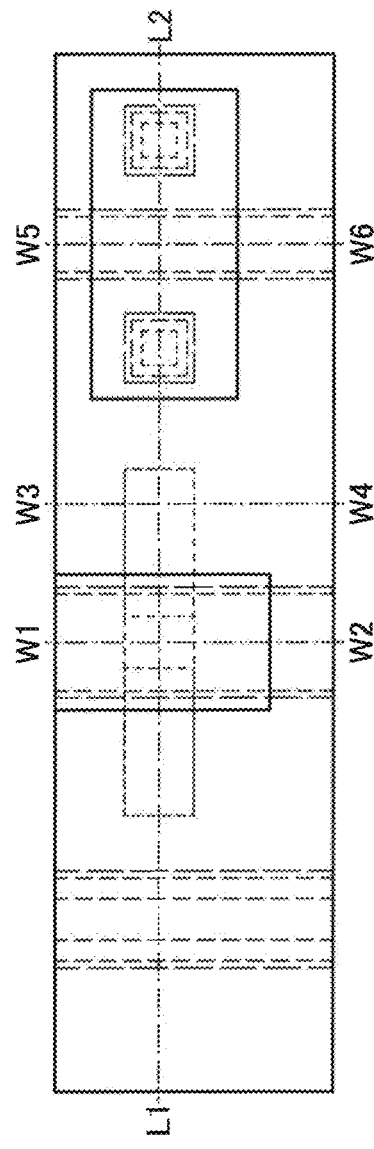
Figure 15B:
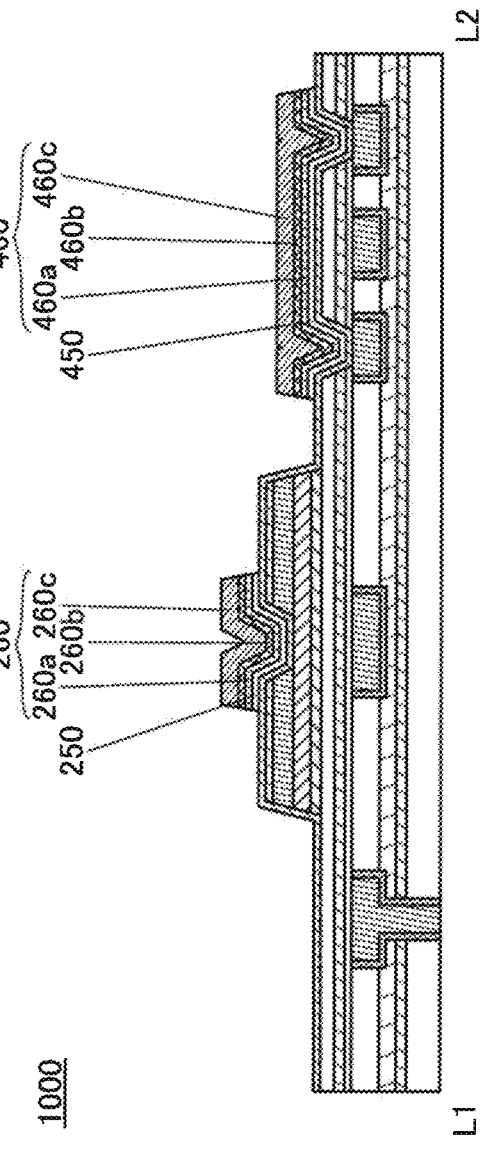
Figure 16C:
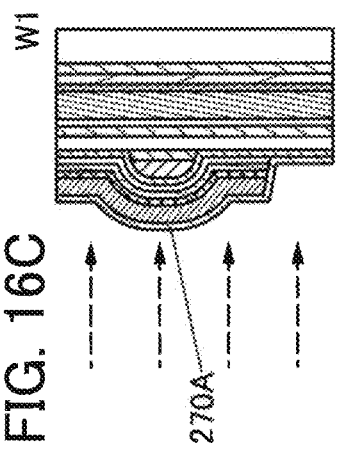
FIGS. 16A to 16E illustrate a method for manufacturing a transistor of one embodiment of the present invention.
Figure 16D:
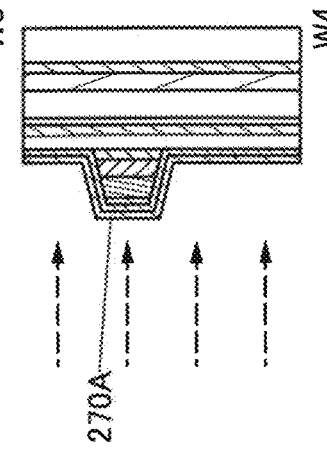
Figure 16E:
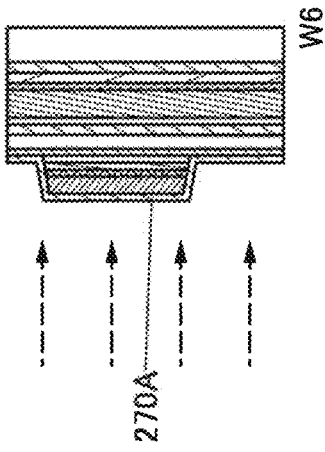
Figure 16A:
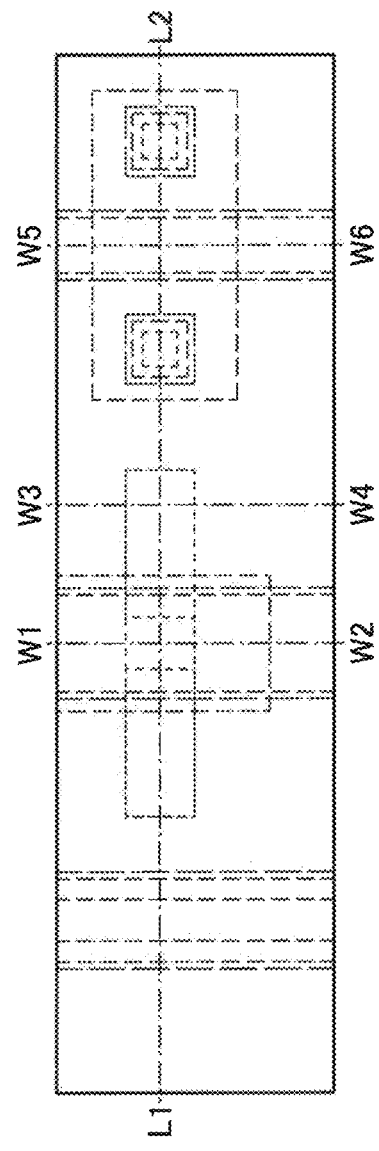
Figure 16B:
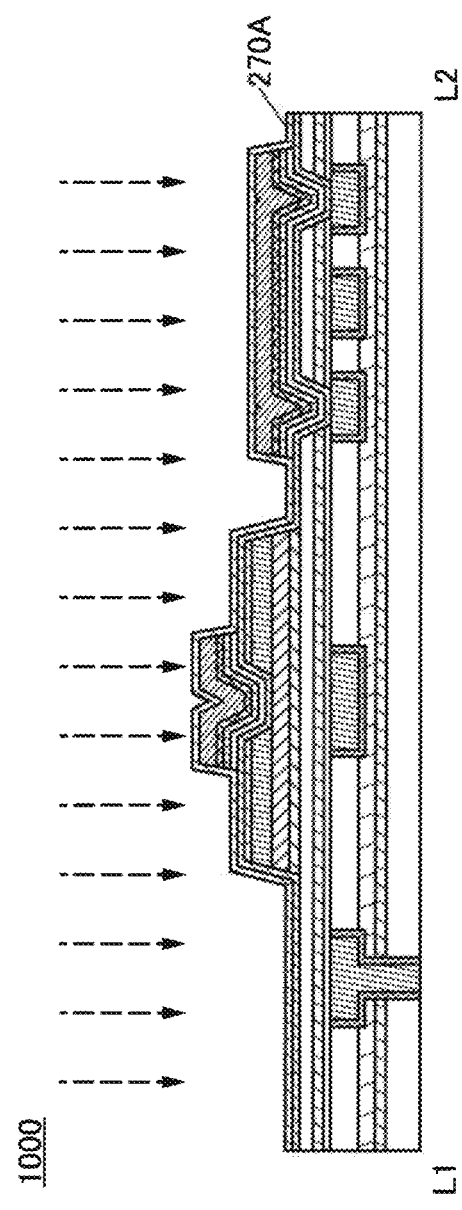
Figure 18C:
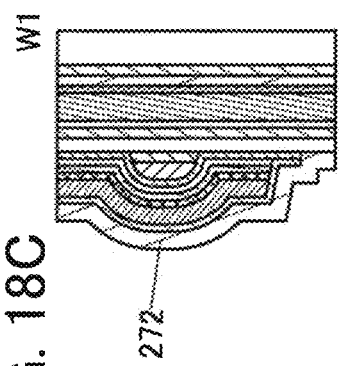
FIGS. 18A to 18E illustrate a method for manufacturing a transistor of one embodiment of the present invention.
Figure 18D:
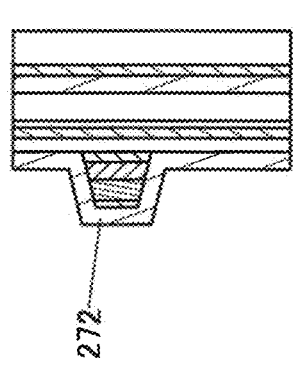
Figure 18E:
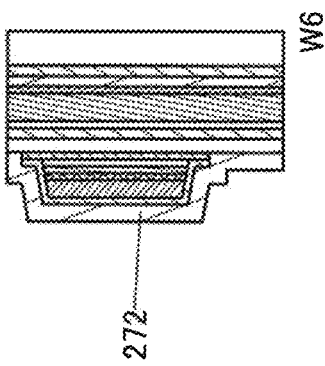
Figure 18A:
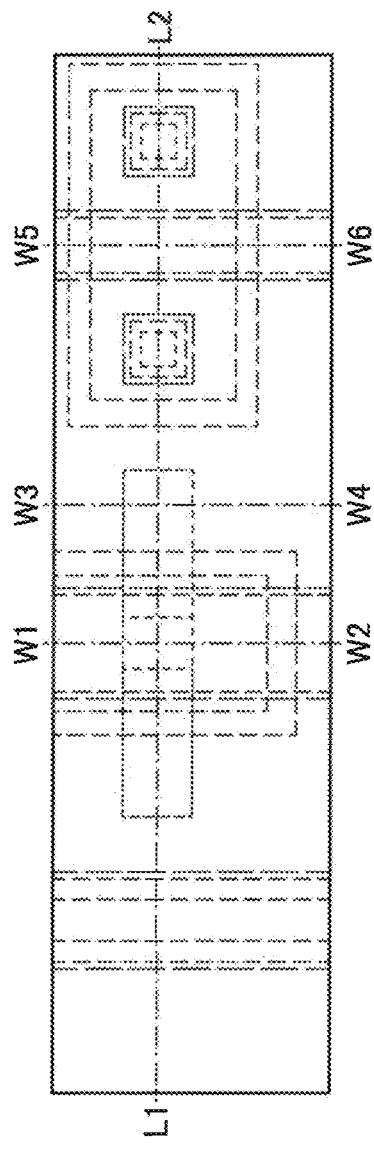
Figure 18B:
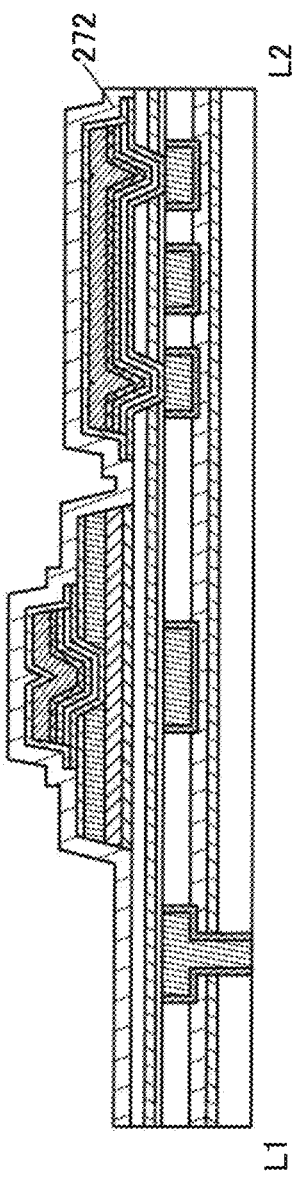
Figure 24A:
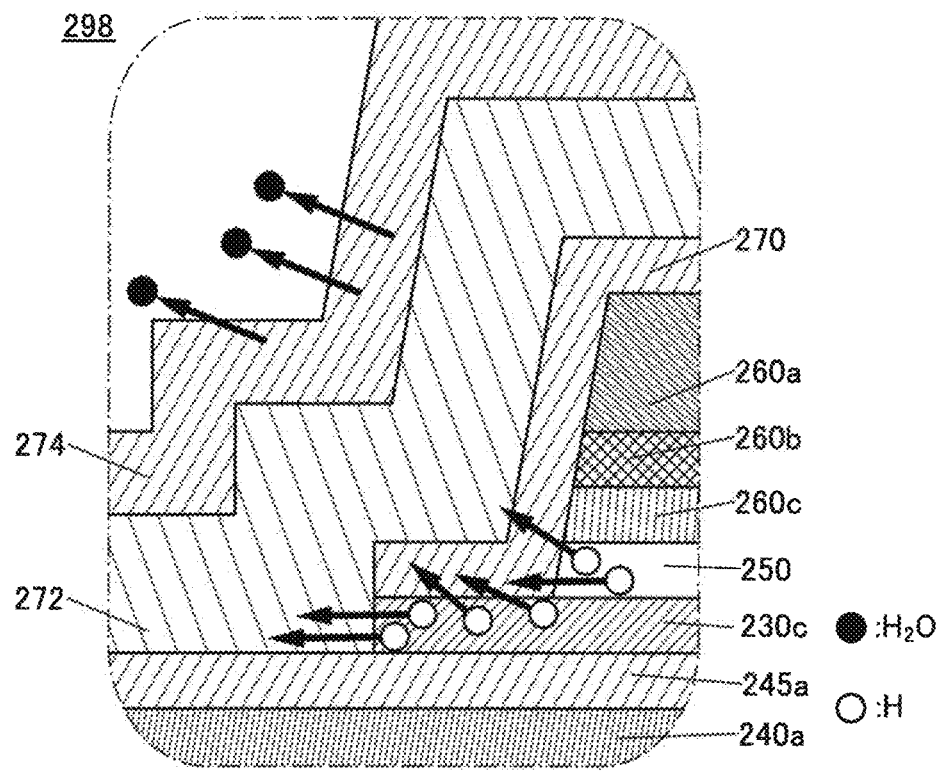
FIGS. 24A and 24B schematically illustrate a mechanism for reducing hydrogen contained in an oxide by an insulator.
Figure 24B:
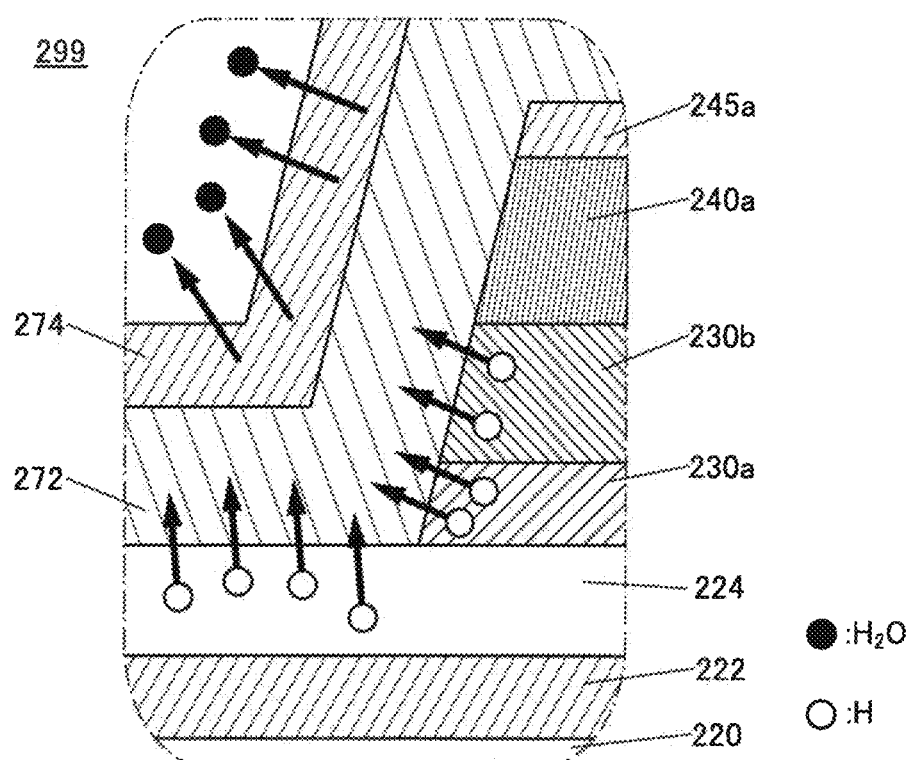

An example of a manufacturing method of the semiconductor device 1000 is described with reference to FIG. 2 to FIGS. 24A and 24B. FIG. 2 is a flow chart for some steps of a manufacturing process of the semiconductor device 1000. In the flow chart of FIG. 2, the left side and the right side respectively show the manufacturing process (steps) and the effects of the steps on the behaviors of impurities such as water or hydrogen and oxygen. FIGS. 24A and 24B show energy states of radicals and ions contained in plasma excited by microwave. Moreover, FIGS. 24A and 24B schematically show a mechanism for reducing hydrogen in an oxide by an aluminum oxide.

First, the outline of the manufacturing method of the semiconductor device 1000 is explained with reference to FIG. 2.

In a step S01, a film 270A is deposited by an ALD method. Then, the film 270A is preferably subjected to a microwave-excited plasma treatment in a step S02.

The microwave-excited plasma treatment can remove hydrogen and water which are impurities in the film 270A. In addition, an oxygen excess region can be formed in the insulator 250. Moreover, oxygen vacancies in the oxide 230c can be compensated.

The principle of the microwave-excited plasma treatment for the film 270A is described. In this description, an aluminum oxide is deposited as the film 270A.

A radical of $O_{3P}$, $O_{1D}$, or the like, an $O_2^+$ ion, and the like are generated by microwave-excited plasma. Hydrogen which is an impurity in the film 270A is combined with or drawn to an oxygen atom of the aluminum oxide. The hydrogen combined with an oxygen atom of the aluminum oxide is drawn away in a state of a hydroxide group (OH) therefrom by the $O_2^+$ ion and the radical of $O_{1D}$ whose energy is relatively large among generated radicals. The hydroxide is combined with another hydrogen in the aluminum oxide to generate water. The generated water is detached from the film 270A, so that the amount of hydrogen in the film 270A is reduced.

The $O_{3P}$ which is a radical whose energy is relatively small does not cause a reaction in the film 270A. The $O_{3P}$ passes through the film 270A and reaches the insulator 250 or the oxide 230c. When the $O_{3P}$ reaches the insulator 250, an excess oxygen region is formed. When the $O_{3P}$ reaches the oxide 230c, an oxygen vacancy in the oxide 230c is compensated or an oxygen excess region is formed. Oxygen in the excess oxygen regions formed in the insulator 250 and the oxide 230c are diffused into the oxide 230b in a heating treatment process or the like which is performed later.

Hydrogen and water which are impurities in the film 270A can be reduced by the microwave-excited plasma treatment. The diffusion of hydrogen and water which are impurities to the insulator 250 and the oxide 230 can thus be prevented. Moreover, an oxygen excess region can be formed in the insulator 250 to compensate oxygen vacancies in the oxide 230c. The transistor 200 is formed of the oxide 230 having little impurities and oxygen vacancies and thus can be increased in its reliability.

Next, in a step S03, the layer 270 is formed and an oxide film 230C on the side surface of the oxide 230b is removed to expose the side surface of the oxide 230b.

Next, in a step S04, heat treatment is performed at a substrate temperature of 100° C. or higher for about five minutes. This can remove moisture such as adsorbed water before deposition of the insulator 272. Particularly when the heat treatment is performed under an oxygen-gas atmosphere, oxygen vacancy is less likely formed in the oxide 230. Then, the insulator 227 is deposited by a sputtering method in a step S05. As shown in the flow chart, the heat treatment in the step S04 and the deposition of the insulator 272 are successively performed without exposure to outside air.

The insulator 272 is preferably deposited in an oxygen-containing atmosphere by a sputtering method. For example, as the insulator 272, an aluminum oxide film is deposited in an oxygen-containing atmosphere by a sputtering method. As a result, oxygen is added to a surface and its vicinity which contacts with the insulator 272 (e.g., the side surface of the oxide 230a, the side surface of the oxide 230b, and the top surface of the insulator 224), so that the surface and its vicinity can enter an oxygen excess state.

The insulator 272 is deposited at a substrate temperature of higher than 100° C. and lower than or equal to 200° C., preferably higher than or equal to 120° C. and lower than or equal to 150° C. Then, the insulator 274 is deposited by an ALD method in a step S06.

Next, a microwave-excited plasma treatment is performed in a step S07.

FIGS. 24A and 24B are schematic views illustrating the state of hydrogen and water when the microwave-excited plasma treatment is performed in the step S07. FIG. 24A shows the vicinity of the layer 270 (hereinafter referred to as a region 298, see FIG. 19B). FIG. 24B shows the vicinity of the side surface of the oxide 230b (hereinafter referred to as a region 299, see FIG. 19B).

As shown in FIG. 24A, by the microwave-excited plasma treatment, the hydrogen contained in the insulator 250, the oxide 230c, and the like are gettered by the layer 270 and the insulator 272 and is out-diffused as water from the upper part of the insulator 274. That is, each of the insulator 272 and the insulator 274 has a function of out-diffusing the hydrogen contained in the insulator 250, the oxide 230c, and the like and releasing it as water outside the insulator 274. Note that the function of gettering impurities in the oxide 230c and the like is enhanced when the insulator 272 is deposited at low temperatures.

As shown in FIG. 24B, by the microwave-excited plasma treatment, the hydrogen contained in the insulator 224, the oxide 230a, the oxide 230b, and the like are gettered by the insulator 272 and is out-diffused as water from the upper part of the insulator 274. That is, each of the insulator 272 and the insulator 274 has a function of out-diffusing the hydrogen contained in the insulator 224, the oxide 230a, the oxide 230b, and the like and releasing it as water outside the insulator 274. Note that the function of gettering impurities in the oxide 230b and the like is enhanced when the insulator 272 is deposited at low temperatures.

The function of each of the insulator 272 and the insulator 274 produces an effect similar to a catalyst. In other words, the insulator 272 and the insulator 274 each serve as a catalyst. In this manner, impurities such as hydrogen in the insulator 272, the oxide 230a, and the oxide 230b can be further reduced.

Note that it is preferable that the microwave-excited plasma treatment be performed at least on the insulator 274. When the conditions of the microwave-excited plasma treatment performed on the insulator 274 are determined appropriately, impurities contained in the layer 270 below the insulator 274 can be reduced. For this reason, the microwave-excited plasma treatment is not necessarily performed on the film 270A in the step 02.

Next, the manufacturing method of the semiconductor device 1000 in FIGS. 1A to 1E is described with reference to FIGS. 3A to 3E to FIGS. 22A to 22E. Note that FIGS. 3A to 3E to FIGS. 22A to 22E correspond to FIGS. 1A to 1E. FIG. 3A to FIG. 22A are top views of the semiconductor device 1000. FIG. 3B to FIG. 22B are cross-sectional views of the transistor 200 and the transistor 400 in the channel length direction corresponding to the dashed-dotted line L1-L2 in FIG. 3A to FIG. 22A. FIG. 3C to FIG. 22C are cross-sectional views of the transistor 200 in the channel width direction corresponding to the dashed-dotted line W1-W2 in FIG. 3A to FIG. 22A. FIG. 3D to FIG. 22D are cross-sectional views of the transistor 200 corresponding to the dashed-dotted line W3-W4 in FIG. 3A to FIG. 22A. FIG. 3E to FIG. 22E are cross-sectional views of the transistor 400 in the channel width direction corresponding to the dashed-dotted line W5-W6 in FIG. 3A to FIG. 22A.

Note that an insulating material for forming the insulators, a conductive material for forming the conductors, or a semiconductor material for forming the semiconductors can be formed by appropriately using any of the following: a sputtering method, a spin coating method, a chemical vapor deposition (CVD) method (including a thermal CVD method, a metal organic chemical vapor deposition (MOCVD) method, a plasma enhanced CVD (PECVD) method, a high density plasma CVD method, a low pressure CVD (LPCVD) method, an atmospheric pressure CVD (APCVD) method, and the like), an atomic layer deposition (ALD) method, a molecular beam epitaxy (MBE) method, and a pulsed laser deposition (PLD) method.

By a PECVD method, a high-quality film can be formed at a relatively low temperature. By a MOCVD method, an ALD method, or a thermal CVD method (i.e., by using no plasma for film deposition), damage is not easily caused on a formation surface and a film with few defects can be formed accordingly.

When an ALD method is used, a gas that does not contain chlorine is preferably used as a material gas.

First, over a substrate (not illustrated), the insulator 210, the insulator 212, the insulator 214, and the insulator 216 are formed in this order (see FIGS. 3A to 3E). In this embodiment, a single crystal silicon substrate (including a p-type semiconductor substrate or an n-type semiconductor substrate) is used as the substrate.

In this embodiment, the insulator 210 is formed using silicon oxynitride by a CVD method. By using a plasma CVD method for forming an insulator, a high-quality film can be formed at a relatively low temperature.

Next, the insulator 212 is formed using aluminum oxide by an ALD method. By using an ALD method, a dense insulating layer including reduced defects such as cracks or pinholes or having a uniform thickness can be formed.

The insulator 214 is formed using aluminum oxide by a sputtering method. Note that as described above, the insulator 216 is preferably an insulator containing excess oxygen. After the formation of the insulator 216, oxygen doping treatment may be performed.

The insulator 216 is formed using silicon oxynitride by a CVD method. By using a plasma CVD method for forming an insulator, a high-quality film can be formed at a relatively low temperature.

Next, a resist mask is formed over the insulator 216 and openings corresponding to the conductor 205, the conductor 405, the conductor 403, and the conductor 407 are formed in the insulator 216. Moreover, an opening corresponding to the conductor 207 is formed in the insulator 210, the insulator 212, the insulator 214, and the insulator 216. The resist mask can be formed by appropriately using a photolithography method, a printing method, an inkjet method, or the like. Formation of the resist mask by a printing method, an inkjet method, or the like needs no photomask; thus, manufacturing cost can be reduced.

The resist mask can be formed by a photolithography method as follows: a photosensitive resist is irradiated with light through a photomask, and a portion of the resist which has been exposed to light (alternatively, a portion which has not been exposed to light) is removed using a developing solution. Examples of light with which the photosensitive resist is irradiated include KrF excimer laser light, ArF excimer laser light, extreme ultraviolet (EUV) light, and the like. Alternatively, a liquid immersion technique may be employed in which light exposure is performed with a portion between a substrate and a projection lens filled with liquid (e.g., water). An electron beam or an ion beam may be used instead of the above-mentioned light. Note that a photomask is not necessary in the case of using an electron beam or an ion beam. Note that a dry etching method such as ashing or a wet etching method using a dedicated stripper or the like can be used for removal of the resist mask. Both the dry etching method and the wet etching method may be used.

When the openings are formed, part of the insulator 214 is also removed in some cases. The insulator 210, the insulator 212, the insulator 214, and the insulator 216 can be removed by a dry etching method, a wet etching method, or the like. Both a dry etching method and a wet etching method may be used. The resist mask is removed after the formation of the openings.

Next, conductive films to be the conductors 207a, 205a, 403a, 405a, and 407a and to be the conductors 207b, 205b, 403b, 405b, and 407b are formed over the insulators 214 and 216. In this embodiment, a stacked layer of tantalum nitride and titanium nitride is formed by a sputtering method as the conductive film to be the conductors 207a, 205a, 403a, 405a, and 407a. In addition, tungsten is formed by a sputtering method as the conductive film to be the conductors 207b, 205b, 403b, 405b, and 407b.

Next, chemical mechanical polishing treatment (also referred to as "CMP treatment") is performed to form the conductors 207a, 205a, 403a, 405a, 407a, 207b, 205b, 403b, 405b, and 407b (see FIGS. 4A to 4E). By CMP treatment, part of the conductive films is removed. At this time, part of a surface of the insulator 216 is also removed in some cases. By the CMP treatment, unevenness of a sample surface can be reduced, and coverage with an insulating layer or a conductive layer to be formed later can be increased.

The conductors 207, 205, 405, 403, and 407 can be formed at the same time by a dual damascene process. In this manner, the conductors 207, 205, 405, 403, and 407 are formed (see FIGS. 4A to 4E).

The insulator 220, the insulator 222, and the insulator 224 are formed in this order over the insulator 216 and the conductors 207, 205, 403, 405, and 407 (see FIGS. 5A to 5E). In this embodiment, hafnium oxide is formed as the insulator 220 by an ALD method and silicon oxide is formed as the insulator 224 by a CVD method.

Here, the concentration of impurities such as water or hydrogen in the insulator 224 is preferably lowered. Thus, impurities such as water or hydrogen are preferably diffused outward by heat treatment in an inert atmosphere containing nitrogen, a rare gas, or the like. The details of the heat treatment will be described below. The insulator 224 is preferably an insulating layer containing excess oxygen. Thus, oxygen doping treatment may be performed after the formation of the insulator 224.

Next, an oxide film 230A, an oxide film 230B, a conductive film 240A, a film 245A, and a conductive film 247A are formed in this order (see FIGS. 6A to 6E).

When an oxide is used as the oxides 230 and 430, oxide films to be the oxides 230 and 430 are preferably formed by a sputtering method; thus, each of the oxides 230 and 430 can have a higher density. A rare gas (typically argon), oxygen, or a mixed gas of a rare gas and oxygen may be used as a sputtering gas. Alternatively, deposition may be performed while the substrate is heated.

In addition, increasing the purity of a sputtering gas is also necessary. For example, an oxygen gas or a rare gas used as a sputtering gas is a gas that is highly purified to have a dew point of $-60°$ C. or lower, preferably $-100°$ C. or lower. By using the sputtering gas that is highly purified, entry of moisture or the like into the oxides 230 and 430 can be prevented as much as possible.

In the case where the oxides 230 and 430 are formed by a sputtering method, it is preferable that moisture in a deposition chamber of a sputtering apparatus be removed as much as possible. For example, with an adsorption vacuum evacuation pump such as cryopump, the deposition chamber is preferably evacuated to be a high vacuum state (to a degree of about $5 \times 10^{-7}$ Pa to $1 \times 10^{-4}$ Pa). In particular, the partial pressure of gas molecules corresponding to $H_2O$ (gas molecules corresponding to m/z=18) in the deposition chamber in the standby mode of the sputtering apparatus is preferably lower than or equal to $1 \times 10^{-4}$ Pa, more preferably lower than or equal to $5 \times 10^{-5}$ Pa.

In this embodiment, the oxide film 230A is formed by a sputtering method. Oxygen or a mixed gas of oxygen and a rare gas is used as the sputtering gas. When the proportion of oxygen in the sputtering gas is increased, the amount of excess oxygen in the oxide film to be formed can be increased.

At the formation of the oxide film 230B, part of oxygen contained in the sputtering gas is supplied to the insulators 224, 222, and 216 in some cases. As the amount of oxygen contained in the sputtering gas increases, the amount of oxygen supplied to the insulators 224, 222, and 216 increases. Thus, excess-oxygen regions can be formed in the insulators 224, 222, and 216. Moreover, part of oxygen supplied to the insulators 224, 222, and 216 reacts with hydrogen left in the insulators 224, 222, and 216 to produce water and the water is released from the insulators 224, 222, and 216 by later heat treatment. Thus, the hydrogen concentration in the insulators 224, 222 and 216 can be reduced.

The proportion of oxygen in the sputtering gas is preferably 70% or more, more preferably 80% or more, still more preferably 100%. When oxide containing excess oxygen is used for the oxide film 230A, oxygen can be supplied to the oxide 230b by later heat treatment.

Next, the oxide film 230B is formed by a sputtering method. At this time, when the proportion of oxygen in the sputtering gas is higher than or equal to 1% and lower than or equal to 30%, preferably higher than or equal to 5% and lower than or equal to 20%, an oxygen-deficient oxide is formed. A transistor including an oxygen-deficient oxide can have relatively high field-effect mobility.

Note that when an oxygen-deficient oxide is used as the oxide film 230B, an oxide film containing excess oxygen is preferably used as the oxide film 230A. After the formation of the oxide film 230B, oxygen doping treatment may be performed.

After the formation of the oxide films 230A and 230B, heat treatment is preferably performed. The detail of the heat treatment will be described below. In this embodiment, the heat treatment is performed at 400° C. in an oxygen gas atmosphere for one hour. Accordingly, oxygen is introduced into the oxide films 230A and 230B. More preferably, heat treatment is performed at 400° C. in a nitrogen gas atmosphere for one hour before the heat treatment performed in an oxygen gas atmosphere. By performing the heat treatment in a nitrogen gas atmosphere first, impurities such as water or hydrogen contained in the oxide films 230A and 230B are released, so that the concentration of impurities in the oxide films 230A and 230B can be reduced.

Then, the conductive film 240A is formed. In this embodiment, tantalum nitride is formed by a sputtering method as the conductive film 240A. Tantalum nitride has high oxidation resistance and thus is preferably used in the case where heat treatment is performed in a later step.

Note that when the conductive film 240A is in contact with the oxide film 230B, an impurity element is introduced into a top surface of the oxide film 230B in some cases. Introduction of the impurity element into the oxide film 230B can change a threshold voltage of the transistor 200. The impurity element may be introduced by an ion implantation method, an ion doping method, a plasma immersion ion implantation method, plasma treatment using a gas containing the impurity element, or the like before the conductive film 240A is formed. Alternatively, the impurity element may be introduced by an ion implantation method or the like after the conductive film 240A is formed.

Next, the film 245A is formed. In this embodiment, an aluminum oxide film is formed by an ALD method as the film 245A. A dense film including reduced defects such as cracks or pinholes or having a uniform thickness can be formed by an ALD method.

The conductive film 247A serves as a hard mask for forming the conductor 240a and the conductor 240b in a later step. In this embodiment, tantalum nitride is used as the conductive film 247A.

Then, the film 245A and the conductive film 247A are processed by a photolithography method, whereby a film 245B and a conductive film 247B are formed (see FIGS. 7A to 7E). An opening is formed in the film 245B and the conductive film 247B.

Note that when the opening is formed, the side surfaces on the opening sides of the film 245B and the conductive film 247B each preferably have a taper angle with respect to the top surface of the oxide 230b. Note that the angle is 30° or more and 90° or less, preferably 45° or more and 80° or less. The formation of the opening using the resist mast is preferably performed using the minimum feature size. That is, the film 245B has the opening whose width is the minimum feature size.

Then, a resist mask 290 is formed over the film 245B and the conductive film 247B by a photolithography method (see FIGS. 8A to 8E).

With the use of the resist mask 290 as a mask, parts of the conductive film 240A, the film 245B, and the conductive film 247B are selectively removed; thus, the conductive film 240A, the film 245B, and the conductive film 247B are processed into an island shape (see FIGS. 9A to 9E). At this time, the conductive film 240A is processed into a conductive film 240B, the film 245b is processed into the layer 245a and the layer 245b, and the conductive film 247b is processed into a conductor 247a and a conductor 247b. Note that when the width of the opening in the film 245b is the minimum feature size, the distance between the layer 245a and the layer 245b is the minimum feature size.

Subsequently, parts of the oxide films 230A and 230B are selectively removed using the conductive film 240B as a mask (see FIGS. 10A to 10E). At this time, part of the insulator 224 might be also removed. Then, the resist mask is removed; thus, a stacked-layer structure of the island-shaped oxides 230a and 230b, the island-shaped conductive film 240B, the island-shaped layers 245a and 245b, and the island-shaped conductors 247a and 247b can be formed.

Note that the removal of the oxide films 230A and 230B, the conductive film 240A, and the film 245A can be performed by a dry etching method, a wet etching method, or the like. Both the dry etching method and the wet etching method may be used.

Then, part of the conductive film 240B is selectively removed by a dry etching method using the layers 245a and 245b and the conductors 247a and 247b as masks. By the etching step, the conductive film 240B is divided into the conductor 240a and the conductor 240b (see FIGS. 11A to 11E).

As a gas for the dry etching, for example, any of a $C_4F_6$ gas, a $C_2F_6$ gas, a $C_4F_8$ gas, a $CF_4$ gas, a $SF_6$ gas, a $CHF_3$ gas, and the like can be used alone or in combination. Alternatively, an oxygen gas, a helium gas, an argon gas, a hydrogen gas, or the like can be added to any of the above gases as appropriate. In particular, a gas with which an organic substance can be generated by plasma is preferably used. For example, it is preferable to use a $C_4F_6$ gas, a $C_4F_8$ gas, or a $CHF_3$ gas to which a helium gas, an argon gas, a hydrogen gas, or the like is added as appropriate.

Here, the conductors 247a and 247b function as hard masks, and the conductors 247a and 247b are also removed as etching progresses.

Using a gas with which an organic substance can be generated, the conductive film 240B is etched while an organic substance is attached to the side surfaces of the layers 245a and 245b and the conductors 247a and 247b, whereby side surfaces in contact with the oxide 230c of the conductors 240a and 240b can be tapered.

The conductors 240a and 240b function as a source electrode and a drain electrode of the transistor; thus, a length between the conductors 240a and 240b facing each other can be referred to as a channel length of the transistor. That is, when the width of the opening in the film 245B is minimum feature size, the distance between the layers 245a and 245b is the minimum feature size; therefore, the gate line width and the channel length can be smaller than the minimum feature size.

The angle of the side surface of the opening in the film 245B can be controlled depending on the ratio of the etching rate of the conductive film 240B to the deposition rate of the organic substance attached to the side surfaces of the layers 245a and 245b. For example, if the ratio of the etching rate to the deposition rate of the organic substance is 1, the angle is 45°.

The ratio of the etching rate and the deposition rate of the organic substance is determined by setting etching conditions as appropriate depending on the gas to be used in the etching. For example, the ratio of the etching rate and the deposition rate of the organic substance can be controlled by using a mixed gas of a $C_4F_8$ gas and an argon gas and controlling the high-frequency power and the etching pressure of the etching apparatus.

When the conductors 240a and 240b are formed by a dry etching method, impurities such as remaining components of an etching gas might be attached to an exposed part of the oxide 230b. For example, when a chlorine-based gas is used as an etching gas, chlorine and the like are attached in some cases. Furthermore, when a hydrocarbon-based gas is used as an etching gas, carbon, hydrogen, and the like are attached in some cases. The impurities attached to the exposed surface of the oxide 230b are preferably reduced. The impurity elements can be reduced by cleaning treatment using hydrofluoric acid, cleaning treatment using ozone, cleaning treatment using ultra violet rays, or the like. Note that different types of cleaning treatment may be combined.

Plasma treatment using an oxidizing gas may be performed. For example, plasma treatment using a nitrous oxide gas is performed. By the plasma treatment, the concentration of fluorine in the oxide 230b can be lowered. Moreover, the plasma treatment is effective in removing an organic substance on the surface of the sample.

Oxygen doping treatment may be performed on the exposed oxide 230b. Furthermore, heat treatment described later may be performed.

When processing is performed using the layers 245a and 245b as masks, an etching gas having relatively high etching selectivity to the conductive film 240B and the insulator 224 can be used. Therefore, even when the thickness of the insulator 224 is small, over-etching of the wiring layer positioned below the insulator can be prevented. In addition, when the thickness of the insulator 224 is small, a voltage is effectively applied from the conductor 205; therefore, the transistor with low power consumption can be provided.

Next, heat treatment is preferably performed to reduce impurities such as water or hydrogen contained in the oxides 230a and 230b and to purify the oxides 230a and 230b.

Plasma treatment using an oxidizing gas may be performed before the heat treatment. For example, plasma treatment using a nitrous oxide gas is performed. By the plasma treatment, the fluorine concentration in the exposed insulating layer can be lowered. Moreover, the plasma treatment is effective in removing an organic substance on the surface of a sample.

For example, the heat treatment is performed under an inert atmosphere of nitrogen, a rare gas, or the like, an oxidizing gas atmosphere, or an ultra-dry air atmosphere (the moisture amount is 20 ppm (−55° C. by conversion into a dew point) or less, preferably 1 ppm or less, more preferably 10 ppb or less, in the case where the measurement is performed by a dew point meter in a cavity ring down laser spectroscopy (CRDS) system). Note that the oxidizing gas atmosphere refers to an atmosphere containing an oxidizing gas such as oxygen, ozone, or nitrogen oxide at 10 ppm or higher. The inert atmosphere refers to an atmosphere containing the oxidizing gas at lower than 10 ppm and is filled with nitrogen or a rare gas. The pressure during the heat treatment is not particularly limited; however, the heat treatment is preferably performed under a reduced pressure.

By the heat treatment, at the same time as the release of the impurities, oxygen contained in the insulator 224 is diffused into the oxides 230a and 230b and oxygen vacancies therein can be reduced. Note that the heat treatment may be performed in such a manner that heat treatment is performed in an inert atmosphere, and then another heat treatment is performed in an atmosphere containing an oxidizing gas at 10 ppm or more, 1% or more, or 10% or more in order to compensate for desorbed oxygen. The heat treatment may be performed at any time after the oxides 230a and 230b are formed.

The heat treatment may be performed at a temperature higher than or equal to 250° C. and lower than or equal to 650° C., preferably higher than or equal to 300° C. and lower than or equal to 500° C. The treatment time is shorter than or equal to 24 hours. Heat treatment for over 24 hours is not preferable because the productivity is reduced. Note that in the case where a metal which is likely to diffuse when heated, such as Cu, is used for the conductor, the temperature of the heat treatment may be set to lower than or equal to 410° C., preferably lower than or equal to 400° C.

In this embodiment, after heat treatment is performed at 400° C. in a nitrogen gas atmosphere for one hour, heat treatment is performed at 400° C. in an oxygen gas atmosphere for one hour. By performing the heat treatment in a nitrogen gas atmosphere first, impurities such as water or hydrogen contained in the oxides 230a and 230b are released, so that the concentration of impurities in the oxides 230a and 230b is reduced. Then, by performing the heat treatment in an oxygen atmosphere next, oxygen is introduced into the oxides 230a and 230b.

Since part of an upper surface of the conductive film 240B is covered with the layers 245a and 245b at the heat treatment, oxidation caused from the upper surface can be prevented.

Next, openings are formed in the insulators 220, 222, and 224 by a photolithography method. Note that the openings are formed over the conductors 405c and 407c (see FIGS. 12A to 12E).

Next, an oxide film 230C to be the oxides 230c and 430 are formed. In this embodiment, an oxide containing much excess oxygen is used for the oxide film 230C, as for the oxide film 230A. When a semiconductor containing excess oxygen is used for the oxide film 230C, oxygen can be supplied to the oxide 230b by later heat treatment.

At the formation of the oxide 230c, like the oxide 230a, part of oxygen contained in the sputtering gas is supplied to the insulators 224, 222, and 216 to form an excess-oxygen region in some cases. Moreover, part of oxygen supplied to the insulators 224, 222, and 216 reacts with hydrogen left in the insulators 224, 222, and 216 to produce water and the water is released from the insulators 224, 222, and 216 by later heat treatment. Thus, the hydrogen concentration in the insulators 224, 222, and 216 can be reduced.

Note that after the oxide film 230C is formed, either or both of oxygen doping treatment and heat treatment may be performed. By the heat treatment, oxygen contained in the oxides 230a and 230c can be supplied to the oxide 230b. When oxygen is supplied to the oxide 230b, oxygen vacancies in the oxide 230b can be reduced. Thus, when an oxygen-deficient oxide is used as the oxide 230b, a semiconductor containing excess oxygen is preferably used as the oxide 230c.

Part of the oxide 230c is in contact with a channel formation region of the oxide 230b. In addition, top and side surfaces of the channel formation region of the oxide 230*b* are covered with the oxide 230*c*. In such a manner, the oxide 230*b* can be surrounded by the oxide 230*a* and the oxide 230*c*. By surrounding the oxide 230*b* by the oxide 230*a* and the oxide 230*c*, diffusion of impurities into the oxide 230*b* which is to be caused in a later step can be inhibited.

Next, an insulating film 250A is formed over the oxide film 230C (see FIGS. 13A to 13E). In this embodiment, silicon oxynitride is formed by a CVD method as the insulating film 250A. The insulating film 250A is preferably an insulating layer containing excess oxygen. The insulating film 250A may be subjected to oxygen doping treatment. Moreover, heat treatment may be performed after the formation of the insulating film 250A.

Then, a conductive film 260A, a conductive film 260B, and a conductive film 260C are formed in this order (see FIGS. 14A to 14E). In this embodiment, a metal oxide formed by a sputtering method is used as the conductive film 260A, titanium nitride is used as the conductive film 260B, and tungsten is used as the conductive film 260C. The conductive film 260A formed by a sputtering method can add oxygen to the insulator 250, and the insulator 250 can be in an oxygen excess state. Thus, oxygen can be supplied from the insulator 250 to the oxide 230*b* effectively.

Next, parts of the insulating film 250A and the conductive films 260A to 260C are selectively removed by a photolithography method, so that the insulator 250, the insulator 450, the conductor 260*a*, the conductor 260*b*, the conductor 260*c*, the conductor 460*a*, the conductor 460*b*, and the conductor 460*c* are formed (see FIGS. 15A to 15E).

Next, the film 270A to be processed into the layer 270 and the layer 470 in a later step is formed (see FIGS. 16A to 16E). The film functions as a gate cap, and in this embodiment, is formed using aluminum oxide formed by an ALD method.

Next, the microwave-excited plasma treatment is performed on the film 270A (the broken-line arrows in the drawing). By the microwave-excited plasma treatment, hydrogen, water, and nitrogen which are impurities in the film 270A can be removed. In addition, an oxygen-excess region can be formed in the insulator 250. Moreover, oxygen vacancies in the oxide 230*c* can be compensated.

Then, parts of the film 270A are selectively removed by a photolithography method, so that the layer 270 and the layer 470 are formed. The layer 270 over the conductor 260 can prevent consumption of the surrounding excess oxygen for oxidation of the conductor 260.

The layers 270 and 470 can be etched by a dry etching method, a wet etching method, or the like. In this embodiment, the layers 270 and 470 are formed by a dry etching method. At this time, although part of the oxide film 230C can be removed in some cases, a residue of the oxide film 230C is likely to be formed on the side surfaces of the oxides 230*a* and 230*b* or the like.

Next, the oxide film 230C is etched using the layers 270 and 470 as masks (see FIGS. 17A to 17E). The etching treatment in this step is performed by a wet etching or the like and a wet etching using phosphoric acid is performed in this embodiment. By this treatment, the island-shaped oxide 230*c* and the island-shaped oxide 430 are formed. Even when part of the oxide film 230C remains as a residue, the residue is removed, and accordingly the side surfaces of the oxide 230*b* can be exposed.

Next, heat treatment is preferably performed. The above description can be referred to for the heat treatment. In this embodiment, after heat treatment is performed at 400° C. in a nitrogen gas atmosphere for one hour, heat treatment is performed at 400° C. in an oxygen gas atmosphere for one hour. By performing the heat treatment in a nitrogen gas atmosphere first, impurities such as water or hydrogen contained in the oxide 230 are released, so that the concentration of impurities in the oxide 230 is reduced. Then, by performing the heat treatment in an oxygen gas atmosphere next, oxygen is introduced into the oxide 230.

Subsequently, the substrate is carried into a deposition apparatus including a plurality of chambers, and heat treatment is performed in the chamber of the deposition apparatus. The heating atmosphere or the like of this heat treatment can be referred to for the conditions of the above heat treatment. For example, this heat treatment is preferably performed under an oxygen atmosphere and the pressure in the chamber is higher than or equal to $1.0 \times 10^{-8}$ Pa and lower than or equal to 1000 Pa, preferably higher than or equal to $1.0 \times 10^{-8}$ Pa and lower than or equal to 100 Pa, further preferably higher than or equal to $1.0 \times 10^{-8}$ Pa and lower than or equal to 10 Pa, still further preferably higher than or equal to $1.0 \times 10^{-8}$ Pa and lower than or equal to 1 Pa. The heating temperature may be higher than or equal to 100° C. and lower than or equal to 500° C., preferably higher than or equal to 200° C. and lower than or equal to 450° C. In addition, in the case where a metal which is likely to diffuse when heated such as Cu is used for the conductor, the temperature of the heat treatment may be set to lower than or equal to 410° C., preferably lower than or equal to 400° C. Note that the heating temperature is preferably higher than the substrate temperature in the formation of the insulator 272 described later.

In this embodiment, the heat treatment is performed under an oxygen atmosphere for about 5 minutes at the substrate temperature of 400° C. By this treatment, moisture such as adsorbed water can be removed before the insulator 272 is formed. Under an oxygen atmosphere in particular, the heat treatment can be performed without forming an oxygen vacancy in the oxide 230.

Then, the insulator 272 is formed by a sputtering method in a different chamber of the above deposition apparatus from the chamber in which the heat treatment is performed (see FIGS. 18A to 18E). The formation of the insulator 272 is successively performed following the heat treatment in Step S04 without exposure of the substrate to outside air. In this embodiment, the thickness of the insulator 272 is 5 nm or greater and 100 nm or less, preferably 5 nm or greater and 20 nm or less, further preferably 5 nm or greater and 10 nm or less, approximately.

The insulator 272 is preferably formed under an atmosphere containing oxygen by a sputtering method. In this embodiment, as the insulator 272, an aluminum oxide film is formed in an atmosphere containing oxygen by a sputtering method. Accordingly, oxygen can be added to surfaces in contact with the insulator 272 (the side surfaces of the oxides 230*a* and 230*b*, the top surface of the insulator 224, and the like) and the periphery, so that the insulator 272 can be in an oxygen excess state. Although the oxygen is added as an oxygen radical here, for example, the state of the oxygen at the time of being added is not limited thereto. The oxygen may be added as an oxygen atom, an oxygen ion, or the like. Heat treatment in a later step or the like can diffuse oxygen so that oxygen can be supplied to the oxide 230*b* effectively.

Note that the insulator 272 is preferably formed while the substrate is being heated. The substrate is heated preferably to higher than 100° C. and lower than or equal to 200° C., further preferably higher than 120° C. and lower than or equal to 150° C. Water in the oxide 230 can thus be removed at a substrate temperature of higher than 100° C. Moreover, water can be prevented from adsorbing on the surface of the formed film. The substrate is preferably heated at temperatures as low as possible. The film formed at low temperatures can have a high gettering function of impurities contained in a film which is in contact with the formed film in heat treatment performed later. For example, when the insulator 272 is deposited at around 130° C., hydrogen contained in the insulator 224, the oxide 230a, the oxide 230b, and the like can be gettered by the insulator 272.

Even when impurities such as water are removed by the heat treatment before the formation of the insulator 272, impurities such as water or hydrogen may enter the oxide 230 or the like again because of exposure to outside air before the formation. However, as described in this embodiment, the formation of the insulator 272 is successively performed following the heat treatment in the same deposition apparatus without exposure to outside air, so that the transistor 200 and the transistor 400 can be covered with the insulator 272 without entry of impurities such as water. Moreover, the insulator 272 can contain a larger amount of oxygen when oxygen is added to a site formed by the release of impurities such as water or hydrogen by the heat treatment before the formation of the insulator 272. In the case where heat treatment and the formation of the insulator 272 are performed in different chambers of a multi-chamber deposition apparatus, the insulator 272 can be formed without being influenced by impurities such as water released by the heat treatment.

The insulator 272 is preferably formed using an insulating material which is less likely to transmit impurities such as water or hydrogen. Aluminum oxide is used in this embodiment. In addition, when a sputtering method is used for forming the insulator 272, the insulator 272 can be formed at a higher deposition rate than the insulator 274 and a stacked film of the insulators 272 and 274 can have a large thickness with high productivity. In this manner, a barrier property against impurities such as water or hydrogen can be improved with high productivity.

Then, the insulator 274 is formed over the insulator 272 by an ALD method (see FIGS. 19A to 19E). In this embodiment, the thickness of the insulator 274 is 5 nm or greater and 20 nm or less, preferably 5 nm or greater and 10 nm or less, further preferably 5 nm or greater and 7 nm or less, approximately.

The insulator 274 is preferably formed using an insulating material which is less likely to transmit impurities such as water or hydrogen, and for example, is preferably formed using aluminum oxide or the like. When the insulator 274 is formed by an ALD method, formation of cracks, pinholes, or the like can be suppressed, and the insulator 274 can be formed with good coverage. Although the insulators 272 and 274 are formed over an uneven structure, by forming the insulator 274 by an ALD method, disconnection, cracks, pinholes, or the like are not formed, and the transistors 200 and 400 can be covered with the insulator 274. Thus, the barrier property against impurities such as water or hydrogen can be improved noticeably.

Next, the microwave-excited plasma treatment is preferably performed. The above description can be referred to for the microwave-excited plasma treatment. In this embodiment, the microwave-excited plasma treatment is performed preferably for five minutes. The plasma is generated preferably under the following conditions: the atmosphere contains argon (Ar) at a flow rate of 150 sccm and oxygen ($O_2$) at a flow rate of 50 sccm, the pressure in a reaction chamber is 60 Pa, and microwave of 4000 W (2.45 GHz) is used.

By the microwave-excited plasma treatment, in the transistor 200, oxygen contained in the insulator 224, the insulator 250, and the like can be released. As a result, oxygen vacancies in the oxide 230a, the oxide 230b, and the oxide 230c can be reduced. Also in the transistor 400, oxygen contained in the insulator 224, the insulator 450, and the like is released and supplied to the oxide 430, particularly to a channel formation region of the oxide 430.

The insulator 212, the insulator 214, the insulator 222, the insulator 272, and the insulator 274 can prevent oxygen from diffusing above and below the transistor 200 and the transistor 400. Thus, oxygen can be supplied to the oxide 230b and the oxide 430 effectively.

By the microwave-excited plasma treatment, the hydrogen contained in the insulator 224, the oxide 230a, the oxide 230b, and the like are gettered by the insulator 272 and is out-diffused as water from the upper part of the insulator 274.

Each of the insulator 272 and the insulator 274 has a function of out-diffusing the hydrogen contained in the insulator 224, the oxide 230a, the oxide 230b, and the like and releasing it as water outside the insulator 274. Note that the function of gettering impurities in the oxide 230b and the like is enhanced when the insulator 272 is deposited at low temperatures.

The function of each of the insulator 272 and the insulator 274 produces an effect similar to a catalyst. In other words, the insulator 272 and the insulator 274 each serve as a catalyst. In this manner, impurities such as hydrogen in the insulator 250, the oxide 230a, and the oxide 230b can be further reduced.

As described above, when the transistors 200 and 400 are positioned between the insulators 274 and 272 and the insulators 214 and 212, a large amount of oxygen can be contained in the insulator 224, the oxide 230, and the insulator 250 without diffusing outward. Furthermore, impurities such as water or hydrogen can be prevented from entering from an upper layer over the insulator 274 and a lower layer below the insulator 212, and thus the concentration of impurities in the insulator 224, the oxide 230, and the insulator 250 can be lowered.

In this manner, oxygen vacancies in the oxide 230b functioning as an active layer of the transistor 200 are reduced, and the concentration of impurities such as water or hydrogen is reduced; accordingly, the electrical characteristics of the transistor 200 are made stable, and the reliability can be improved.

Then, the insulator 280 is formed over the insulator 274. In this embodiment, a silicon nitride film formed by a plasma CVD method is used as the insulator 280.

Next, CMP treatment is performed to reduce unevenness of a surface of the insulator 280 (see FIGS. 20A to 20E).

Figure 22C:
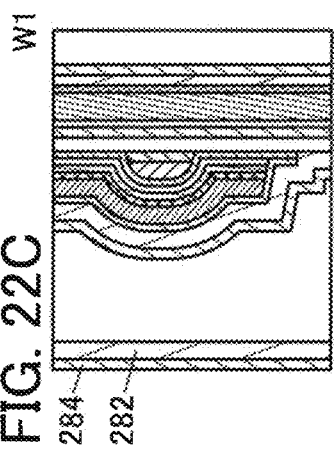
FIGS. 22A to 22E illustrate a method for manufacturing a transistor of one embodiment of the present invention.
Figure 22D:
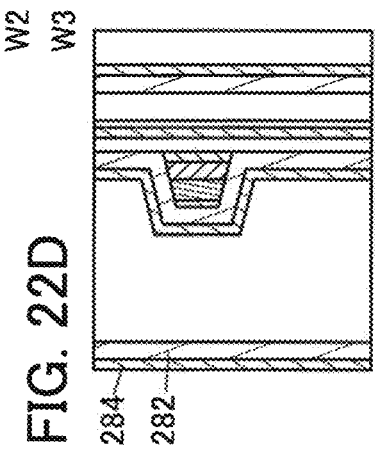
Figure 22E:
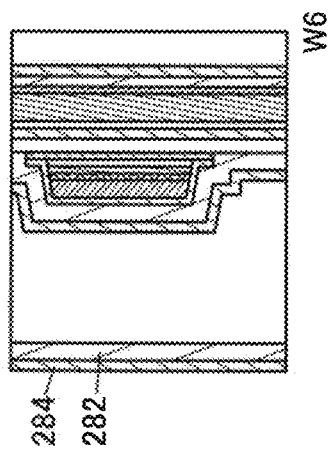
Figure 22A:
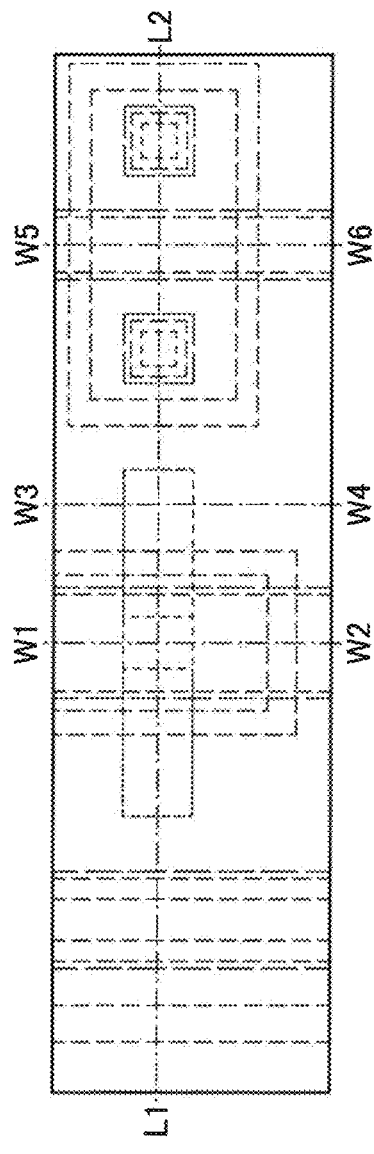
Figure 22B:
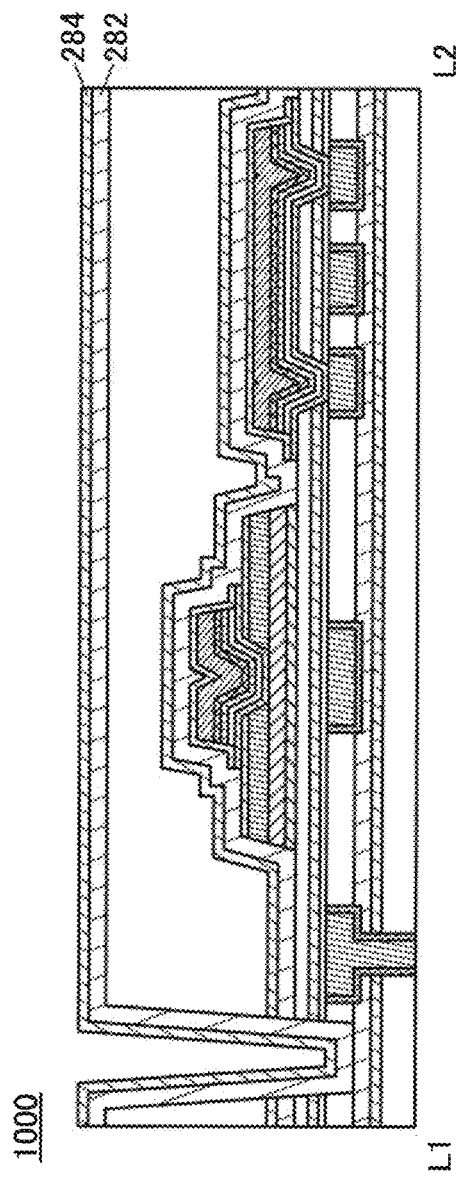

Then, in the insulators 216, 220, 222, 224, 272, 274, and 280, the opening 480 is formed to reach the insulator 214 (see FIGS. 21A to 21E). Note that although part of the opening 480 extending in the W1-W2 direction is illustrated in FIG. 22A, the opening 480 is formed to surround the transistors 200 and 400.

Here, the opening 480 is preferably formed inside dicing lines or scribe lines along which the semiconductor device 1000 is cut out. In this way, even when the semiconductor device 1000 is cut out, the side surfaces of the insulator 280, the insulator 224, the insulator 216, and the like remain sealed with the insulators 282 and 284 which are formed in a later step; therefore, impurities such as water or hydrogen can be prevented from diffusing from the insulators into the transistors 200 and 400. Note that a plurality of regions surrounded by the opening 480 may be provided and a plurality of semiconductor devices may be sealed with the insulators 282 and 284 separately.

Subsequently, like the formation process of the insulator 272, the substrate is carried into the deposition apparatus including a plurality of chambers, and heat treatment is performed in the chamber of the deposition apparatus. By this treatment, moisture such as adsorbed water can be removed before the insulator 282 is formed. Next, the insulator 282 is formed by a sputtering method in a different chamber of the above deposition apparatus from the chamber in which the heat treatment is performed. The formation of the insulator 282 is successively performed following the heat treatment in Step S14 without exposure of the substrate to outside air.

The insulator 282 is formed in contact with the top surface of the insulator 214 in the opening 480. Thus, the transistors 200 and 400 can be surrounded and sealed with the insulator 282 in not only a perpendicular direction but also a lateral direction of the substrate. Accordingly, impurities such as water or hydrogen can be prevented from diffusing from the outside of the insulator 282 into the transistors 200 and 400.

As described in this embodiment, when the formation of the insulator 272 and the insulator 282 is successively performed following the heat treatment without exposure of the substrate to outside air, the transistors 200 and 400 can be covered with the insulator 282 without entry of impurities such as water or hydrogen. Moreover, the insulator 282 can contain a larger amount of oxygen by adding oxygen to a site formed by the release of impurities such as water or hydrogen in the heat treatment. In the case where heat treatment and forming are performed in different chambers of a multi-chamber deposition apparatus, the insulator 282 can be formed without being influenced by impurities such as water or hydrogen released by the heat treatment.

Then, the insulator 284 is formed over the insulator 282 by an ALD method (see FIGS. 22A to 22E).

The insulator 284 is preferably formed using an insulating material which is less likely to transmit impurities such as water or hydrogen, and for example, is preferably formed using aluminum oxide or the like. When the insulator 284 is formed by an ALD method, formation of cracks, pinholes, or the like can be suppressed, and the insulator 284 can be formed with good coverage. The insulator 282 can be formed without disconnection even in the opening 480 when formed by an ALD method; thus, the barrier property against impurities can be further improved.

Next, the microwave-excited plasma treatment is preferably performed. By the microwave-excited plasma treatment, the hydrogen contained in the insulator 280 and the like is gettered by the insulator 282 and is out-diffused as water from the upper part of the insulator 282. In this manner, impurities such as hydrogen contained in the insulator 280 can be reduced.

Through the above steps, the transistor 200, the transistor 400, and the semiconductor device 1000 are formed. By the above-described manufacturing method, the transistors 200 and 400 having different structures can be provided over the same substrate through substantially the same process. Moreover, the transistor 400 is not necessarily manufactured after the transistor 200 is manufactured, for example; thus, the producibility of the semiconductor device can be increased.

In the transistor 200, a channel is formed in the oxide 230b, which is in contact with the oxides 230a and 230c. In the transistor 400, a channel is formed in the oxide 230c, which is in contact with the insulators 224 and 450. Thus, the transistor 400 is likely to be affected by interface scattering compared with the transistor 200. The electron affinity of the oxide 230c in this embodiment is lower than that of the oxide 230b. Thus, the transistor 400 can have higher $V_{th}$ and lower $I_{cut}$ than the transistor 200.

Modification Example

The structure of the semiconductor device in this embodiment is not limited to the structure in FIGS. 1A to 1E. For example, a structure in FIGS. 23A to 23E may be employed.

The semiconductor device 1000 in FIGS. 23A to 23E is different from the semiconductor device 1000 in FIGS. 1A to 1E in that the opening 480 is formed in the insulators 216, 220, 222, and 224 and the insulator 272 is in contact with a top surface of the insulator 214. Thus, the transistors 200 and 400 are contained in the insulators 212, 214, 272, and 274. In this case, even when the insulators 282 and 284 are not provided, entry of impurities such as water or hydrogen from the side surfaces of the insulators 216 and 224 can be prevented.

Moreover, the semiconductor device 1000 in FIGS. 23A to 23E is different from the semiconductor device 1000 in FIGS. 1A to 1E in that the layer 270, the insulator 250, and the oxide 230c extend beyond the end portions of the conductor 260 and overlap with each other in the extending portions, and end portions of the layer 270, the insulator 250, and the oxide 230c are substantially aligned. In this structure, the insulator 272 and side surfaces of the insulator 250 are in contact with each other. Therefore, the insulator 272 can supply oxygen to the insulator 250. Furthermore, impurities such as hydrogen contained in the insulator 250 can be gettered by the insulator 272 and diffused outward.

As described above, one embodiment of the present invention can provide a semiconductor device having favorable reliability. Alternatively, according to one embodiment of the present invention, a semiconductor device including an oxide in which the concentration of impurities is reduced can be provided. Alternatively, according to one embodiment of the present invention, a semiconductor device including an oxide in which oxygen vacancies are reduced can be provided.

This embodiment can be implemented in an appropriate combination with any of the structures described in the other embodiments, example, and the like.

Embodiment 2

In this embodiment, embodiments of semiconductor devices will be described with reference to FIG. 27 to FIG. 29.

[Memory Device]

Figure 27:
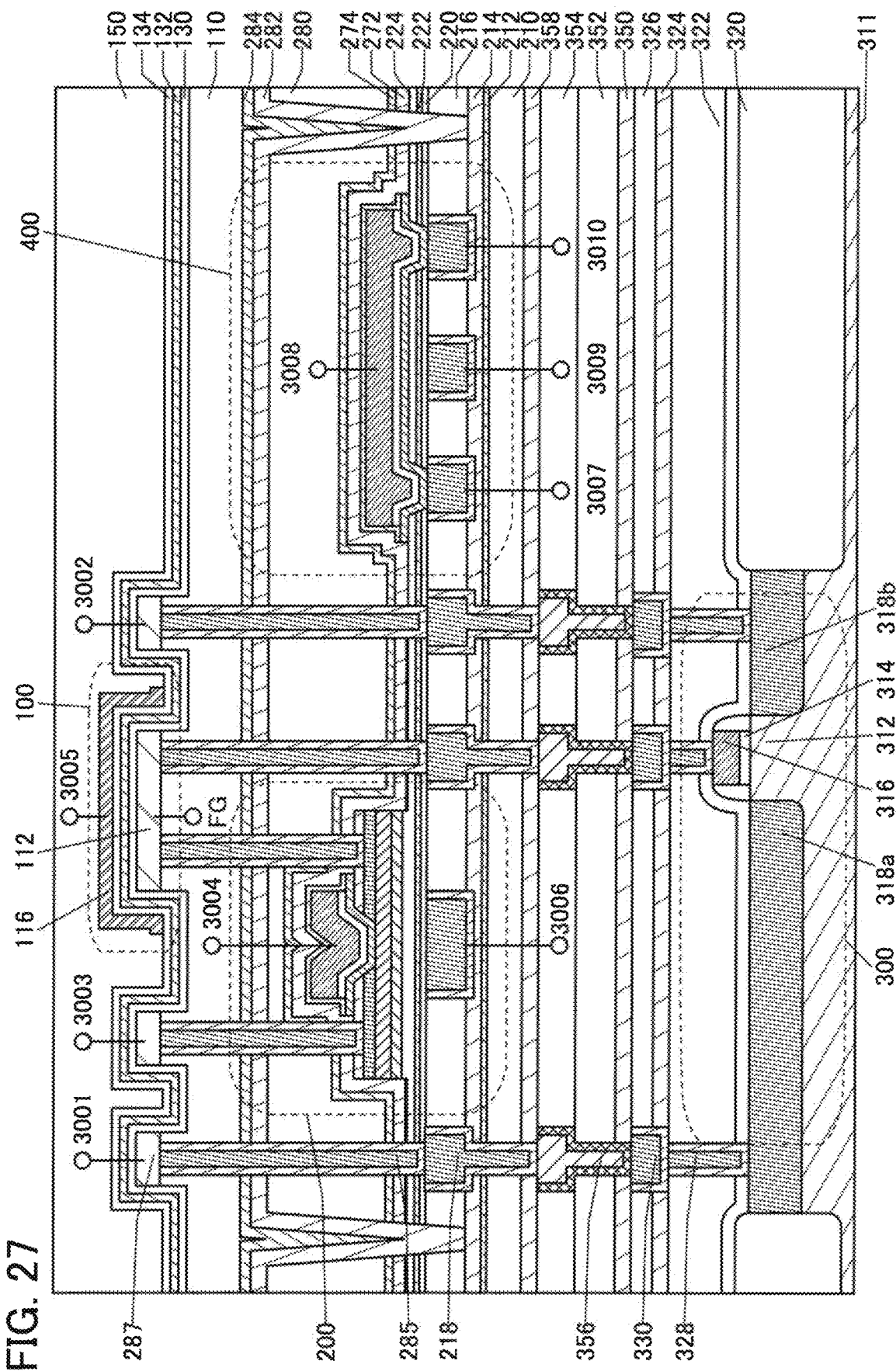
FIG. 27 is a cross-sectional view of a semiconductor device of one embodiment of the present invention.
Figure 28:
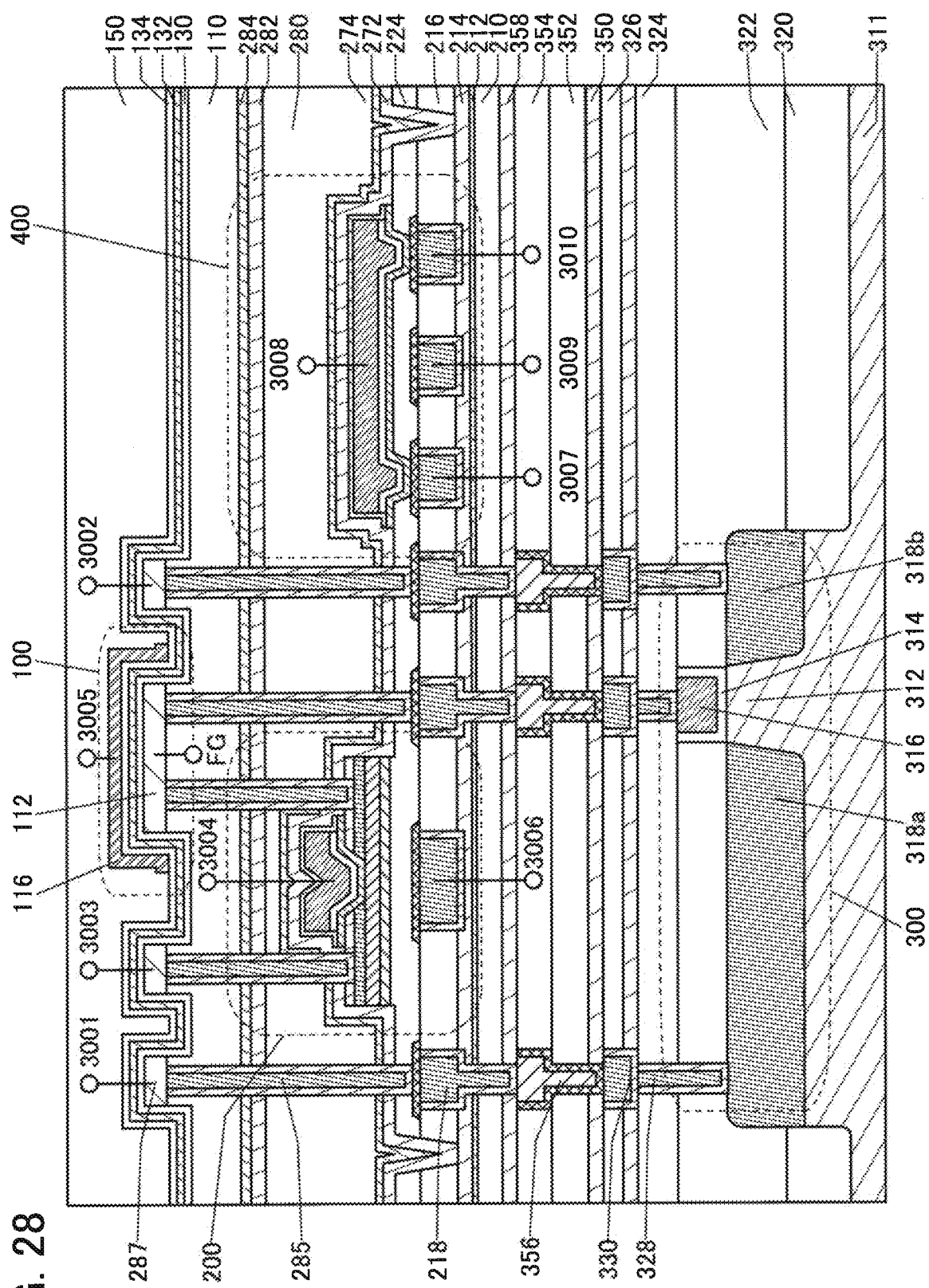
FIG. 28 is a cross-sectional view of a semiconductor device of one embodiment of the present invention.
Figure 29:
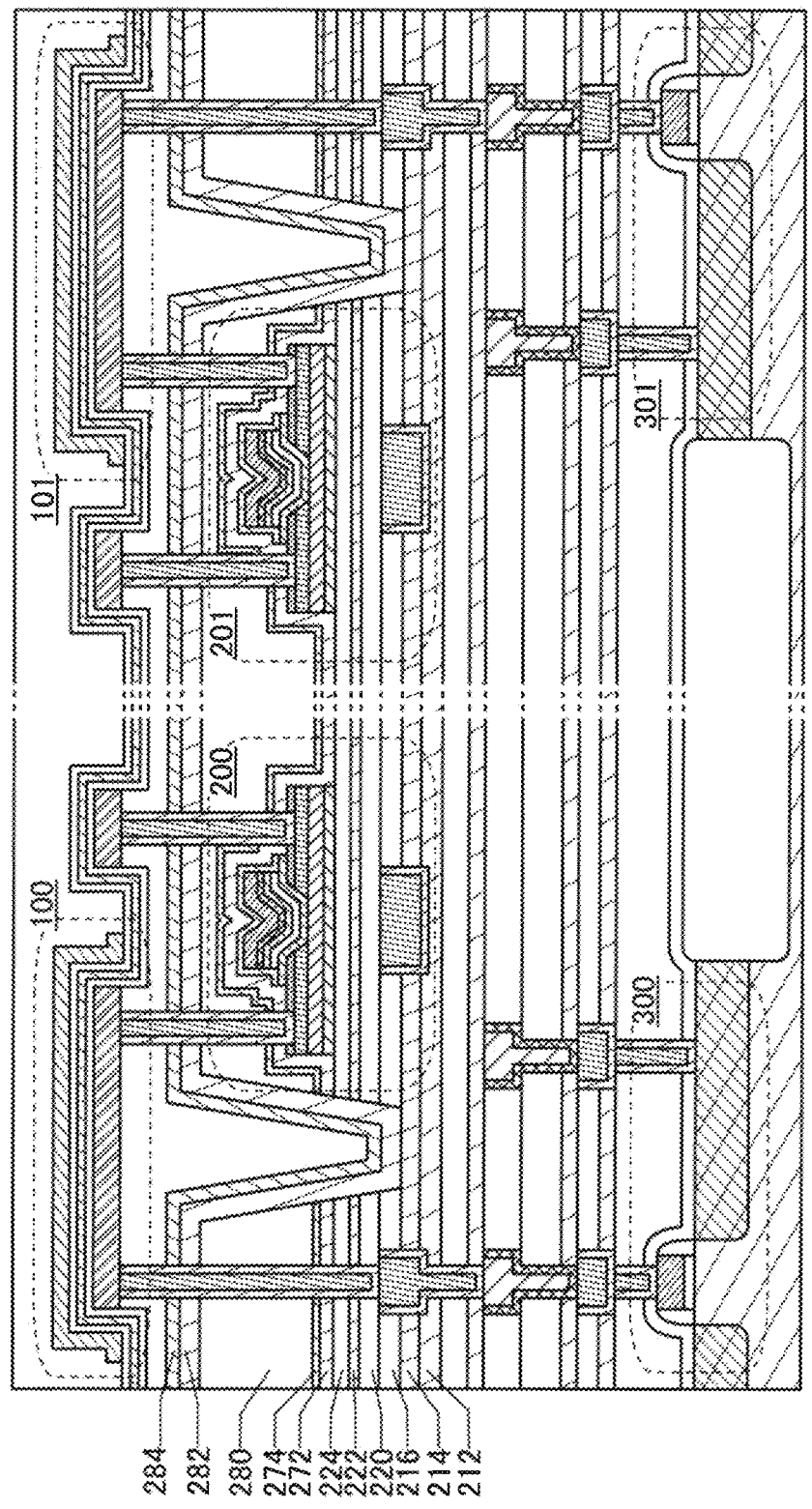
FIG. 29 is a cross-sectional view of a semiconductor device of one embodiment of the present invention.

FIG. 27 to FIG. 29 each illustrate an example of a memory device using the semiconductor device of one embodiment of the present invention.

The memory devices in FIG. 27 and FIG. 28 each include the transistor 400, a transistor 300, the transistor 200, and a capacitor 100. The transistors 200 and 400 are similar to those described in the Embodiment 1.

The transistor 200 is a transistor in which a channel is formed in a semiconductor layer including an oxide. Since the off-state current of the transistor 200 is small, by using the transistor 200 in a memory device, stored data can be retained for a long time. In other words, such a memory device does not require refresh operation or has an extremely low frequency of the refresh operation, which leads to a sufficient reduction in power consumption of the memory device.

Moreover, supplying a negative potential to a back gate of the transistor 200 can further reduce the off-state current of the transistor 200. In that case, with a structure capable of maintaining the back gate voltage of the transistor 200, stored data can be retained for a long time without power supply.

The back gate voltage of the transistor 200 is controlled by the transistor 400. For example, a top gate and a back gate of the transistor 400 are diode-connected to a source thereof, and the source of the transistor 400 and the back gate of the transistor 200 are connected to each other. When the negative potential of the back gate of the transistor 200 is held in the structure, the top gate-source voltage and the back gate-source voltage of the transistor 400 are each 0 V. As described in the above embodiment, the $I_{cut}$ of the transistor 400 is extremely small. Thus, the structure allows the negative potential of the back gate of the transistor 200 to be held for a long time without power supply to the transistor 200 and the transistor 400. Accordingly, the memory device including the transistor 200 and the transistor 400 can retain stored data for a long time.

In FIG. 27 and FIG. 28, a wiring 3001 is electrically connected to a source of the transistor 300, and a wiring 3002 is electrically connected to a drain of the transistor 300. A wiring 3003 is electrically connected to one of a source and a drain of the transistor 200, a wiring 3004 is electrically connected to a top gate of the transistor 200, and a wiring 3006 is electrically connected to the back gate of transistor 200. A gate of the transistor 300 and the other of the source and the drain of the transistor 200 are electrically connected to one electrode of the capacitor 100. A wiring 3005 is electrically connected to the other electrode of the capacitor 100. A wiring 3007 is electrically connected to the source of the transistor 400, a wiring 3008 is electrically connected to the gate of the transistor 400, a wiring 3009 is electrically connected to the back gate of the transistor 400, and a wiring 3010 is electrically connected to the drain of the transistor 400. The wiring 3006, the wiring 3007, the wiring 3008, and the wiring 3009 are electrically connected to each other.

<Memory Device Configuration 1>

The memory devices in FIG. 27 and FIG. 28 have a feature that the potential of the gate of the transistor 300 can be held, and thus enables writing, retaining, and reading of data as follows.

Writing and retaining of data will be described. First, the potential of the wiring 3004 is set to a potential at which the transistor 200 is on, so that the transistor 200 is turned on. Accordingly, the potential of the wiring 3003 is supplied to a node FG where the gate of the transistor 300 and the one electrode of the capacitor 100 are electrically connected to each other. That is, predetermined charge is supplied to the gate of the transistor 300 (writing). Here, one of two kinds of charge that provide different potential levels (hereinafter, referred to as low-level charge and high-level charge) is supplied. After that, the potential of the wiring 3004 is set to a potential at which the transistor 200 is off, so that the transistor 200 is turned off. Thus, the charge is retained in the node FG (retaining).

Since the off-state current of the transistor 200 is small, the charge of the node FG is retained for a long time.

Next, reading of data will be described. An appropriate potential (reading potential) is supplied to the wiring 3005 while a predetermined potential (constant potential) is supplied to the wiring 3001, whereby the potential of the wiring 3002 varies depending on the amount of charge retained in the node FG. This is because in the case of using an n-channel transistor as the transistor 300, an apparent threshold voltage $V_{th\_H}$ at the time when the high-level charge is given to the gate of the transistor 300 is lower than an apparent threshold voltage $V_{th\_L}$ at the time when the low-level charge is given to the gate of the transistor 300. Here, an apparent threshold voltage refers to the potential of the wiring 3005 which is needed to turn on the transistor 300. Thus, the potential of the wiring 3005 is set to a potential $V_0$ which is between $V_{th\_H}$ and $V_{th\_L}$, whereby charge supplied to the node FG can be determined. For example, in the case where the high-level charge is supplied to the node FG in writing, the transistor 300 is turned on when the potential of the wiring 3005 becomes $V_0$ ($>V_{th\_H}$). In the case where the low-level charge is supplied to the node FG in writing, the transistor 300 still remains off even when the potential of the wiring 3005 becomes $V_0$ ($<V_{th\_L}$). Thus, the data retained in the node FG can be read by determining the potential of the wiring 3002.

By arranging the memory devices illustrated in FIG. 27 and FIG. 28 in a matrix, a memory cell array can be formed.

Note that in the case where memory cells are arrayed, it is necessary that data of a desired memory cell be read in read operation. For example, in the case of a NOR-type memory cell array, only data of a desired memory cell can be read by turning off the transistors 300 of memory cells from which data is not read. In this case, a potential at which the transistor 300 is turned off regardless of the charge supplied to the node FG, that is, a potential lower than $V_{th\_H}$ is supplied to the wiring 3005 connected to the memory cells from which data is not read. Alternatively, in the case of a NAND-type memory cell array, for example, only data of a desired memory cell can be read by turning on the transistors 300 of memory cells from which data is not read. In this case, a potential at which the transistor 300 is turned on regardless of the charge supplied to the node FG, that is, a potential higher than $V_{th\_L}$ is supplied to the wiring 3005 connected to the memory cells from which data is not read.

<Memory Device Configuration 2>

The memory devices illustrated in FIG. 27 and FIG. 28 do not necessarily include the transistor 300. Also in that case, data can be written and retained in a manner similar to that of the memory device described above.

For example, data reading in the memory device without the transistor 300 will be described. When the transistor 200 is turned on, the wiring 3003 which is in a floating state and the capacitor 100 are brought into conduction, and the charge is redistributed between the wiring 3003 and the capacitor 100. As a result, the potential of the wiring 3003 is changed. The amount of change in the potential of the wiring 3003 varies depending on the potential of the one electrode of the capacitor 100 (or the charge accumulated in the capacitor 100).

For example, the potential of the wiring 3003 after the charge redistribution is $(C_B \times V_{B0} + C \times V)/(C_B + C)$, where V is the potential of the one electrode of the capacitor 100, C is the capacitance of the capacitor 100, $C_B$ is the capacitance component of the wiring 3003, and $V_{B0}$ is the potential of the wiring 3003 before the charge redistribution. Thus, it can be found that, assuming that the memory cell is in either of two states in which the potential of the one electrode of the capacitor 100 is $V_1$ and $V_0$ ($V_1 > V_0$), the potential of the wiring 3003 when the potential $V_1$ is retained (=$(C_B \times V_{B0} + C \times V_1)/(C_B + C)$) is higher than the potential of the wiring 3003 when the potential $V_0$ is retained (=$(C_B \times V_{B0} + C \times V_0)/(C_B + C)$).

Then, by comparing the potential of the wiring 3003 with a predetermined potential, data can be read.

In the case of employing the configuration, a transistor using silicon may be used for a driver circuit for driving a memory cell, and a transistor using an oxide may be stacked as the transistor 200 over the driver circuit.

When including a transistor using an oxide and having a small off-state current, the memory device described above can retain stored data for a long time. In other words, power consumption of the memory device can be reduced because refresh operation becomes unnecessary or the frequency of refresh operation can be extremely low. Moreover, stored data can be retained for a long time even when power is not supplied (note that a potential is preferably fixed).

In the memory device, a high voltage is not needed for data writing and deterioration of elements is unlikely to occur. Unlike in a conventional nonvolatile memory, for example, it is not necessary to inject and extract electrons into and from a floating gate; thus, a problem such as deterioration of an insulator is not caused. That is, unlike a conventional nonvolatile memory, the memory device of one embodiment of the present invention does not have a limit on the number of times data can be rewritten and the reliability thereof is drastically improved. Furthermore, data is written depending on the on/off state of the transistor, whereby high-speed operation can be achieved.

<Memory Device Structure 1>

FIG. 27 illustrates an example of the memory device of one embodiment of the present invention. The memory device includes the transistor 400, the transistor 300, the transistor 200, and the capacitor 100. The transistor 200 is provided over the transistor 300, and the capacitor 100 is provided over the transistor 300 and the transistor 200.

The transistor 300 is provided over a substrate 311 and includes a conductor 316, an insulator 314, a semiconductor region 312 that is part of the substrate 311, and low-resistance regions 318a and 318b functioning as source and drain regions.

The transistor 300 is either a p-channel transistor or an n-channel transistor.

It is preferable that a region of the semiconductor region 312 where a channel is formed, a region in the vicinity thereof, the low-resistance regions 318a and 318b functioning as source and drain regions, and the like include a semiconductor such as a silicon-based semiconductor, more preferably single crystal silicon. Alternatively, a material including germanium (Ge), silicon germanium (SiGe), gallium arsenide (GaAs), gallium aluminum arsenide (GaAlAs), or the like may be included. Silicon whose effective mass is controlled by applying stress to the crystal lattice and thereby changing the lattice spacing may be included. Alternatively, the transistor 300 may be a high-electron-mobility transistor (HEMT) with GaAs and GaAlAs or the like.

The low-resistance regions 318a and 318b include an element which imparts n-type conductivity, such as arsenic or phosphorus, or an element which imparts p-type conductivity, such as boron, in addition to a semiconductor material used for the semiconductor region 312.

The conductor 316 functioning as a gate electrode can be formed using a semiconductor material such as silicon including an element which imparts n-type conductivity, such as arsenic or phosphorus, or an element which imparts p-type conductivity, such as boron, or a conductive material such as a metal material, an alloy material, or a metal oxide material.

Note that the work function of a conductor is determined by a material of the conductor, whereby the threshold voltage can be adjusted. Specifically, it is preferable to use titanium nitride, tantalum nitride, or the like as the conductor. Furthermore, in order to ensure the conductivity and embeddability of the conductor, it is preferable to use a laminated layer of metal materials such as tungsten and aluminum as the conductor. In particular, tungsten is preferable in terms of heat resistance.

Note that the transistors 300 illustrated in FIG. 27 are just examples and are not limited to the structures illustrated therein; an appropriate transistor may be used in accordance with a circuit configuration or a driving method. Note that when the memory device has the structure described in <Memory Device Configuration 2>, the transistor 300 is not necessarily provided.

An insulator 320, an insulator 322, an insulator 324, and an insulator 326 are stacked in this order so as to cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, aluminum nitride, or the like.

The insulator 322 may function as a planarization film for eliminating a level difference caused by the transistor 300 or the like underlying the insulator 322. The top surface of the insulator 322 may be planarized by planarization treatment using a CMP method or the like to increase the level of planarity.

The insulator 324 is preferably formed using a film with a barrier property that prevents hydrogen and impurities from diffusing from the substrate 311, the transistor 300, or the like into regions where the transistor 200 and the transistor 400 are provided. A barrier property refers to a function of inhibiting the diffusion of impurities typified by hydrogen and water. For example, the diffusion length of hydrogen in the film with a barrier property at 350° C. or at 400° C. is less than or equal to 50 nm per hour, preferably less than or equal to 30 nm per hour, more preferably less than or equal to 20 nm per hour.

As an example of the film having a barrier property against hydrogen, silicon nitride formed by a CVD method can be given. The diffusion of hydrogen into a semiconductor element including an oxide, such as the transistor 200, degrades the characteristics of the semiconductor element in some cases. Therefore, a film that inhibits the diffusion of hydrogen is preferably provided between the transistors 200 and 400 and the transistor 300. Specifically, the film that inhibits the diffusion of hydrogen is a film from which hydrogen is unlikely to be released.

The released amount of hydrogen can be measured by TDS, for example. The amount of hydrogen released from the insulator 324 that is converted into hydrogen molecules per unit area of the insulator 324 is less than or equal to $2\times10^{15}$ molecules/cm$^2$, preferably less than or equal to $1\times10^{15}$ molecules/cm$^2$, more preferably $5\times10^{14}$ molecules/cm$^2$ in TDS analysis in the range from 50° C. to 500° C., for example.

Note that the dielectric constant of the insulator 326 is preferably lower than that of the insulator 324. For example, the relative dielectric constant of the insulator 326 is preferably lower than 4, more preferably lower than 3. For example, the relative dielectric constant of the insulator 324 is preferably 0.7 times or less that of the insulator 326, more preferably 0.6 times or less that of the insulator 326. In the case where a material with a low dielectric constant is used for an interlayer film, the parasitic capacitance between wirings can be reduced.

A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 each function as a plug or a wiring. Note that a plurality of structures of conductors functioning as plugs or wirings are collectively denoted by the same reference numeral in some cases, as described later. Furthermore, in this specification and the like, a wiring and a plug electrically connected to the wiring may be a single component. That is, there are cases where part of a conductor functions as a wiring and part of a conductor functions as a plug.

As a material of each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 27, an insulator 350, an insulator 352, and an insulator 354 are stacked in this order. Furthermore, a conductor 356 is formed in the insulator 350, the insulator 352, and the insulator 354. The conductor 356 functions as a plug or a wiring. Note that the conductor 356 can be formed using a material similar to that for the conductor 328 and the conductor 330.

Note that for example, the insulator 350 is preferably formed using an insulator having a barrier property against hydrogen, like the insulator 324. Furthermore, the conductor 356 preferably includes a conductor having a barrier property against hydrogen. The conductor having a barrier property against hydrogen is formed particularly in an opening portion of the insulator 350 having a barrier property against hydrogen. In such a structure, the transistor 300 can be separated from the transistors 200 and 400 by a barrier layer, so that the diffusion of hydrogen from the transistor 300 into the transistors 200 and 400 can be inhibited.

Note that as the conductor having a barrier property against hydrogen, tantalum nitride is preferably used, for example. By stacking tantalum nitride and tungsten, which has high conductivity, the diffusion of hydrogen from the transistor 300 can be inhibited while the conductivity of a wiring is ensured. In this case, a tantalum nitride layer having a barrier property against hydrogen is preferably in contact with the insulator 350 having a barrier property against hydrogen.

An insulator 358, an insulator 210, the insulator 212, the insulator 214, and the insulator 216 are stacked in this order over the insulator 354. A material having a barrier property against oxygen or hydrogen is preferably used for any of the insulator 358, the insulator 210, the insulator 212, the insulator 214, and the insulator 216.

The insulator 358, the insulator 212, and the insulator 214 are each preferably formed using, for example, a film having a barrier property that prevents hydrogen or impurities from diffusing from the substrate 311, a region where the transistor 300 is provided, or the like into the regions where the transistor 200 and the transistor 400 are provided. Therefore, the insulator 358, the insulator 212, and the insulator 214 can be formed using a material similar to that for the insulator 324.

As an example of the film having a barrier property against hydrogen, silicon nitride deposited by a CVD method can be given. The diffusion of hydrogen into a semiconductor element including an oxide, such as the transistor 200, degrades the characteristics of the semiconductor element in some cases. Therefore, a film that inhibits the diffusion of hydrogen is preferably provided between the transistors 200 and 400 and the transistor 300. Specifically, the film that inhibits the diffusion of hydrogen is a film from which hydrogen is unlikely to be released.

As the film having a barrier property against hydrogen, for example, as each of the insulator 212 and the insulator 214, a metal oxide such as aluminum oxide, hafnium oxide, or tantalum oxide is preferably used.

In particular, aluminum oxide has an excellent blocking effect that prevents the passage of oxygen and impurities such as water or hydrogen which cause a change in electrical characteristics of the transistor. Accordingly, the use of aluminum oxide can prevent entry of impurities such as water or hydrogen into the transistors 200 and 400 in and after a manufacturing process of the transistor. In addition, release of oxygen from the oxide in the transistor 200 can be inhibited. Therefore, aluminum oxide is suitably used as a protective film for the transistors 200 and 400.

In addition, the insulator 210 and the insulator 216 can be formed using a material similar to that for the insulator 320. The use of a material with a relatively low dielectric constant for the insulators can reduce the parasitic capacitance between wirings. For example, a silicon oxide film, a silicon oxynitride film, or the like can be used as the insulator 216.

A conductor 218, conductors included in the transistor 200 and the transistor 400 (the conductor 205, the conductor 405, the conductor 403, and the conductor 407), and the like are embedded in the insulator 358, the insulator 210, the insulator 212, the insulator 214, and the insulator 216. Note that the conductor 218 functions as a plug or a wiring that is electrically connected to the capacitor 100 or the transistor 300. The conductor 218 can be formed using a material similar to that for the conductor 328 and the conductor 330.

In particular, the conductor 218 in a region in contact with the insulator 358, the insulator 212, and the insulator 214 is preferably a conductor having a barrier property against oxygen, hydrogen, and water. In such a structure, the transistor 300 and the transistor 200 can be completely separated by the layer having a barrier property against oxygen, hydrogen, and water, so that the diffusion of hydrogen from the transistor 300 into the transistors 200 and 400 can be inhibited.

The transistor 200 and the transistor 400 are provided over the insulator 216. Note that as the transistors 200 and 400, the transistors 200 and 400 described in Embodiment 1 are preferably used.

An insulator 110 is provided over the transistor 200 and the transistor 400. The insulator 110 can be formed using a material similar to that for the insulator 320. The use of a material with a relatively low dielectric constant for the insulator can reduce the parasitic capacitance between wirings. For example, a silicon oxide film, a silicon oxynitride film, or the like can be used as the insulator 110.

A conductor 285 and the like are embedded in the insulator 220, the insulator 222, the insulator 224, the insulator 272, the insulator 274, and the insulator 110.

Note that the conductor 285 functions as a plug or a wiring that is electrically connected to the capacitor 100, the transistor 200, or the transistor 300. The conductor 285 can be formed using a material similar to that for the conductor 328 and the conductor 330.

For example, in the case where the conductor 285 is formed to have a stacked-layer structure, it preferably includes a conductor that is unlikely to be oxidized (that has high oxidation resistance). It is particularly preferred that a conductor having high oxidation resistance be provided so as to be in contact with the insulator 224 including an excess oxygen region. Such a structure permits inhibition of absorption of excess oxygen from the insulator 224 by the conductor 285. Furthermore, the conductor 285 preferably includes a conductor having a barrier property against hydrogen. In particular, when a conductor having a barrier property against impurities such as hydrogen is provided in contact with the insulator 224 including an excess oxygen region, the diffusion of impurities in the conductor 285 and part of the conductor 285 and the diffusion of impurities from the outside through the conductor 285 can be inhibited.

A conductor 287, the capacitor 100, and the like are provided over the insulator 110 and the conductor 285. The capacitor 100 includes a conductor 112, an insulator 130, an insulator 132, an insulator 134, and a conductor 116. The conductor 112 and the conductor 116 function as the electrodes of the capacitor 100, and the insulator 130, the insulator 132, and the insulator 134 function as dielectrics of the capacitor 100.

Note that the conductor 287 functions as a plug or a wiring that is electrically connected to the capacitor 100, the transistor 200, or the transistor 300. The conductor 112 functions as the one electrode of the capacitor 100. The conductor 287 and the conductor 112 can be formed at the same time.

For the conductor 287 and the conductor 112, a metal film containing an element selected from molybdenum, titanium, tantalum, tungsten, aluminum, copper, chromium, neodymium, and scandium; a metal nitride film containing any of the above elements as its component (e.g., a tantalum nitride film, a titanium nitride film, a molybdenum nitride film, or a tungsten nitride film); or the like can be used. Alternatively, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used.

The insulator 130, the insulator 132, and the insulator 134 can each be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like.

For example, the use of a high dielectric constant (high-k) material, such as aluminum oxide, for the insulator 132 can increase the capacitance per unit area of the capacitor 100. Furthermore, a material having high dielectric strength, such as silicon oxynitride, is preferably used for the insulator 130 and the insulator 134. When a ferroelectric is located between insulators with high dielectric strength, electrostatic breakdown of the capacitor 100 can be suppressed and the capacitor can have large capacitance.

The conductor 116 is provided so as to cover the top and side surfaces of the conductor 112 with the insulator 130, the insulator 132, and the insulator 134 therebetween. In the structure where the side surfaces of the conductor 112 are wrapped by the conductor 116 with the insulators therebetween, capacitance is also formed on the side surfaces of the conductor 112, resulting in an increase in the capacitance per unit projected area of the capacitor. Thus, the memory device can be reduced in area, highly integrated, and miniaturized.

Note that the conductor 116 can be formed using a conductive material such as a metal material, an alloy material, or a metal oxide material. It is preferable to use a high-melting-point material which has both heat resistance and conductivity, such as tungsten or molybdenum, and it is particularly preferable to use tungsten. In the case where the conductor 116 is formed concurrently with another component such as a conductor, Cu, Al, or the like, which is a low-resistance metal material, may be used.

An insulator 150 is provided over the conductor 116 and the insulator 134. The insulator 150 can be formed using a material similar to that for the insulator 320. The insulator 150 may function as a planarization film that covers roughness due to underlying layers.

The above is the description of the structure example. With the use of the structure, a change in electrical characteristics can be suppressed and reliability can be improved in a memory device including a transistor including an oxide. Alternatively, a transistor including an oxide with a large on-state current can be provided. A transistor including an oxide with a small off-state current can be provided. Alternatively, a memory device with low power consumption can be provided.

Modification Example 1

FIG. 28 illustrates a modification example of the memory device. FIG. 28 is different from FIG. 27 in the structure of the transistor 300 and the shape or the like of the insulators 272 and 274.

In the transistor 300 illustrated in FIG. 28, the semiconductor region 312 (part of the substrate 311) in which a channel is formed includes a protruding portion. Furthermore, the conductor 316 is provided so as to cover the top and side surfaces of the semiconductor region 312 with the insulator 314 therebetween. Note that the conductor 316 may be formed using a material for adjusting the work function. The transistor 300 is also referred to as a FIN transistor because it utilizes a protruding portion of the semiconductor substrate. An insulator functioning as a mask for forming the protruding portion may be provided in contact with the top surface of the protruding portion. Although the case where the protruding portion is formed by processing part of the semiconductor substrate is described here, a semiconductor film having a protruding portion may be formed by processing an SOI substrate.

The use of a combination of the transistor 300 and the transistor 200 that have the structure enables a reduction in area, high integration, and miniaturization.

Moreover, as illustrated in FIG. 28, the insulator 220 and the insulator 222 are not necessarily provided. Such a structure can increase the producibility.

Furthermore, as illustrated in FIG. 28, a bottom surface of the insulator 272 and a top surface of the insulator 214 may be in contact with each other in openings formed in the insulator 216 and the insulator 224.

The above is the description of the modification example. With the use of the structure, a change in electrical characteristics can be suppressed and reliability can be improved in a memory device including a transistor including an oxide. Furthermore, a transistor including an oxide with a large on-state current can be provided. Furthermore, a transistor including an oxide with a small off-state current can be provided. Furthermore, a memory device with low power consumption can be provided.

Modification Example 2

FIG. 29 illustrates a modification example of this embodiment. FIG. 29 is a cross-sectional view which shows part of a row in which the memory devices each of which is illustrated in FIG. 27 are arranged in a matrix.

In FIG. 29, the memory device which includes the transistor 300, the transistor 200, and the capacitor 100 and the memory device which includes a transistor 301, a transistor 201, and a capacitor 101 are arranged in the same row.

As illustrated in FIG. 29, a plurality of transistors (the transistors 200 and 201 in the figure) and the insulator 224 including an oxygen-excess region may be enclosed with a stacked-layer structure of the insulators 212 and 214 and a stacked-layer structure of the insulators 282 and 284. At that time, a structure in which the insulators 212 and 214 and the insulators 282 and 284 are stacked is preferably formed between the transistor 200 or 201 and a through electrode which connects the transistor 300 or 301 and the capacitor 100 or 101.

Note that an opening formed in the insulators 216, 220, 222, 224, 272, 274, and 280 can be formed at the same time as the opening 480 described in Embodiment 1.

Thus, oxygen released from the insulator 224 and the transistors 200 and 201 can be inhibited from diffusing into the layer where the capacitors 100 and 101 are formed or the layer where the transistor 300 and 301 are formed. Furthermore, impurities such as water or hydrogen can be inhibited from diffusing from a layer above the insulator 282 and a layer below the insulator 214 into the transistor 200 or 201.

That is, oxygen can be efficiently supplied from the excess-oxygen region of the insulator 224 to oxide where channels are formed in the transistors 200 and 201, so that oxygen vacancies can be reduced. Moreover, oxygen vacancies can be prevented from being formed by impurities in the oxide where a channel is formed in the transistor 200. Thus, the oxide where channels are formed in the transistors 200 and 201 can be an oxide with a low density of defect states and stable characteristics. That is, a change in electrical characteristics of the transistors 200 and 201 can be prevented and the reliability can be improved.

At least part of this embodiment can be implemented in combination with any of the other embodiments described in this specification as appropriate.

Embodiment 3

<Manufacturing Apparatus>

A manufacturing apparatus which performs high-density plasma treatment according to one embodiment of the present invention will be described below.

Figure 31:
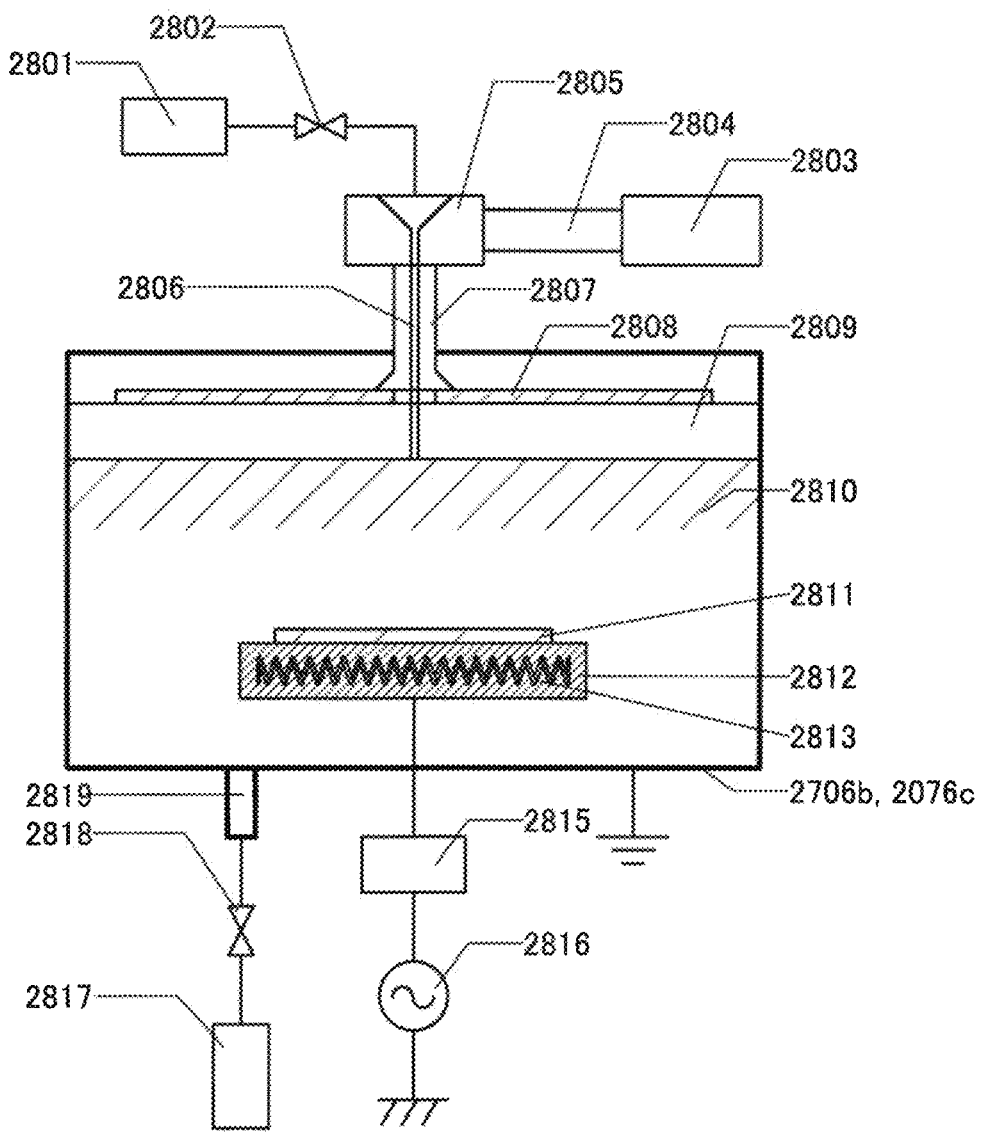
FIG. 31 is a cross-sectional view illustrating a chamber of one embodiment of the present invention.
Figure 32:
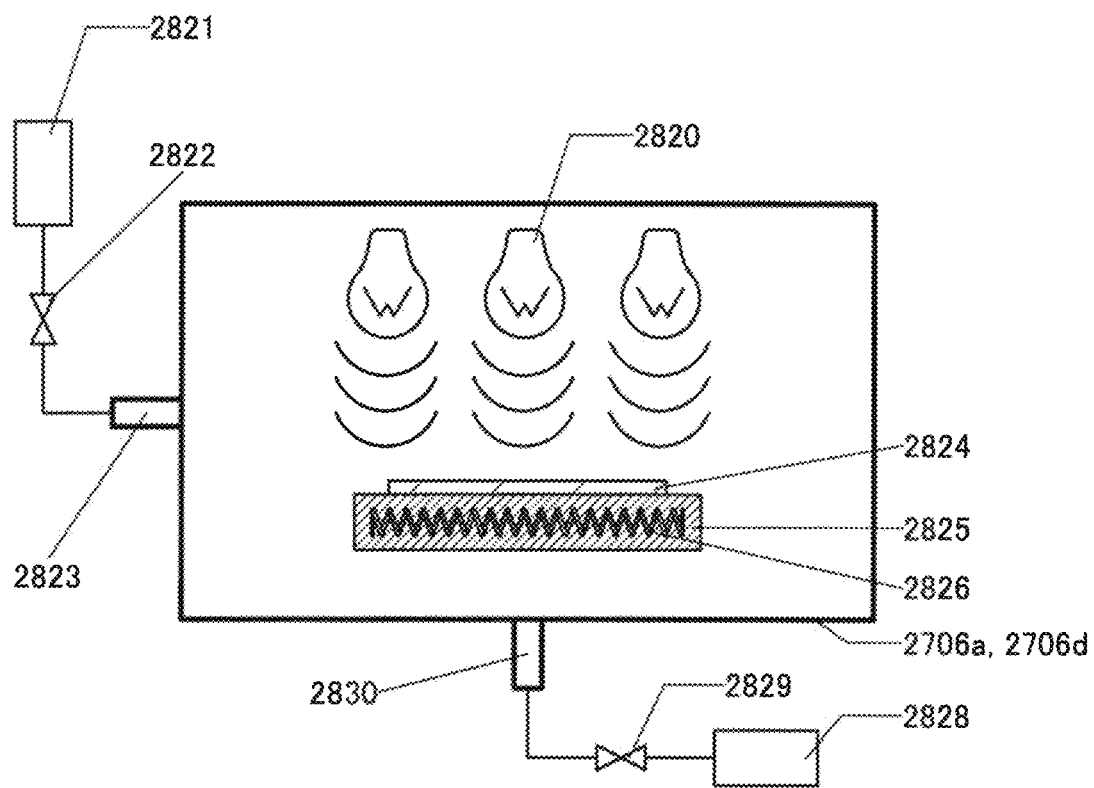
FIG. 32 is a cross-sectional view illustrating a chamber of one embodiment of the present invention.

First, a structure of a manufacturing apparatus which hardly allows entry of impurities in manufacturing a semiconductor device or the like is described with reference to FIG. 30, FIG. 31, and FIG. 32.

Figure 30:
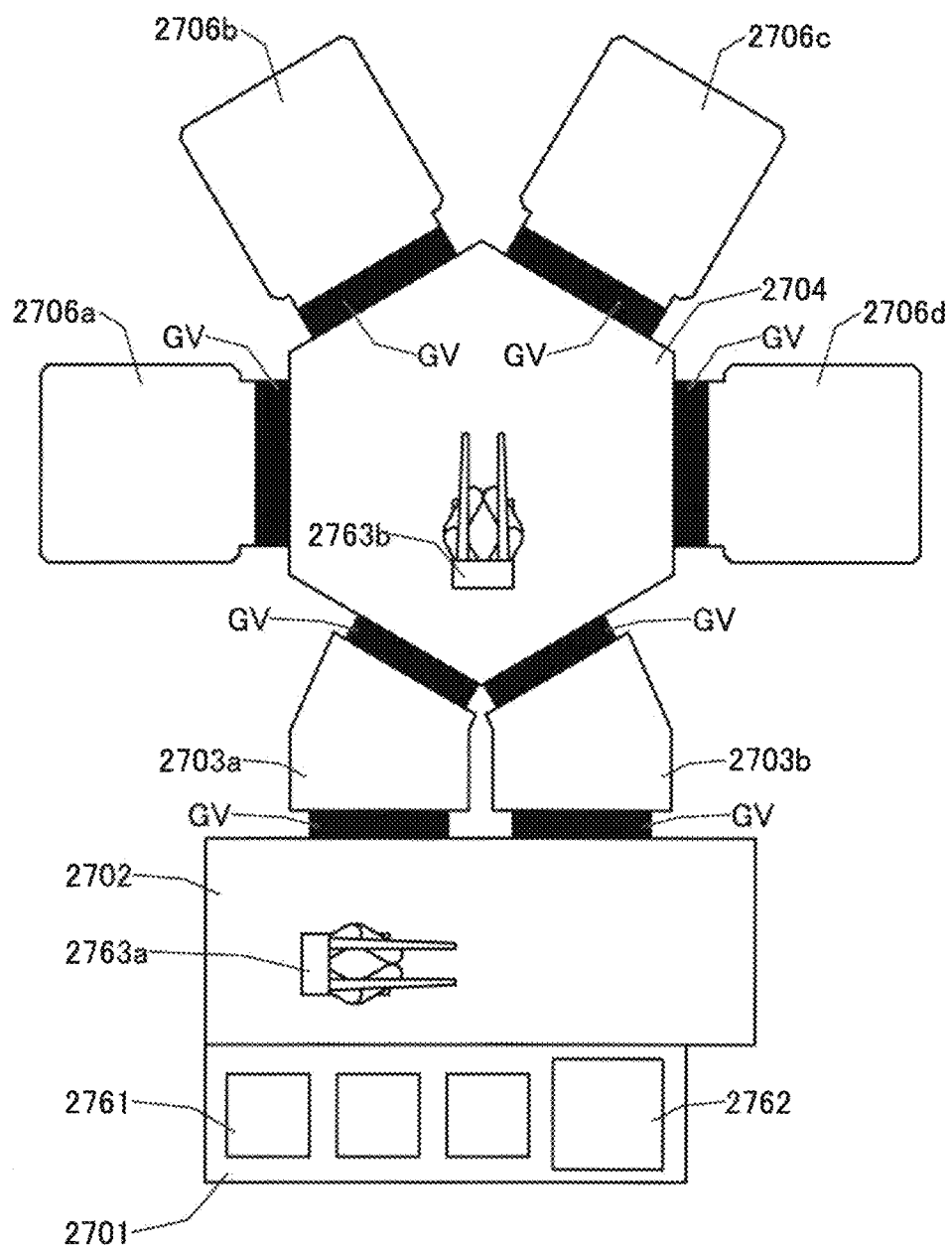
FIG. 30 is a top view illustrating a deposition apparatus of one embodiment of the present invention.

FIG. 30 is a top view schematically illustrating a single wafer multi-chamber manufacturing apparatus 2700. The manufacturing apparatus 2700 includes an atmosphere-side substrate supply chamber 2701 including a cassette port 2761 for holding a substrate and an alignment port 2762 for performing alignment of a substrate, an atmosphere-side substrate transfer chamber 2702 through which a substrate is transferred from the atmosphere-side substrate supply chamber 2701, a load lock chamber 2703a where a substrate is carried and the pressure inside the chamber is switched from atmospheric pressure to reduced pressure or from reduced pressure to atmospheric pressure, an unload lock chamber 2703b where a substrate is carried out and the pressure inside the chamber is switched from reduced pressure to atmospheric pressure or from atmospheric pressure to reduced pressure, a transfer chamber 2704 through which a substrate is transferred in a vacuum, and chambers 2706a, 2706b, 2706c, and 2706d.

The atmosphere-side substrate transfer chamber 2702 is connected to the load lock chamber 2703a and the unload lock chamber 2703b, the load lock chamber 2703a and the unload lock chamber 2703b are connected to the transfer chamber 2704, and the transfer chamber 2704 is connected to the chambers 2706a, 2706b, 2706c, and 2706d.

Note that gate valves GV are provided in connecting portions between the chambers so that each chamber excluding the atmosphere-side substrate supply chamber 2701 and the atmosphere-side substrate transfer chamber 2702 can be independently kept in a vacuum state. In addition, the atmosphere-side substrate transfer chamber 2702 is provided with a transfer robot 2763a, and the transfer chamber 2704 is provided with a transfer robot 2763b. With the transfer robot 2763a and the transfer robot 2763b, a substrate can be transferred inside the manufacturing apparatus 2700.

In the transfer chamber 2704 and each of the chambers, the back pressure (total pressure) is, for example, lower than or equal to $1 \times 10^{-4}$ Pa, preferably lower than or equal to $3 \times 10^{-5}$ Pa, further preferably lower than or equal to $1 \times 10^{-5}$ Pa. In the transfer chamber 2704 and each of the chambers, the partial pressure of a gas molecule (atom) having a mass-to-charge ratio (m/z) of 18 is, for example, lower than or equal to $3 \times 10^{-5}$ Pa, preferably lower than or equal to $1 \times 10^{-5}$ Pa, further preferably lower than or equal to $3 \times 10^{-6}$ Pa. Moreover, in the transfer chamber 2704 and each of the chambers, the partial pressure of a gas molecule (atom) having a mass-to-charge ratio (m/z) of 28 is, for example, lower than or equal to $3 \times 10^{-5}$ Pa, preferably lower than or equal to $1 \times 10^{-5}$ Pa, further preferably lower than or equal to $3 \times 10^{-6}$ Pa. Further, in the transfer chamber 2704 and each of the chambers, the partial pressure of a gas molecule (atom) having a mass-to-charge ratio (m/z) of 44 is, for example, lower than or equal to $3 \times 10^{-5}$ Pa, preferably lower than or equal to $1 \times 10^{-5}$ Pa, further preferably lower than or equal to $3 \times 10^{-6}$ Pa.

Note that the total pressure and the partial pressure in the transfer chamber 2704 and each of the chambers can be measured using a mass analyzer. For example, Qulee CGM-051, a quadrupole mass analyzer (also referred to as Q-mass) manufactured by ULVAC, Inc. can be used.

Moreover, the transfer chamber 2704 and each of the chambers preferably have a small amount of external leakage or internal leakage. For example, in the transfer chamber 2704 and each of the chambers, the leakage rate is less than or equal to $3 \times 10^{-6}$ Pa·m$^3$/s, preferably less than or equal to $1 \times 10^{-6}$ Pa·m$^3$/s. For example, the leakage rate of a gas molecule (atom) having a mass-to-charge ratio (m/z) of 18 is less than or equal to $1 \times 10^{-7}$ Pa·m$^3$/s, preferably less than or equal to $3 \times 10^{-8}$ Pa·m$^3$/s. For example, the leakage rate of a gas molecule (atom) having a mass-to-charge ratio (m/z) of 28 is less than or equal to $1 \times 10^{-5}$ Pa·m$^3$/s, preferably less than or equal to $1 \times 10^{-6}$ Pa·m$^3$/s. For example, the leakage rate of a gas molecule (atom) having a mass-to-charge ratio (m/z) of 44 is less than or equal to $3 \times 10^{-6}$ Pa·m$^3$/s, preferably less than or equal to $1 \times 10^{-6}$ Pa·m$^3$/s.

Note that a leakage rate can be derived from the total pressure and partial pressure measured using the mass analyzer. The leakage rate depends on external leakage and internal leakage. The external leakage refers to inflow of gas from the outside of a vacuum system through a minute hole, a sealing defect, or the like. The internal leakage is due to leakage through a partition, such as a valve, in a vacuum system or due to released gas from an internal member. Measures need to be taken from both aspects of external leakage and internal leakage in order that the leakage rate can be set to be less than or equal to the above-mentioned value.

For example, open/close portions of the transfer chamber 2704 and the chambers can be sealed with a metal gasket. For the metal gasket, metal covered with iron fluoride, aluminum oxide, or chromium oxide is preferably used. The metal gasket realizes higher adhesion than an O-ring, and can reduce the external leakage. Furthermore, with the use of the metal covered with iron fluoride, aluminum oxide, chromium oxide, or the like, which is in the passive state, the release of gas containing impurities released from the metal gasket is suppressed, so that the internal leakage can be reduced.

For a member of the manufacturing apparatus 2700, aluminum, chromium, titanium, zirconium, nickel, or vanadium, which releases a small amount of gas containing impurities, is used. Alternatively, an alloy containing iron, chromium, nickel, or the like covered with the above material may be used. The alloy containing iron, chromium, nickel, or the like is rigid, resistant to heat, and suitable for processing. Here, when surface unevenness of the member is decreased by polishing or the like to reduce the surface area, the release of gas can be reduced.

Alternatively, the above member of the manufacturing apparatus 2700 may be covered with iron fluoride, aluminum oxide, chromium oxide, or the like.

The member of the manufacturing apparatus 2700 is preferably formed using only metal when possible. For example, in the case where a viewing window formed of quartz or the like is provided, it is preferable that the surface of the viewing window be thinly covered with iron fluoride, aluminum oxide, chromium oxide, or the like so as to suppress release of gas.

When an adsorbed substance is present in the transfer chamber 2704 and each of the chambers, although the adsorbed substance does not affect the pressure in the transfer chamber 2704 and each of the chambers because it is adsorbed onto an inner wall or the like, the adsorbed substance causes a release of gas when the inside of the transfer chamber 2704 and each of the chambers is evacuated. Therefore, although there is no correlation between the leakage rate and the exhaust rate, it is important that the adsorbed substance present in the transfer chamber 2704 and each of the chambers be desorbed as much as possible and exhaust be performed in advance with the use of a pump with high exhaust capability. Note that the transfer chamber 2704 and each of the chambers may be subjected to baking to promote desorption of the adsorbed substance. By the baking, the desorption rate of the adsorbed substance can be increased about tenfold. The baking can be performed at a temperature of higher than or equal to 100° C. and lower than or equal to 450° C. At this time, when the adsorbed substance is removed while an inert gas is introduced into the transfer chamber 2704 and each of the chambers, the desorption rate of water or the like, which is difficult to desorb simply by exhaust, can be further increased. Note that when the inert gas that is introduced is heated to substantially the same temperature as the baking temperature, the desorption rate of the adsorbed substance can be further increased. Here, a rare gas is preferably used as the inert gas.

Alternatively, treatment for evacuating the inside of the transfer chamber 2704 and each of the chambers is preferably performed a certain period of time after heated oxygen, a heated inert gas such as a heated rare gas, or the like is introduced to increase the pressure in the transfer chamber 2704 and each of the chambers. The introduction of the heated gas can desorb the adsorbed substance in the transfer chamber 2704 and each of the chambers, and the impurities present in the transfer chamber 2704 and each of the chambers can be reduced. Note that an advantageous effect can be achieved when this treatment is repeated more than or equal to 2 times and less than or equal to 30 times, preferably more than or equal to 5 times and less than or equal to 15 times. Specifically, an inert gas, oxygen, or the like with a temperature higher than or equal to 40° C. and lower than or equal to 400° C., preferably higher than or equal to 50° C. and lower than or equal to 200° C. is introduced to the transfer chamber 2704 and each of the chambers, so that the pressure therein can be kept to be higher than or equal to 0.1 Pa and lower than or equal to 10 kPa, preferably higher than or equal to 1 Pa and lower than or equal to 1 kPa, further preferably higher than or equal to 5 Pa and lower than or equal to 100 Pa in the time range of 1 minute to 300 minutes, preferably 5 minutes to 120 minutes. After that, the inside of the transfer chamber 2704 and each of the chambers is evacuated in the time range of 5 minutes to 300 minutes, preferably 10 minutes to 120 minutes.

Next, the chambers are described with reference to a schematic cross-sectional view of FIG. 31.

The chambers 2706b and 2706c are chambers capable of performing high-density plasma treatment on an object, for example. Because the chambers 2706b and 2706c have a common structure with the exception of the atmosphere used in the high-density plasma treatment, they are collectively described below.

The chambers 2706b and 2706c each include a slot antenna plate 2808, a dielectric plate 2809, a substrate holder 2812, and an exhaust port 2819. A gas supply source 2801, a valve 2802, a high-frequency generator 2803, a waveguide 2804, a mode converter 2805, a gas pipe 2806, a waveguide 2807, a matching box 2815, a high-frequency power source 2816, a vacuum pump 2817, and a valve 2818 are provided outside the chambers 2706b and 2706c.

The high-frequency generator 2803 is connected to the mode converter 2805 through the waveguide 2804. The mode converter 2805 is connected to the slot antenna plate 2808 through the waveguide 2807. The slot antenna plate 2808 is positioned in contact with the dielectric plate 2809. Further, the gas supply source 2801 is connected to the mode converter 2805 through the valve 2802. Gas is transferred to the chambers 2706b and 2706c through the gas pipe 2806 which runs through the mode converter 2805, the waveguide 2807, and the dielectric plate 2809. The vacuum pump 2817 has a function of exhausting gas or the like from the chambers 2706b and 2706c through the valve 2818 and the exhaust port 2819. The high-frequency power source 2816 is connected to the substrate holder 2812 through the matching box 2815.

The substrate holder 2812 has a function of holding a substrate 2811. For example, the substrate holder 2812 has a function of an electrostatic chuck or a mechanical chuck for holding the substrate 2811. In addition, the substrate holder 2812 has a function of an electrode to which electric power is supplied from the high-frequency power source 2816. The substrate holder 2812 includes a heating mechanism 2813 therein and thus has a function of heating the substrate 2811.

As the vacuum pump 2817, a dry pump, a mechanical booster pump, an ion pump, a titanium sublimation pump, a cryopump, a turbomolecular pump, or the like can be used, for example. In addition to the vacuum pump 2817, a cryotrap may be used as well. The combinational use of the cryopump and the cryotrap allows water to be efficiently exhausted and is particularly preferable.

For example, the heating mechanism 2813 may be a heating mechanism which uses a resistance heater or the like for heating. Alternatively, a heating mechanism which utilizes heat conduction or heat radiation from a medium such as a heated gas for heating may be used. For example, rapid thermal annealing (RTA) such as gas rapid thermal annealing (GRTA) or lamp rapid thermal annealing (LRTA) can be used. In GRTA, heat treatment is performed using a high-temperature gas. An inert gas is used as the gas.

The gas supply source 2801 may be connected to a purifier through a mass flow controller. As the gas, a gas whose dew point is −80° C. or lower, preferably −100° C. or lower is preferably used. For example, an oxygen gas, a nitrogen gas, or a rare gas (e.g., an argon gas) may be used.

As the dielectric plate 2809, silicon oxide (quartz), aluminum oxide (alumina), yttrium oxide (yttria), or the like may be used, for example. A protective layer may be further formed on a surface of the dielectric plate 2809. As the protective layer, magnesium oxide, titanium oxide, chromium oxide, zirconium oxide, hafnium oxide, tantalum oxide, silicon oxide, aluminum oxide, yttrium oxide, or the like may be used. The dielectric plate 2809 is exposed to an especially high density region of high-density plasma 2810 that is to be described later. Therefore, the protective layer can reduce the damage and consequently prevent an increase of particles or the like during the treatment.

The high-frequency generator 2803 has a function of generating a microwave with a frequency of, for example, more than or equal to 0.3 GHz and less than or equal to 3.0 GHz, more than or equal to 0.7 GHz and less than or equal to 1.1 GHz, or more than or equal to 2.2 GHz and less than or equal to 2.8 GHz. The microwave generated by the high-frequency generator 2803 is propagated to the mode converter 2805 through the waveguide 2804. The mode converter 2805 converts the microwave propagated in the TE mode into a microwave in the TEM mode. Then, the microwave is propagated to the slot antenna plate 2808 through the waveguide 2807. The slot antenna plate 2808 is provided with a plurality of slot holes, and the microwave propagates through the slot holes and the dielectric plate 2809. Then, an electric field is generated below the dielectric plate 2809, and the high-density plasma 2810 can be generated. The high-density plasma 2810 includes ions and radicals depending on the gas species supplied from the gas supply source 2801. For example, oxygen radicals, nitrogen radicals, or the like are included.

At this time, the quality of a film or the like over the substrate 2811 can be modified by the ions and radicals generated in the high-density plasma 2810. Note that it is preferable in some cases to apply a bias to the substrate 2811 using the high-frequency power source 2816. As the high-frequency power source 2816, a radio frequency (RF) power source with a frequency of 13.56 MHz, 27.12 MHz, or the like may be used, for example. The application of a bias to the substrate allows ions in the high-density plasma 2810 to efficiently reach a deep portion of an opening of the film or the like over the substrate 2811.

For example, in the chamber 2706*b*, oxygen radical treatment using the high-density plasma 2810 can be performed by introducing oxygen from the gas supply source 2801. In the chamber 2706*c*, nitrogen radical treatment using the high-density plasma 2810 can be performed by introducing nitrogen from the gas supply source 2801.

Next, the chambers 2706*a* and 2706*d* are described with reference to a schematic cross-sectional view of FIG. 32.

The chambers 2706*a* and 2706*d* are chambers capable of irradiating an object with an electromagnetic wave, for example. Because the chambers 2706*a* and 2706*d* have a common structure with the exception of the kind of the electromagnetic wave, they are collectively described below.

The chambers 2706*a* and 2706*d* each include one or more lamps 2820, a substrate holder 2825, a gas inlet 2823, and an exhaust port 2830. A gas supply source 2821, a valve 2822, a vacuum pump 2827, and a valve 2829 are provided outside the chambers 2706*a* and 2706*d*.

The gas supply source 2821 is connected to the gas inlet 2823 through the valve 2822. The vacuum pump 2828 is connected to the exhaust port 2830 through the valve 2829. The lamp 2820 is provided to face the substrate holder 2825. The substrate holder 2825 has a function of holding a substrate 2824. The substrate holder 2825 includes a heating mechanism 2826 therein and thus has a function of heating the substrate 2824.

As the lamp 2820, a light source having a function of emitting an electromagnetic wave such as visible light or ultraviolet light may be used, for example. For example, a light source having a function of emitting an electromagnetic wave which has a peak in a wavelength region of longer than or equal to 10 nm and shorter than or equal to 2500 nm, longer than or equal to 500 nm and shorter than or equal to 2000 nm, or longer than or equal to 40 nm and shorter than or equal to 340 nm may be used.

As the lamp 2820, a light source such as a halogen lamp, a metal halide lamp, a xenon arc lamp, a carbon arc lamp, a high-pressure sodium lamp, or a high-pressure mercury lamp may be used, for example.

For example, part of or the whole electromagnetic wave emitted from the lamp 2820 is absorbed by the substrate 2824, so that the quality of a film or the like over the substrate 2824 can be modified. For example, defects can be generated or reduced or impurities can be removed. When the substrate 2824 absorbs the electromagnetic wave while being heated, generation or reduction of defects or removal of impurities can be efficiently performed.

Alternatively, for example, the electromagnetic wave emitted from the lamp 2820 may cause heat generation in the substrate holder 2825, by which the substrate 2824 may be heated. In this case, the heating mechanism 2826 inside the substrate holder 2825 may be omitted.

For the vacuum pump 2827, the description of the vacuum pump 2817 is referred to. For the heating mechanism 2826, the description of the heating mechanism 2813 is referred to. For the gas supply source 2821, the description of the gas supply source 2801 is referred to.

With the above-described manufacturing apparatus, the quality of a film can be modified while the entry of impurities into an object suppressed.

The structure and method described in this embodiment can be used in appropriate combination with any of the other structures and methods described in the other embodiments.

This application is based on Japanese Patent Application serial No. 2016-086372 filed with Japan Patent Office on Apr. 22, 2016, the entire contents of which are hereby incorporated by reference.

What is claimed is:

1. A semiconductor device comprising:
a first conductor;
a second conductor;
a first insulating film between the first conductor and the second conductor;
a second insulating film over the first conductor and the second conductor;
an oxide semiconductor over the second insulating film;
a third insulating film over the oxide semiconductor;
a first conductive film over the third insulating film;
a fourth insulating film over the first conductive film; and
a sixth insulating film over a top and a side of the first conductive film,
wherein a first thickness of the sixth insulating film over the top of the first conductive film is larger than a second thickness of the sixth insulating film over the side of the first conductive film.

2. The semiconductor device according to claim 1, wherein a top surface of the first conductor and a top surface of the first insulating film are on a same plane.

3. The semiconductor device according to claim 1, wherein the second insulating film comprises openings, and wherein the openings overlap with the first conductor and the second conductor.

4. The semiconductor device according to claim 1, wherein the fourth insulating film is in contact with the second insulating film.

5. The semiconductor device according to claim 1, wherein the fourth insulating film comprises aluminum oxide.

6. The semiconductor device according to claim 1, further comprising,
a fifth insulating film,
wherein the first conductor and the first conductive film are between the fourth insulating film and the fifth insulating film.

7. The semiconductor device according to claim 6, wherein the fifth insulating film comprises aluminum oxide.

8. A semiconductor device comprising:
a first conductor;
a second conductor;
a first insulating film over the first conductor and the second conductor;
an oxide semiconductor over the first insulating film;
a second insulating film over the oxide semiconductor;
a first conductive film over the second insulating film;
an oxide layer over the first conductive film;
a third insulating film over the oxide layer; and
a fifth insulating film over a top and a side of the first conductive film,
wherein a first thickness of the fifth insulating film over the top of the first conductive film is larger than a second thickness of the fifth insulating film over the side of the first conductive film.

9. The semiconductor device according to claim 8, wherein the second insulating film is in contact with the third insulating film.

10. The semiconductor device according to claim 8, wherein the first insulating film comprises openings, and wherein the openings overlap with the first conductor and the second conductor.

11. The semiconductor device according to claim 8, wherein the third insulating film is in contact with the first insulating film.

12. The semiconductor device according to claim 8, wherein the third insulating film comprises aluminum oxide.

13. The semiconductor device according to claim 8, further comprising,
a fourth insulating film,
wherein the first conductor and the first conductive film are between the third insulating film and the fourth insulating film.

14. A semiconductor device comprising:
a first conductor;
a second conductor;
a first insulating film between the first conductor and the second conductor;
an oxide semiconductor over the first insulating film;
a second insulating film over the oxide semiconductor;
a first conductive film over the second insulating film;
an oxide layer over the first conductive film, the oxide layer being in contact with the oxide semiconductor;
a third insulating film over the oxide layer; and
a fifth insulating film over a top and a side of the first conductive film,
wherein a first thickness of the fifth insulating film over the top of the first conductive film is larger than a second thickness of the fifth insulating film over the side of the first conductive film.

15. The semiconductor device according to claim 14, wherein a top surface of the first conductor and a top surface of the first insulating film are on a same plane.

16. The semiconductor device according to claim 14, wherein the third insulating film is in contact with the second insulating film.

17. The semiconductor device according to claim 14, wherein the third insulating film comprises aluminum oxide.

18. The semiconductor device according to claim 14, further comprising,
a fourth insulating film,
wherein the first conductor and the first conductive film are between the third insulating film and the fourth insulating film.

* * * * *